(12) United States Patent
Chung et al.

(10) Patent No.: US 12,154,960 B2
(45) Date of Patent: Nov. 26, 2024

(54) SEMICONDUCTOR DEVICE AND MANUFACTURING METHOD THEREOF

(71) Applicant: Taiwan Semiconductor Manufacturing Company, Ltd., Hsin-Chu (TW)

(72) Inventors: Cheng-Ting Chung, Hsinchu (TW); Hou-Yu Chen, Zhubei (TW); Ching-Wei Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 188 days.

(21) Appl. No.: 17/873,203

(22) Filed: Jul. 26, 2022

(65) Prior Publication Data

US 2022/0359700 A1    Nov. 10, 2022

Related U.S. Application Data

(62) Division of application No. 16/996,094, filed on Aug. 18, 2020, now Pat. No. 11,532,720.

(60) Provisional application No. 63/017,077, filed on Apr. 29, 2020.

(51) Int. Cl.
| | |
|---|---|
| *H01L 29/66* | (2006.01) |
| *H01L 21/8234* | (2006.01) |
| *H01L 27/088* | (2006.01) |
| *H01L 29/417* | (2006.01) |
| *H01L 29/423* | (2006.01) |

(52) U.S. Cl.
CPC ........... *H01L 29/42392* (2013.01); *H01L 21/823418* (2013.01); *H01L 21/823431* (2013.01); *H01L 21/823481* (2013.01); *H01L 27/0886* (2013.01); *H01L 29/41791* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2006/0022264 A1 | 2/2006 | Mathew et al. | |
| 2013/0299897 A1 | 11/2013 | Doris et al. | |
| 2017/0222006 A1* | 8/2017 | Suh | H01L 29/42376 |
| 2017/0271475 A1* | 9/2017 | Chang | H01L 21/0223 |
| 2018/0138291 A1 | 5/2018 | Smith et al. | |

(Continued)

OTHER PUBLICATIONS

Notice of Allowance dated Aug. 30, 2022 for U.S. Appl. No. 16/996,094.

(Continued)

*Primary Examiner* — Joseph C. Nicely
*Assistant Examiner* — Lamont B Koo
(74) *Attorney, Agent, or Firm* — Eschweiler & Potashnik, LLC

(57) ABSTRACT

A semiconductor device includes a semiconductor layer, a gate structure, a source/drain epitaxial structure, a backside dielectric cap, and an inner spacer. The gate structure wraps around the semiconductor layer. The source/drain epitaxial structure is adjacent the gate structure and electrically connected to the semiconductor layer. The backside dielectric cap is disposed under and in direct contact with the gate structure. The inner spacer is in direct contact with the gate structure and the backside dielectric cap.

20 Claims, 52 Drawing Sheets

(56) References Cited

U.S. PATENT DOCUMENTS

| | | |
|---|---|---|
| 2018/0219064 A1 | 8/2018 | Cheng et al. |
| 2019/0027570 A1* | 1/2019 | Ching et al. |
| 2019/0067417 A1* | 2/2019 | Ching ............. H01L 21/823878 |
| 2019/0157310 A1 | 5/2019 | Glass et al. |
| 2019/0214502 A1 | 7/2019 | Xu et al. |
| 2020/0044087 A1* | 2/2020 | Guha ................ H01L 29/66439 |
| 2020/0058772 A1 | 2/2020 | Yeh |
| 2020/0105871 A1 | 4/2020 | Glass et al. |

OTHER PUBLICATIONS

U.S. Appl. No. 16/915,930, filed Jun. 29, 2020.
Non-Final Office Action dated Feb. 7, 2022 for U.S. Appl. No. 16/996,094.

* cited by examiner

SEMICONDUCTOR DEVICE AND MANUFACTURING METHOD THEREOF

REFERENCE TO RELATED APPLICATIONS

This application is a Divisional of U.S. application Ser. No. 16/996,094, filed on Aug. 18, 2020, which claims the benefit of U.S. Provisional Application No. 63/017,077, filed on Apr. 29, 2020. The contents of the above-referenced patent applications are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
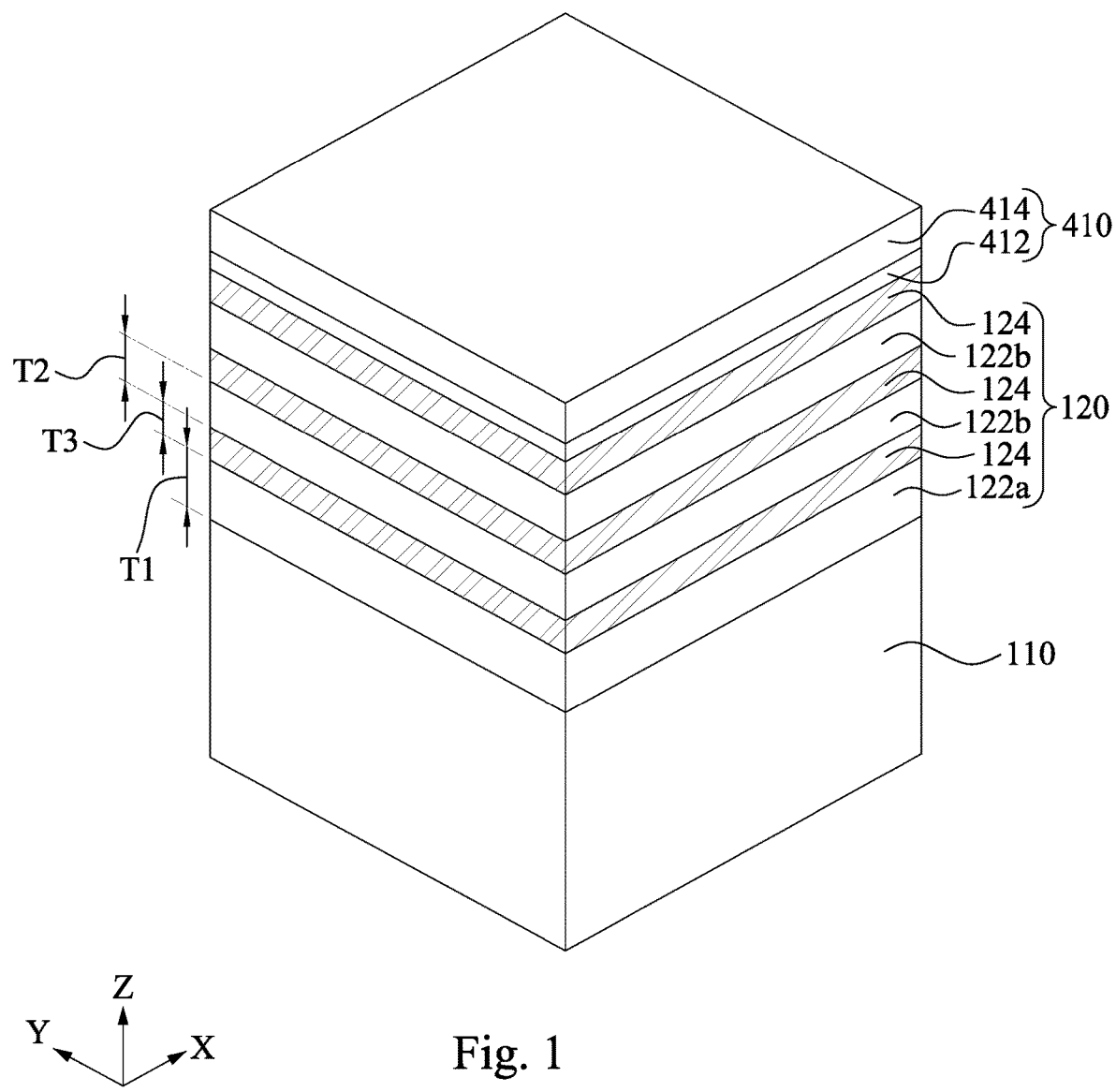
FIGS. 1-18C illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to GAA devices including a cap layer under a gate structure for preventing the current leakage problems between the gate structure and a via under a source/drain feature. The GAA devices presented herein include a p-type GAA device or an n-type GAA device. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1-18C illustrate a method for manufacturing a semiconductor device at various stages in accordance with some embodiments of the present disclosure. In addition to the semiconductor device, FIGS. 1-18C depict X-axis, Y-axis, and Z-axis directions. In some embodiments, the semiconductor device shown in FIGS. 1-18C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A stacked structure 120 is formed on the substrate 110 through epitaxy, such that the stacked structure 120 forms crystalline layers. The stacked structure 120 includes first semiconductor layers 122a, 122b and second semiconductor layers 124 stacked alternately. The first semiconductor layers 122a, 122b and the second semiconductor layers 124 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 122a, 122b and the second semiconductor layers 124 are made of Si, a Si compound, SiGe, Ge or a Ge compound. In FIG. 1, three layers of the first semiconductor layer 122a, 122b and three layers of the second semiconductor layer 124 are disposed. However, the number of the layers are not limited to three, and may be as small as 1 (each layer). In some embodiments, 2-10 layers of each of the first and second semiconductor layers are formed. By adjusting the numbers of the stacked layers, a driving current of the GAA FET device can be adjusted.

In some embodiments, the first semiconductor layers 122a, 122b can be SiGe layers having a germanium atomic percentage greater than zero. In some embodiments, the germanium percentage of the first semiconductor layers 122a, 122b is in the range between about 10 percent and about 50 percent. The bottommost first semiconductor layer 122a is thicker than the other first semiconductor layers 122b. In some embodiments, the thickness T1 of the bottommost first semiconductor layers 122a is in the range between about 8 nm and about 20 nm. In some embodiments, the thickness T2 of the first semiconductor layers 122b is in the range between about 3 nm and about 15 nm.

In some embodiments, the second semiconductor layers 124 may be pure silicon layers that are free from germanium. The second semiconductor layers 124 may also be substantially pure silicon layers, for example, with a germanium atomic percentage lower than about 1 percent. Furthermore, the second semiconductor layers 124 may be intrinsic, which are not doped with p-type and n-type impurities. In some embodiments, the thickness T3 of the second semiconductor layers 124 is in the range between about 2 nm and about 10 nm.

Subsequently, a mask layer 410 is formed above the stacked structure 120. In some embodiments, the mask layer 410 includes a first mask layer 412 and a second mask layer 414. The first mask layer 412 may be a pad oxide layer made of a silicon oxide, which can be formed by a thermal oxidation. The second mask layer 414 may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 2:
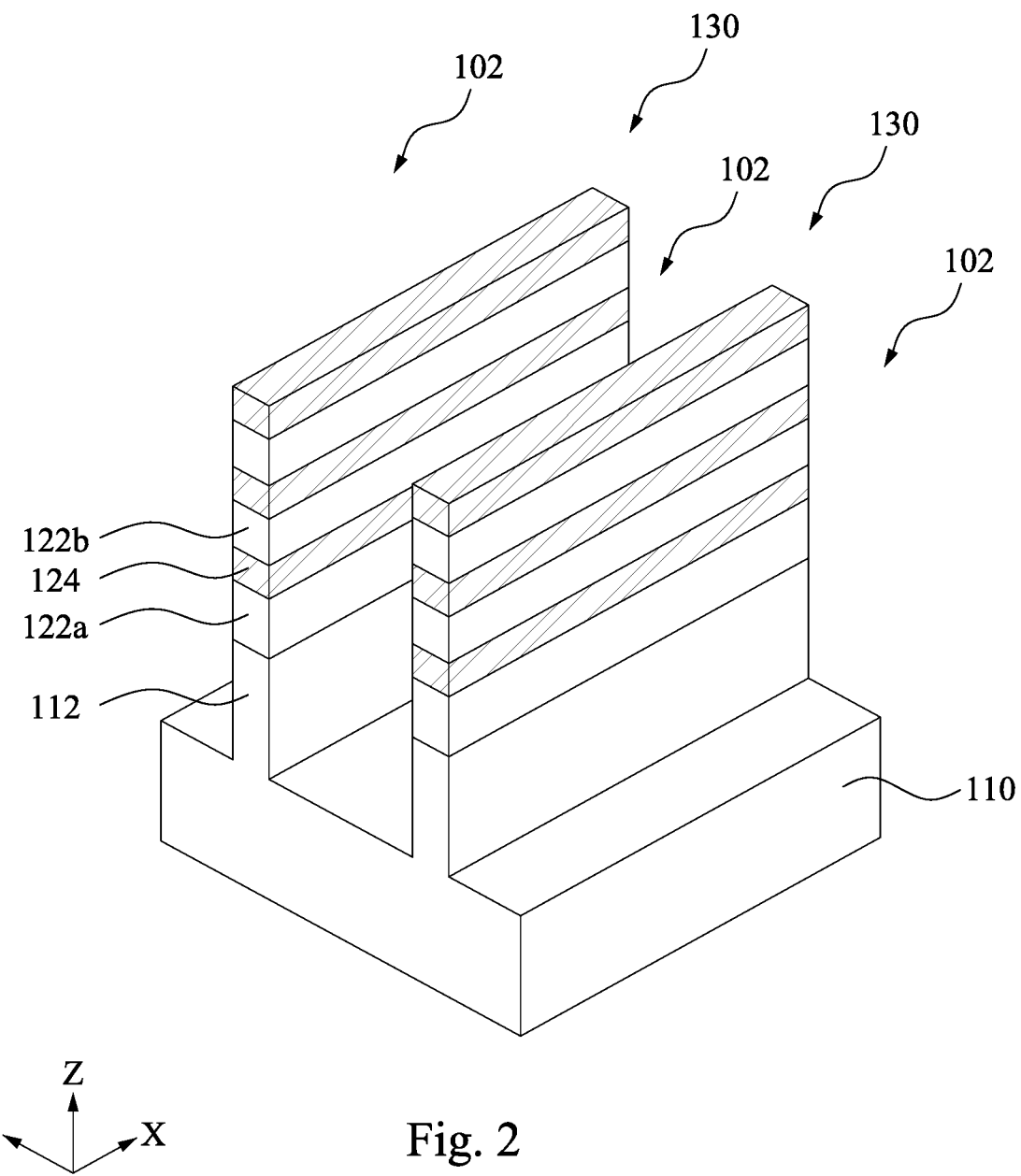

Reference is made to FIG. 2. The mask layer 410 (see FIG. 1) is patterned into a mask pattern by using patterning operations including photo-lithography and etching. After the patterning of the mask layer 410, the stacked structure 120 (see FIG. 1) is patterned by using the patterned mask layer 410 as an etch mask, such that the stacked structure 120 and the substrate 110 are patterned to form fin structures 130 and trenches 102 extending in the X direction. In FIG. 2, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

The trenches 102 extend into the substrate 110, and have lengthwise directions substantially parallel to each other. The patterning of the substrate 110 forms lower portions of the trenches 102 and base portions 112 of the fin structures 130 in the substrate 110, where the base portions 112 protrude from the substrate 110, and the fin structures 130 are respectively formed above the base portions 112 of the substrate 110. The remaining portions of the stacked structure 120 are accordingly referred to as the fin structures 130 alternatively.

Figure 3:
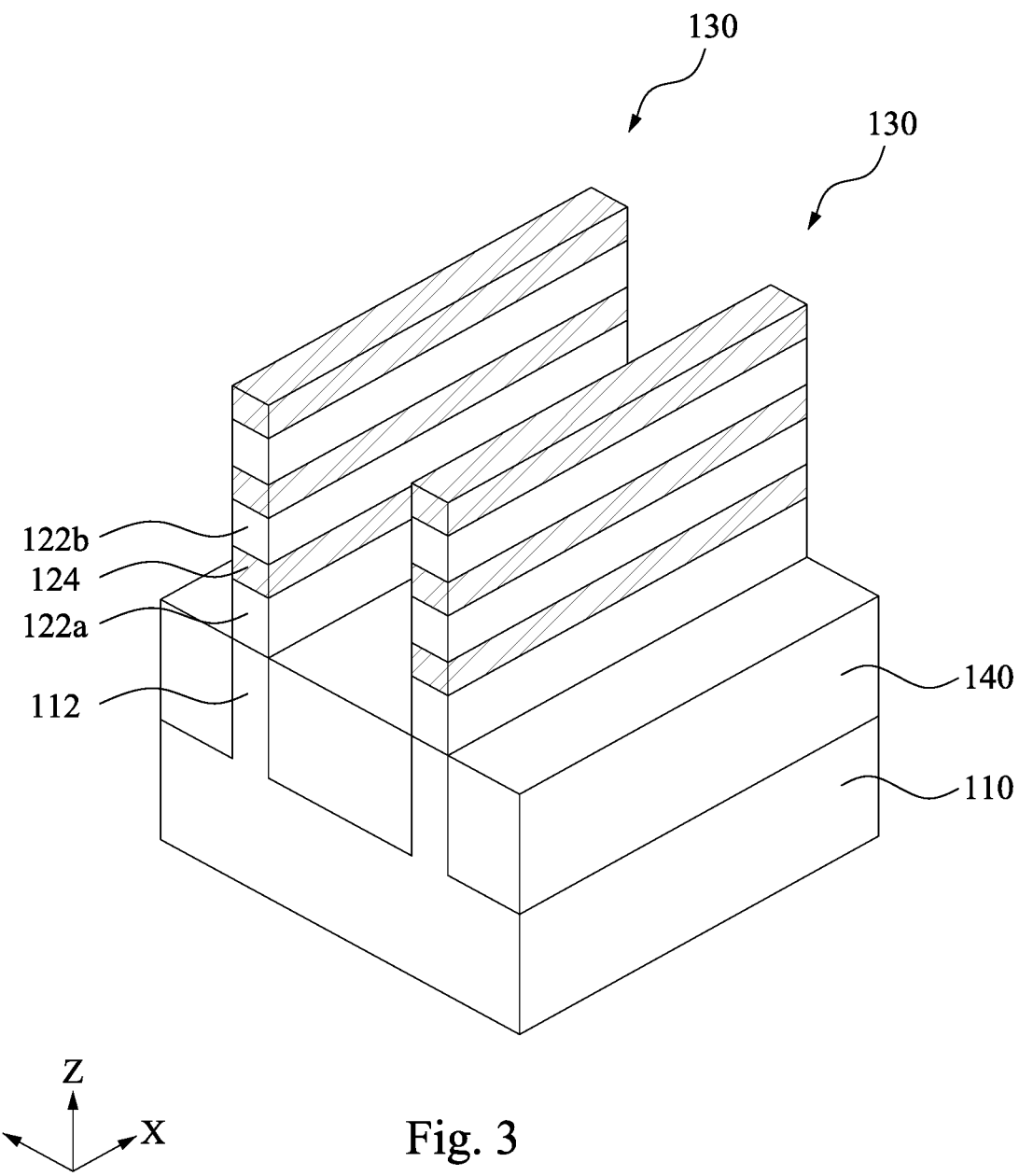

Reference is made to FIG. 3. After the fin structures 130 are formed, isolation structures 140 are formed above the structure in FIG. 2 in a lower portion of the trenches 102 (See FIG. 2). Upper portions of the fin structures 130 are exposed from the isolation structures 140. For example, an insulating material layer including one or more layers of insulating material is formed over the substrate 110 so that the fin structures 130 are fully embedded in the insulating material layer. The insulating material for the insulating material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer, especially when the insulating material layer is formed using flowable CVD. Subsequently, a planarization operation, such as a chemical mechanical polishing (CMP) method or an etch-back method, is performed such that the upper surface of the uppermost second semiconductor layer 124 is exposed from the insulating material layer. In some embodiments, a liner layer is formed over the structure of FIG. 2 before forming the insulating material layer. The first liner layer is made of SiN or a silicon nitride-based material (e.g., SiON, SiCN or SiOCN).

The insulating material layer is then recessed to form the isolation structures 140 so that the upper portions of the fin structures 130 are exposed. With this operation, the fin structures 130 are electrically insulated from each other by the isolation structures 140, which are also referred to as an STI structure. In some embodiments, the insulating material layer is recessed until the bottommost first semiconductor layer 122a is exposed. The first semiconductor layers 122a and 122b are sacrificial layers which are subsequently partially removed, and the second semiconductor layers 124 will serve as channel regions of a GAA FET.

Figure 4:
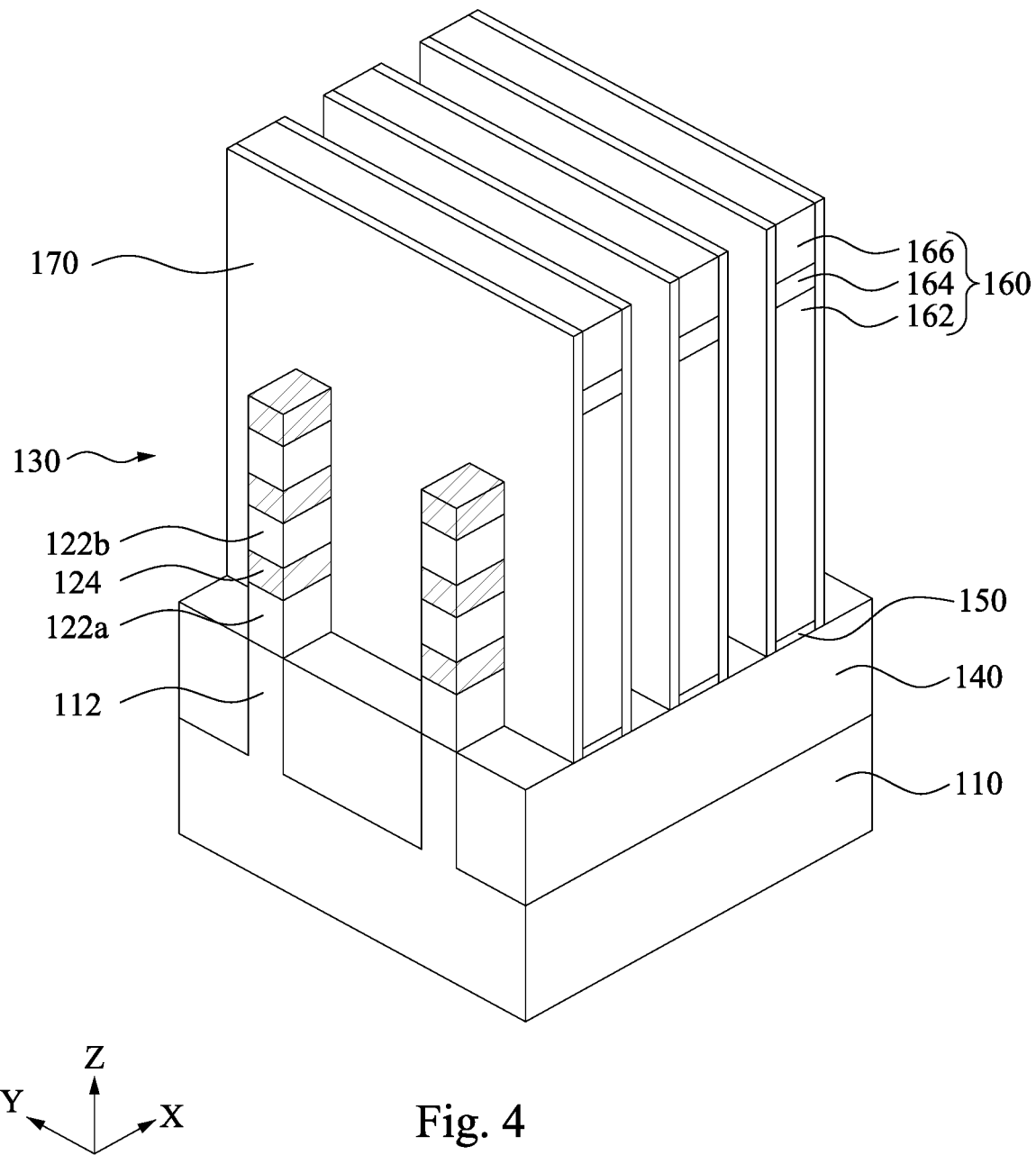

Reference is made to FIG. 4. A sacrificial gate dielectric layer 150 is conformally formed above the structure of FIG. 4. In some embodiments, the sacrificial gate dielectric layer 150 may include silicon dioxide, silicon nitride, a high-κ dielectric material or other suitable material. In various examples, the sacrificial gate dielectric layer 150 may be deposited by an ALD process, a CVD process, a subatmospheric CVD (SACVD) process, a flowable CVD process, a PVD process, or other suitable process. By way of example, the sacrificial gate dielectric layer 150 may be used to prevent damage to the fin structures 130 by subsequent processing (e.g., subsequent formation of the dummy gate structure).

At least one dummy gate structure 160 is then formed above the sacrificial gate dielectric layer 150. The dummy gate structure 160 includes a dummy gate layer 162, a pad layer 164 formed over the dummy gate layer 162, and a mask layer 166 formed over the pad layer 164. Formation of the dummy gate structure 160 includes depositing in sequence a dummy gate layer, a pad layer and a mask layer over the substrate 110, patterning the pad layer and mask layer into patterned pad layer 164 and mask layer 166 using suitable photolithography and etching techniques, followed by patterning the dummy gate layer using the pad layer 164 and the mask layer 166 as masks to form the patterned dummy gate layer 162. As such, the dummy gate layer 162, the pad layer 164, and the mask layer 166 are referred to as the dummy gate structure 160. In some embodiments, the dummy gate layer 162 may be made of polycrystalline-silicon (poly-Si), poly-crystalline silicon-germanium (poly-SiGe), or other suitable materials. The pad layer 164 may be made of silicon nitride or other suitable materials, and the mask layer 166 may be made of silicon dioxide or other suitable materials. After the patterning of the dummy gate layer 162, the sacrificial gate dielectric layer 150 is patterned as well to expose portions of the fin structures 130, thereby defining source/drain (S/D) regions. In this disclosure, a source and a drain are interchangeably used and the structures thereof are substantially the same. In FIG. 4, three dummy gate structures 160 are arranged in the X direction. But the number of the dummy gate structures is not limited to, and may be as small as one and two or more.

Subsequently, gate spacers 170 are formed on opposite sidewalls of the dummy gate structures 160. For example, a blanket layer of an insulating material for sidewall spacers is conformally formed to cover the dummy gate structures 160 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 160. In some embodiments, the insulating material of the blanket layer is a silicon nitride-based material, such as SiN, SiON, SiOCN or SiCN and combinations thereof. The blanket layer is then etched using an anisotropic process to form the gate spacers 170 on opposite sidewalls of the dummy gate structures 160.

The gate spacers 170 may include a seal spacer and a main spacer (not shown). The seal spacers may be formed on sidewalls of the dummy gate structure 160 and the main spacers are formed on the seal spacers. The anisotropic etching performed on the blanket layer can be, for example, reactive ion etching (RIE). During the anisotropic etching process, most of the insulating material is removed from horizontal surfaces, leaving the dielectric spacer layer on the vertical surfaces such as the sidewalls of the dummy gate structures 160.

Figure 5:
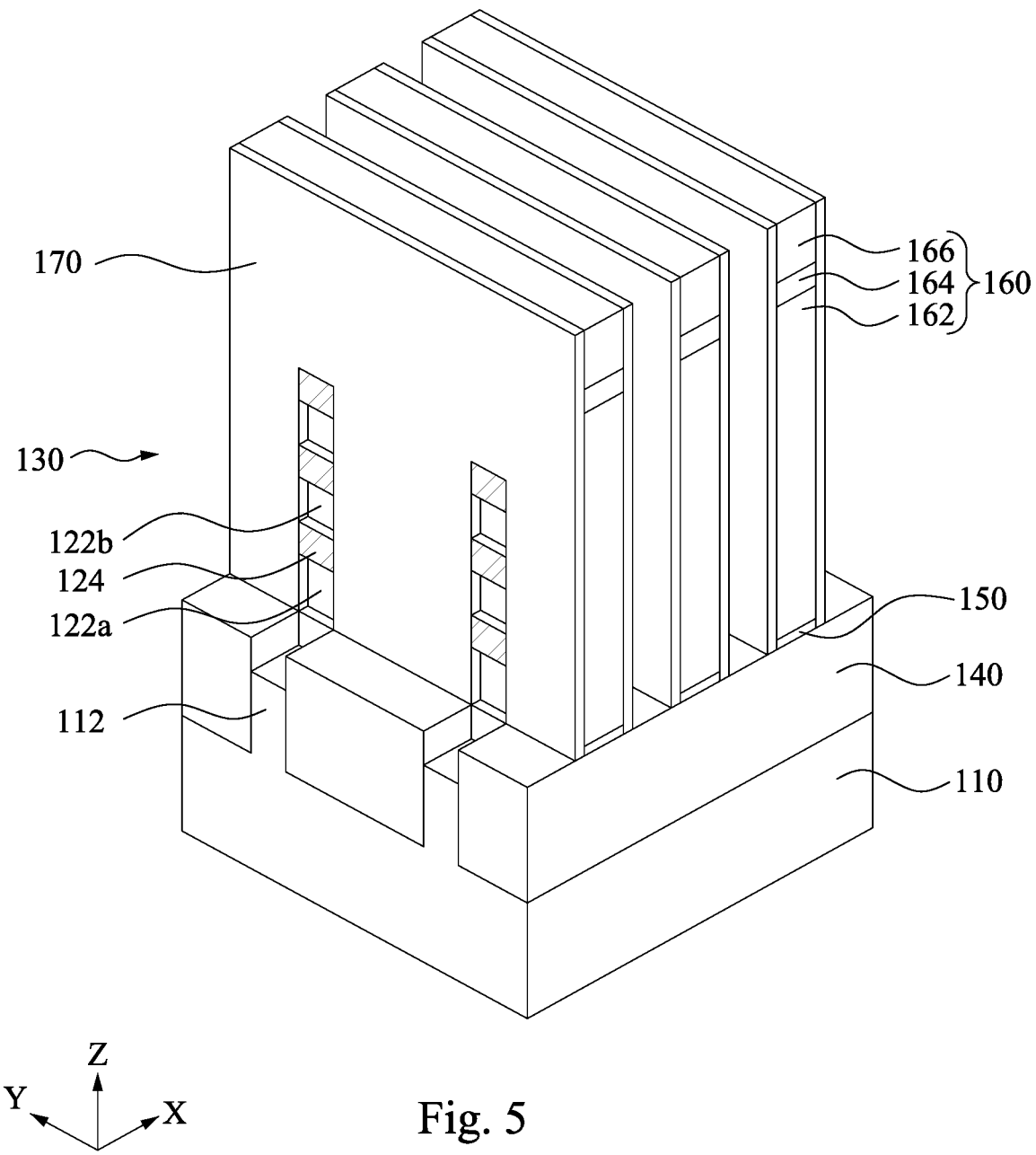

Reference is made to FIG. 5. The exposed portions of the fin structures 130 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch. In some embodiments, parts of the base portions 112 are removed as well, such that recesses are formed between the isolation structures 140.

Subsequently, the first semiconductor layers 122a and 122b are horizontally recessed (etched) so that the second semiconductor layers 124 laterally extend past opposite end surfaces of the first semiconductor layers 122a and 122b. In some embodiments, end surfaces of the first semiconductor layers 122a and 122b may be substantially vertically aligned with the sidewalls of the sacrificial gate electrode layer 150 and/or the sidewalls of the gate spacers 170.

Figure 6:
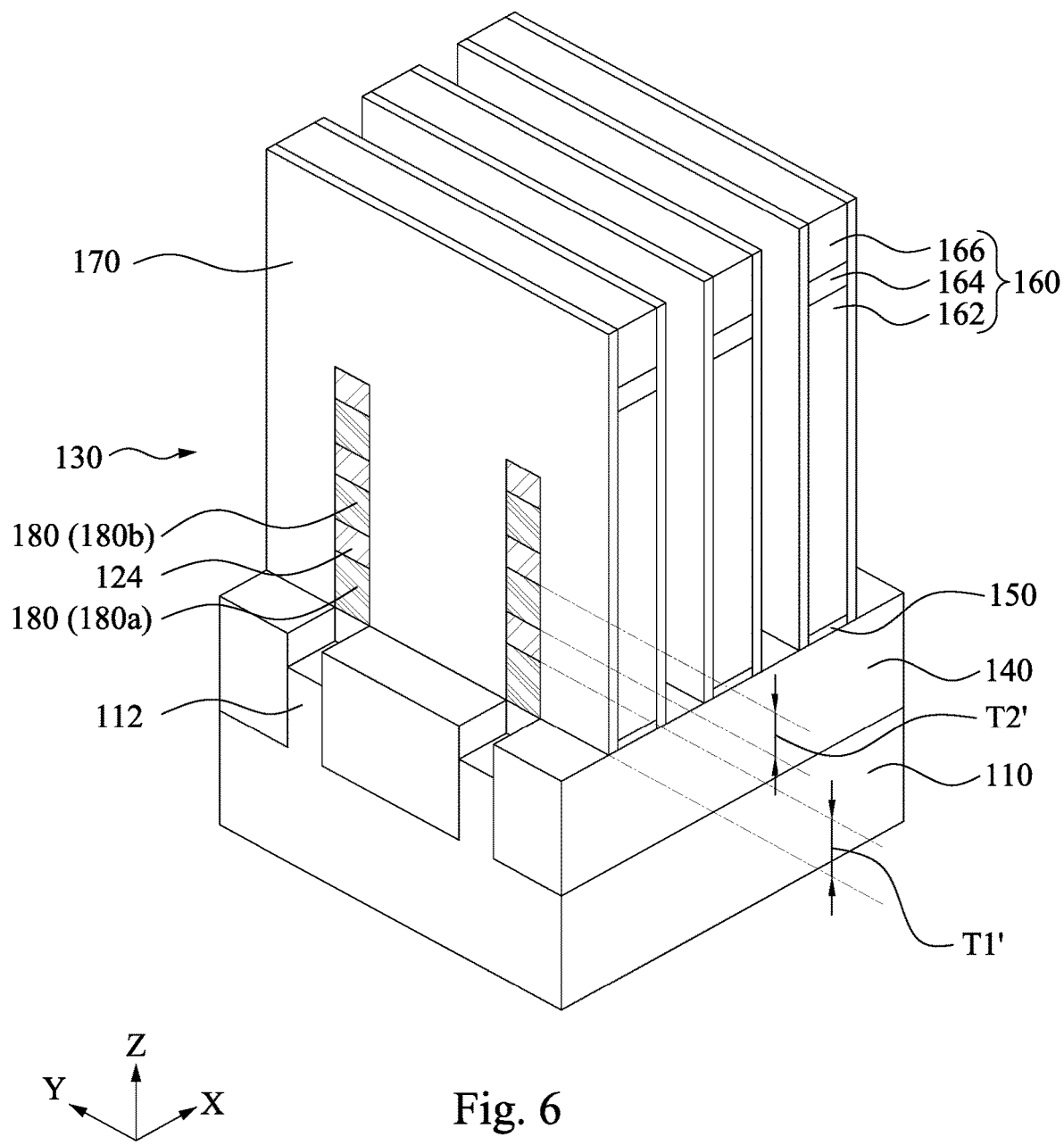

Reference is made to FIG. 6. Inner spacers 180 are respectively formed on sidewalls of the semiconductor layers 122a and 122b (see FIG. 5). For example, a dielectric material layer is formed over the structure of FIG. 5, and one or more etching operations are performed to form the inner spacers 180. In some embodiments, the inner spacers 180 includes a silicon nitride-based material, such as SiN, SiON, SiOCN or SiCN and combinations thereof and is different from the material of the gate spacers 170. In some embodiments, the inner spacers 180 are silicon nitride. The inner spacers 180 may fully fill the recesses as shown in FIG. 6. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

In FIG. 6, the inner spacers 180 substantially fill the recess as shown in FIG. 6, such that the inner spacers 180 have substantially the same thickness (in the Z direction) as the first semiconductor layers 122a and 122b. For example, the bottommost inner spacers 180a have a thickness T1' (in the Z direction) in a range of about 8 nm and about 20 nm, and the other inner spacers 180b have a thickness T2' (in the Z direction) less than the thickness T1' and in a range of about 3 nm and about 15 nm.

Figure 7:
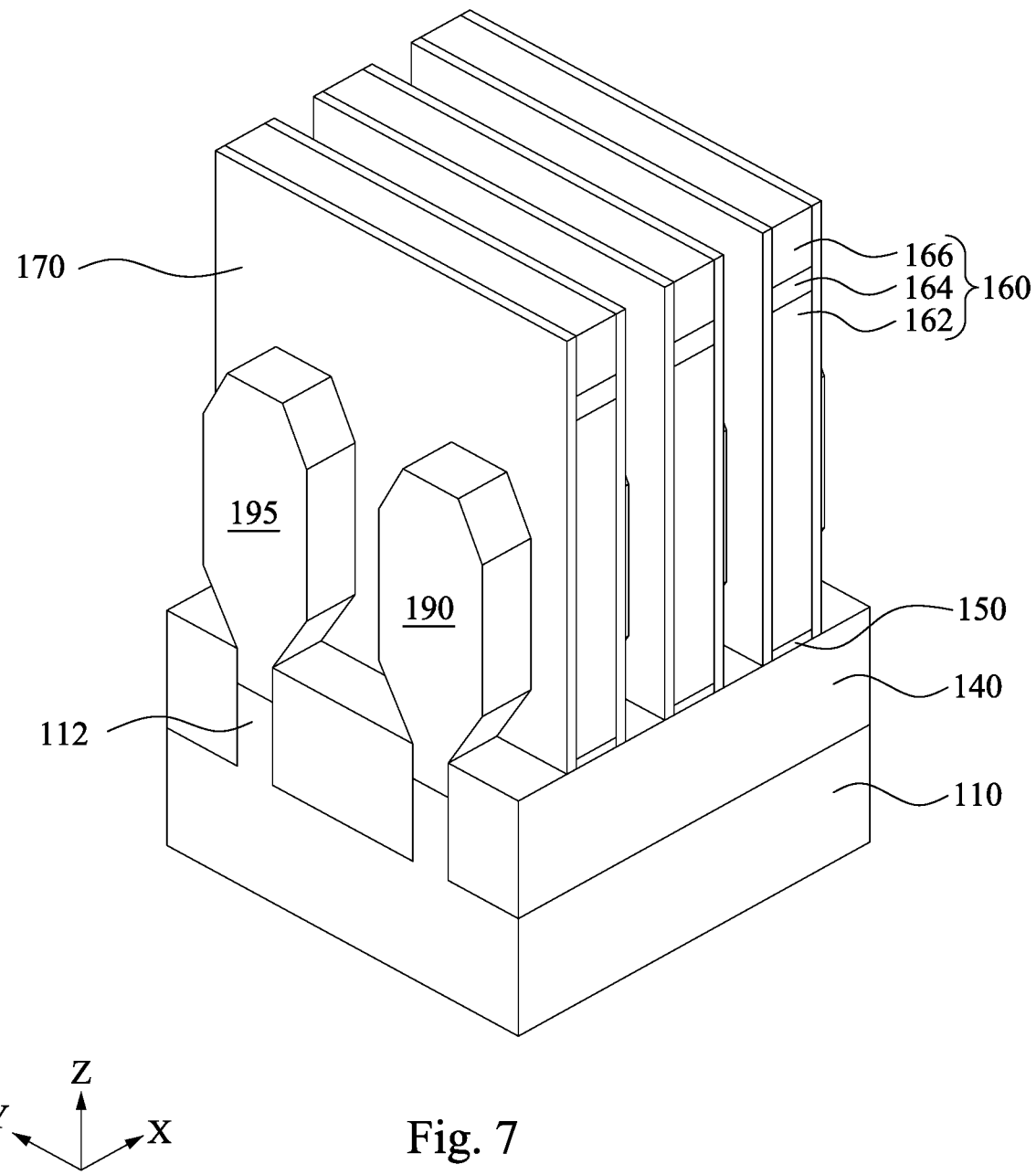

Reference is made to FIG. 7. Source/drain (S/D) epitaxial structures 190 and 195 are epitaxially grown from the base portions 112. The S/D epitaxial structures 190 and 195 includes one or more layers of Si, SiP, SiC and SiCP for an n-channel FET or Si, SiGe, Ge for a p-channel FET. The S/D epitaxial structures 190 and 195 are formed by an epitaxial growth method using CVD, ALD or molecular beam epitaxy (MBE). In some embodiments as depicted in FIG. 7, the S/D epitaxial structures 190 and 195 grown from neighboring base portions 112 of the substrate 110 do not merged. In some other embodiments, the S/D epitaxial structures 190 and 195 grown from neighboring base portions 112 merge above the isolation insulating layer 144 and form a void in some embodiments. In some embodiments, the S/D epitaxial structures 190 and 195 have different conductivity types. For example, the S/D epitaxial structures 190 is an N-type epitaxial structure, and the S/D epitaxial structures 195 is a P-type epitaxial structure, or vice versa.

Figure 8A:
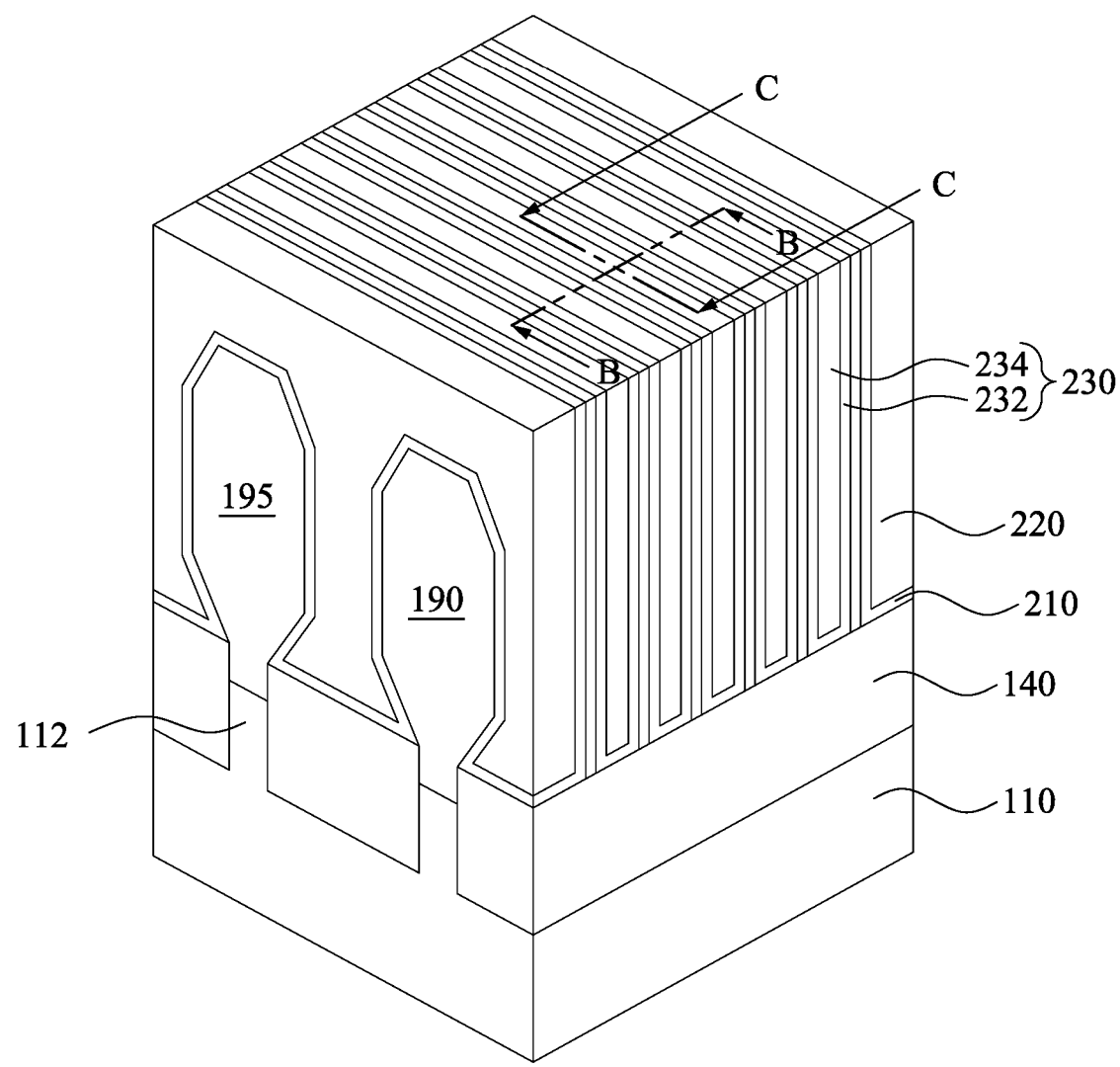
Figure 8B:
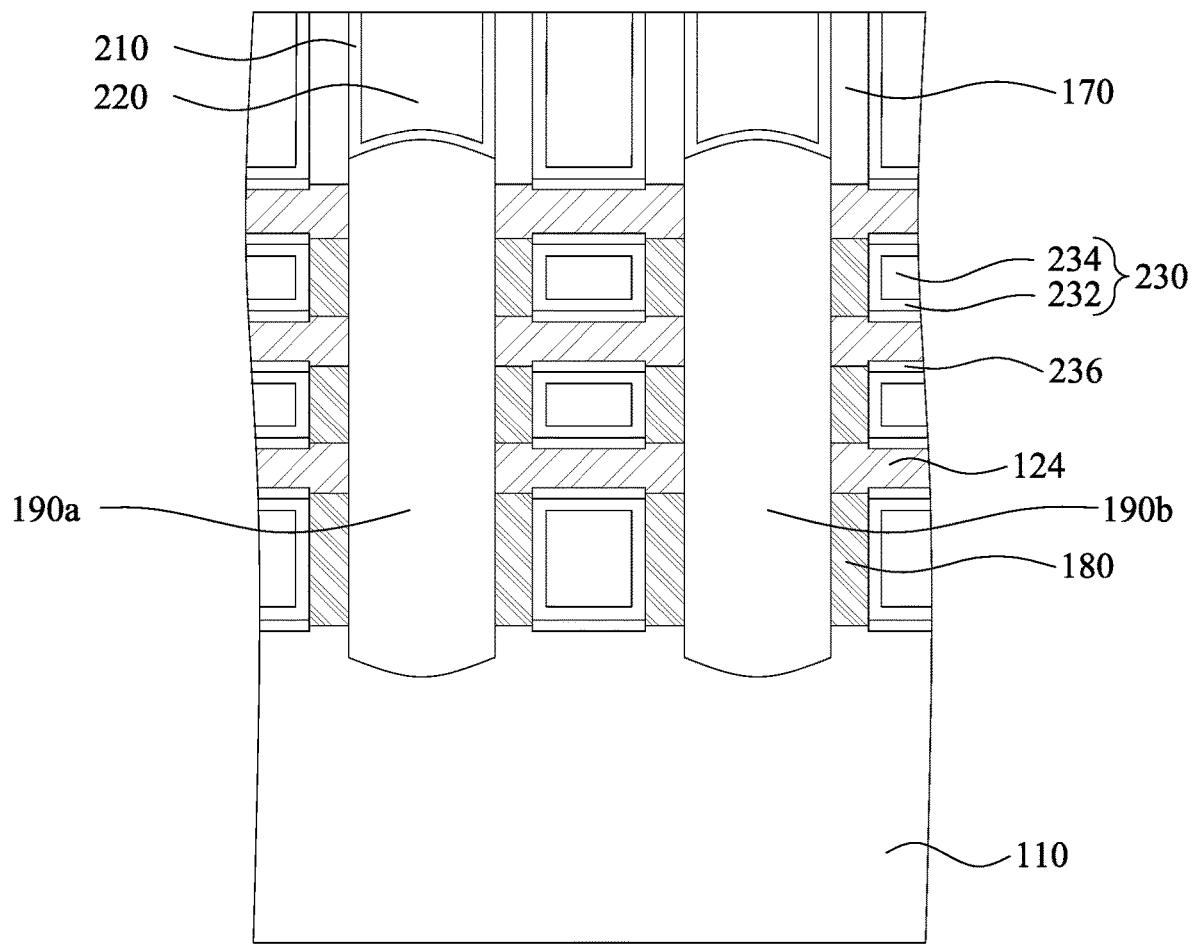
Figure 8C:
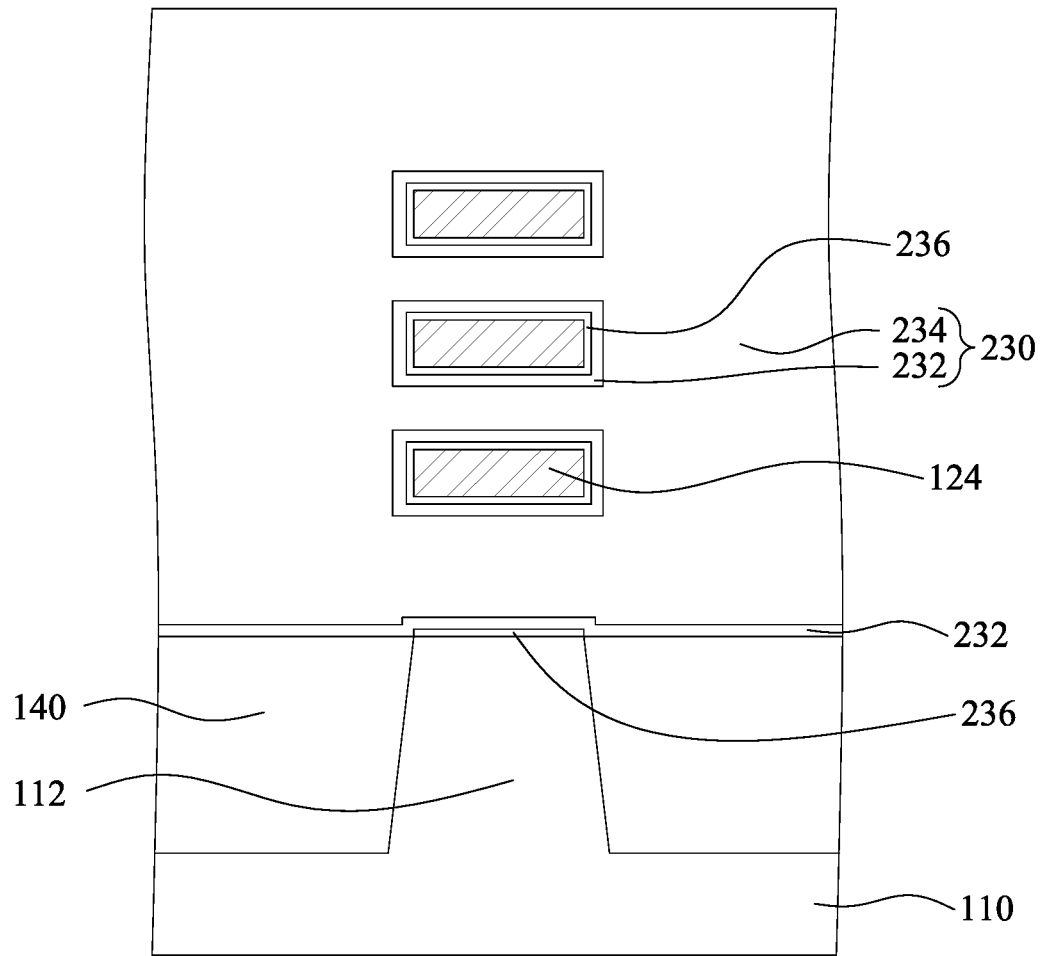

Reference is made to FIGS. 8A-8C, where FIG. 8B is a cross-sectional view taken along line B-B of FIG. 8A, and FIG. 8C is a cross-sectional view taken along line C-C of FIG. 8A. A first contact etch stop layer (CESL) 210 is conformally formed over the structure of FIG. 7. In some embodiments, the first CESL 210 can be a stressed layer or layers. In some embodiments, the first CESL 210 has a tensile stress and is formed of $Si_3N_4$. In some other embodiments, the first CESL 210 includes materials such as oxynitrides. In yet some other embodiments, the first CESL 210 may have a composite structure including a plurality of layers, such as a silicon nitride layer overlying a silicon oxide layer. The first CESL 210 can be formed using plasma enhanced CVD (PECVD), however, other suitable methods, such as low pressure CVD (LPCVD), atomic layer deposition (ALD), and the like, can also be used.

In some embodiments, adjacent epitaxial structures may respectively be a source and a drain of the semiconductor device. For example, in FIG. 8B, the epitaxial structure 190a of the S/D epitaxial structure 190 is a source of the semiconductor device while the epitaxial structure 190b of the S/D epitaxial structure 190 is a drain of the semiconductor device. Similarly, the of the S/D epitaxial structures 195 may include some sources and some drains adjacent to each other.

A first interlayer dielectric (ILD) 220 is then formed on the first CESL 210. The first ILD 220 may be formed by chemical vapor deposition (CVD), high-density plasma CVD, spin-on, sputtering, or other suitable methods. In some embodiments, the first ILD 220 includes silicon oxide. In some other embodiments, the first ILD 220 may include silicon oxy-nitride, silicon nitride, compounds including Si, O, C and/or H (e.g., silicon oxide, SiCOH and SiOC), a low-k material, or organic materials (e.g., polymers). After the first ILD 220 is formed, a planarization operation, such as CMP, is performed, so that the pad layer 164 and the mask layer 166 (see FIG. 7) are removed and the dummy gate layer 162 (see FIG. 7) is exposed.

The dummy gate layer 162 and the sacrificial gate dielectric layer 150 (see FIG. 7) are then removed, thereby exposing the first and second semiconductor layers 122a, 122b, and 124 (see FIG. 5). The first ILD 220 protects the S/D epitaxial structures 190 and 195 during the removal of the dummy gate layer 162. The dummy gate layer 162 can be removed using plasma dry etching and/or wet etching. When the dummy gate layer 162 is polysilicon and the first ILD 220 is silicon oxide, a wet etchant such as a TMAH solution can be used to selectively remove the dummy gate layer 162. The dummy gate layer 162 can be removed using plasma dry etching and/or wet etching. Subsequently, the sacrificial gate dielectric layer 150 is removed as well. As such, the first and second semiconductor layers 122a, 122b, and 124 are exposed.

The first semiconductor layers 122a and 122b (see FIG. 5) in the fin structures 130 are then removed, thereby forming nanosheets (or nanowires or nanorods or nano-columns) of the second semiconductor layers 124. The first semiconductor layers 122a and 122b can be removed or etched using an etchant that can selectively etch the first semiconductor layers 122a and 122b at a faster etching rate than etching the second semiconductor layers 124. In FIG. 8B, since the inner spacers 180 is made of a material that has etching selectivity to that of the first semiconductor layers 122a and 122b, the inner spacers 180 protect the S/D epitaxial structures 190 and 195 from the etchant used in etching the first semiconductor layers 122a and 122b.

In some embodiments, interfacial layers 236 are optionally formed to surround exposed surfaces of the second semiconductor layers 124 and exposed surfaces of the base portions of the substrate 110. In various embodiments, the interfacial layer 236 may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods.

Gate structures 230 are then formed and/or filled between the gate spacers 170 and the inner spacers 180. That is, the gate structure 230 encircles (or surrounds or wraps) the second semiconductor layers 124, in which the second semiconductor layers 124 are referred to as channels of the semiconductor device. The gate spacers 170 are disposed on opposite sides of the gate structure 230. The gate structure 230 includes a gate dielectric layer 232 and a gate electrode 234. The gate electrode 234 includes one or more work function metal layer (s) and a filling metal. The gate dielectric layer 232 is conformally formed. That is, the gate dielectric layer 232 is in contact with the isolation structures 140 and the interfacial layers 236 (or the second semiconductor layers 124 when the interfacial layers 236 are omitted). Furthermore, the gate dielectric layer 232 surrounds the second semiconductor layers 124, and spaces between the second semiconductor layers 124 are still left after the deposition of the gate dielectric layer 232. In some embodiments, the gate dielectric layer 232 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 232 may be formed by performing an ALD process or other suitable process.

The work function metal layer of the gate electrode 234 is conformally formed on the gate dielectric layer 232, and the work function metal layer surrounds the second semiconductor layers 124 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal of the gate electrode 234 fills the remained space between the gate spacers 170 and between the inner spacers 180. That is, the work function metal layer(s) is in contact with and between the gate dielectric layer 232 and the filling metal. The filling metal may include material such as tungsten or aluminum. After the deposition of the gate dielectric layer 232 and the gate electrode 234, a planarization process, such as a CMP process, may be then performed to remove excess portions of the gate dielectric layer 232 and the gate electrode 234 to form the gate structure 230.

Figure 9A:
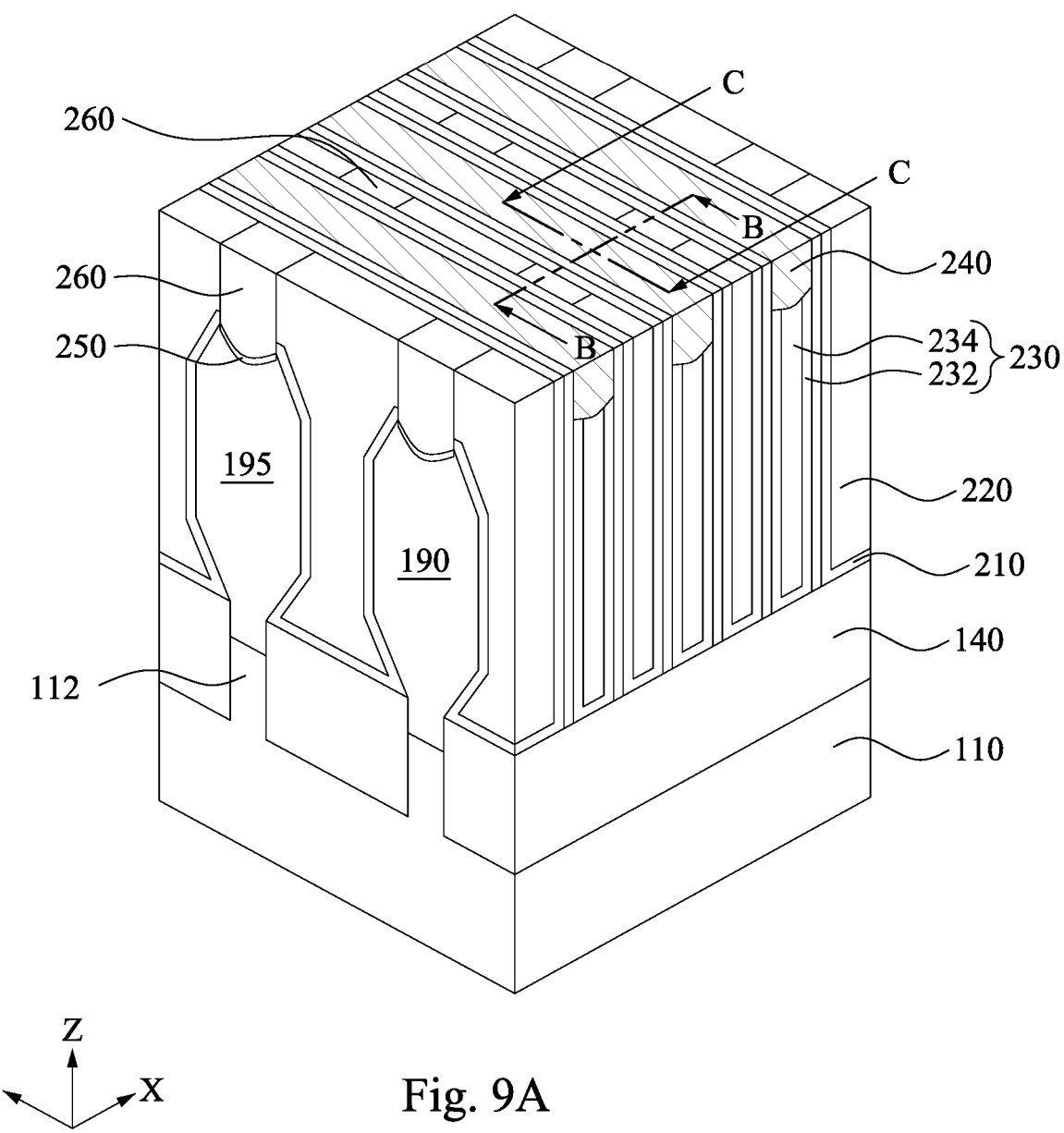
Figure 9B:
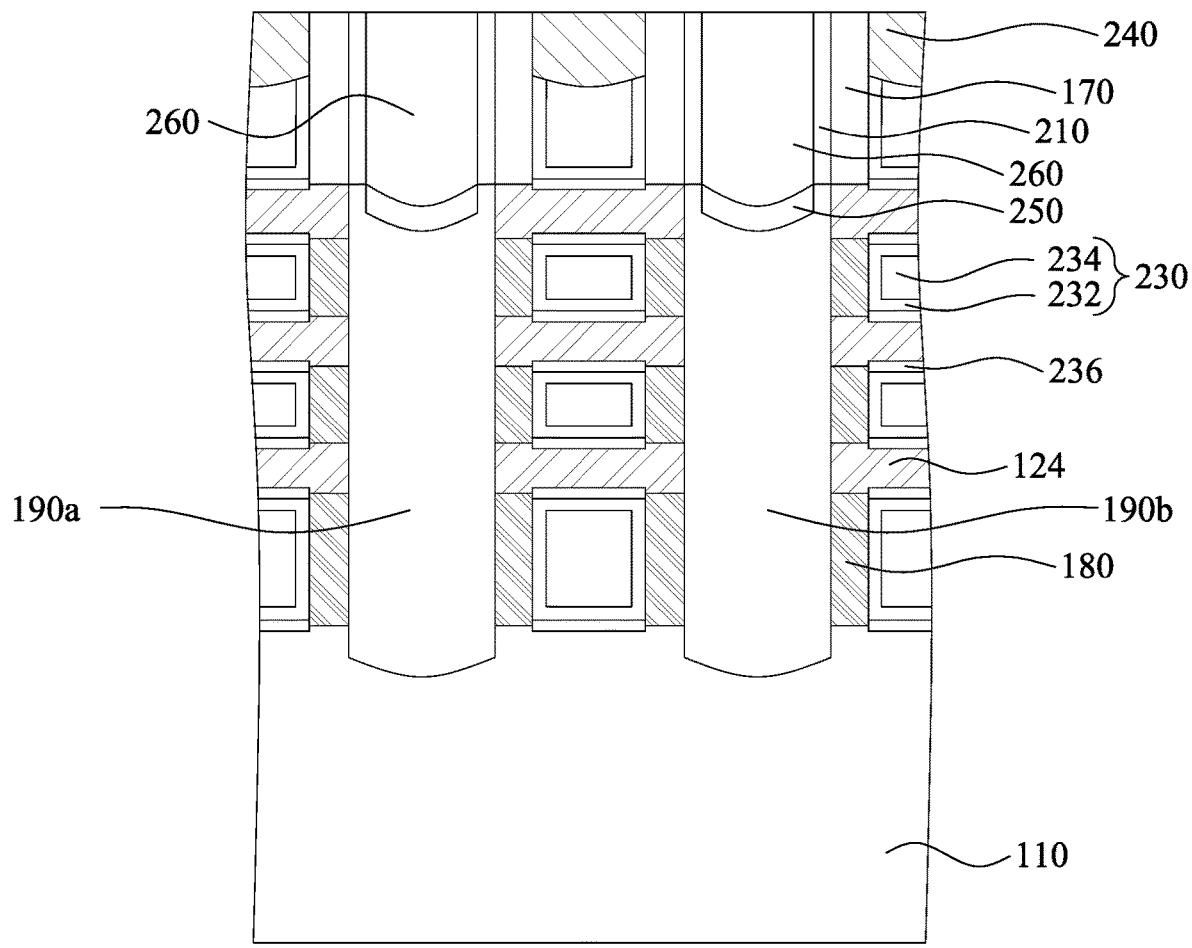
Figure 9C:
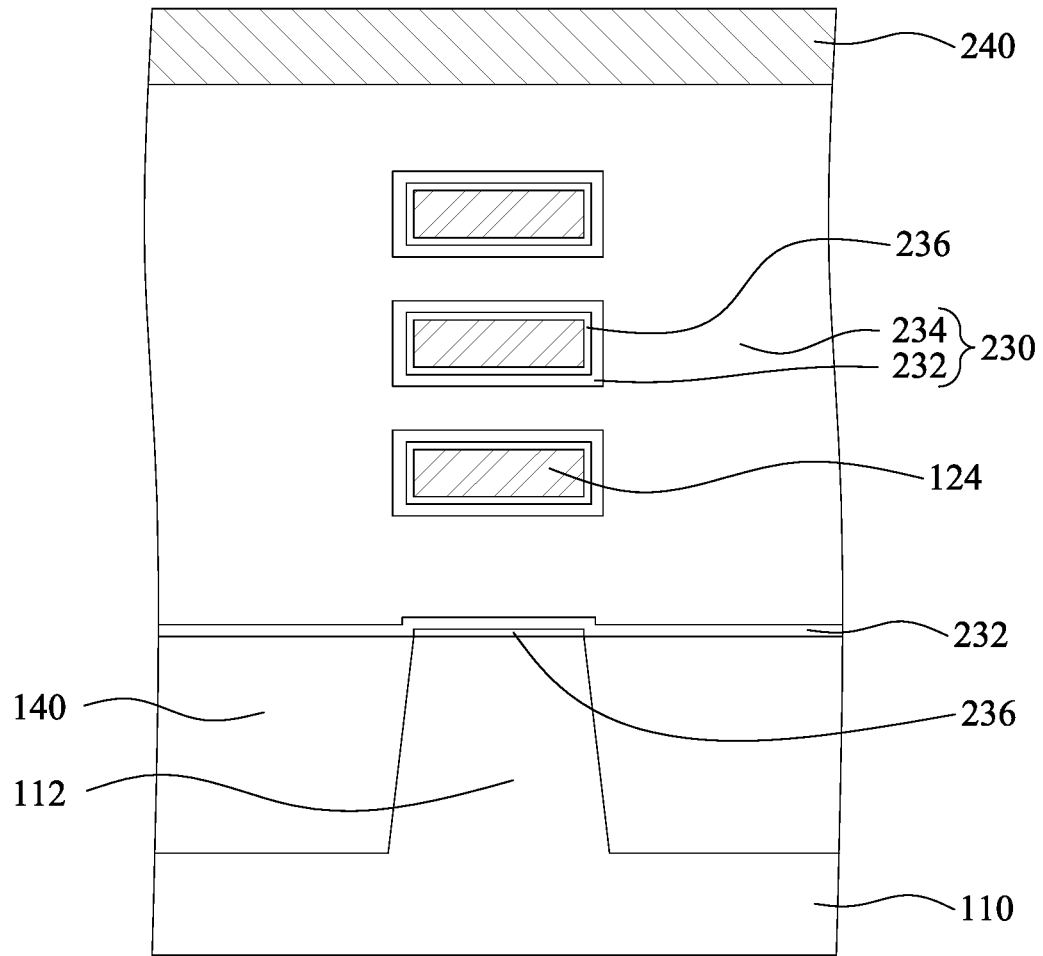

Reference is made to FIGS. 9A-9C, where FIG. 9B is a cross-sectional view taken along line B-B of FIG. 9A, and FIG. 9C is a cross-sectional view taken along line C-C of FIG. 9A. In some embodiments, the gate structures 230 are recessed, and front-side dielectric caps 240 are formed over respective gate structures 230 using, for example, a deposition process to deposit a dielectric material over the substrate 110, followed by a CMP process to remove excess dielectric material outside the gate trenches. In some embodiments, the front-side dielectric caps 240 include silicon nitride or other suitable dielectric material. The front-side dielectric caps 240 have different etch selectivity than the gate spacers 170, the CESL 210, and/or the first ILD 220, so as to selective etch back the front-side dielectric caps 240. The front-side dielectric caps 240 can be used to define self-aligned contact region and thus referred to as SAC structures or a SAC layer. In some embodiments, the front-side dielectric caps 240 have a convex bottom surface (i.e., an interface between the front-side dielectric caps 240 and the gate structure 230).

The first ILD 220 is then patterned to form trenches on opposite sides of the gate structures 230, and then the first CESL 210 is patterned to expose the S/D epitaxial structures 190 and 195. In some embodiments, multiple etching processes are performed to pattern the first ILD 220 and the first CESL 210. The etching processes include dry etching process, wet etching process, or combinations thereof.

In some embodiments, front-side metal alloy layers 250 are respectively formed above the S/D epitaxial structures 190 and 195. The front-side metal alloy layers 250, which may be silicide layers, are respectively formed in the trenches and over the exposed S/D epitaxial structures 190 and 195 by a self-aligned silicide (salicide) process. The silicide process converts the surface portions of the S/D epitaxial structures 190 and 195 into the silicide contacts. Silicide processing involves deposition of a metal that undergoes a silicidation reaction with silicon (Si). In order to form silicide contacts on the S/D epitaxial structures 190 and 195, a metal material is blanket deposited on the S/D epitaxial structures 190 and 195. After heating the wafer to a temperature at which the metal reacts with the silicon of the S/D epitaxial structures 190 and 195 to form contacts, unreacted metal is removed. The silicide contacts remain over the S/D epitaxial structures 190 and 195, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the front-side metal alloy layer 250 may include germanium.

Contacts 260 are then formed in the trenches and above the front-side metal alloy layers 250. As such, the contacts 260 are electrically connected to the S/D epitaxial structures 190 and 195. In some embodiments, the contacts 260 may be made of metal, such as W, Co, Ru, Al, Cu, or other suitable materials. After the deposition of the contacts 260, a planarization process, such as a chemical mechanical planarization (CMP) process, may be then performed. In some embodiments, barrier layers may be formed in the trenches before the formation of the contacts 260. The barrier layers may be made of TiN, TaN, or combinations thereof.

Figure 10:
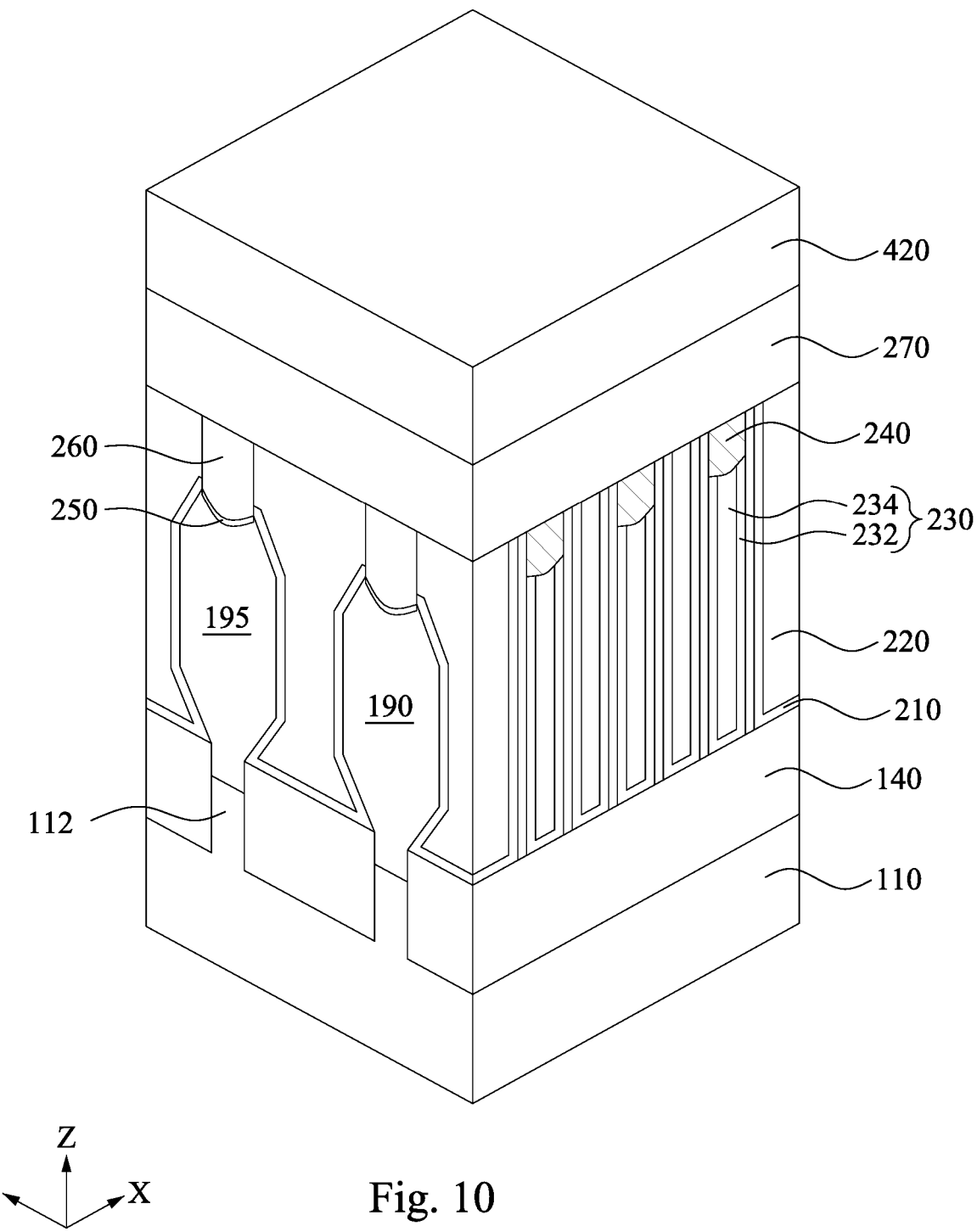

Reference is made to FIG. 10. A multilayer interconnection (MLI) 270 including metal layers and inter-metal dielectric (IMD) is formed over the substrate 110 to electrically connect various features or structures (e.g., the contacts 260 and/or the gate structures 230) of the semiconductor device. The MLI 270 includes vertical interconnects, such as vias or contacts, and horizontal interconnects, such as metal lines. The various interconnection features may implement various conductive materials including copper, tungsten and silicide. In some examples, a damascene process is used to form copper multilayer interconnection structure.

Subsequently, a carrier substrate 420 is formed above the MLI 270. For example, the carrier substrate 420 is bond to the MLI 270. In some embodiments, carrier substrate 420 is sapphire. In some other embodiments, the carrier substrate 420 is silicon, a thermoplastic polymer, oxide, carbide, or other suitable material.

Figure 11:
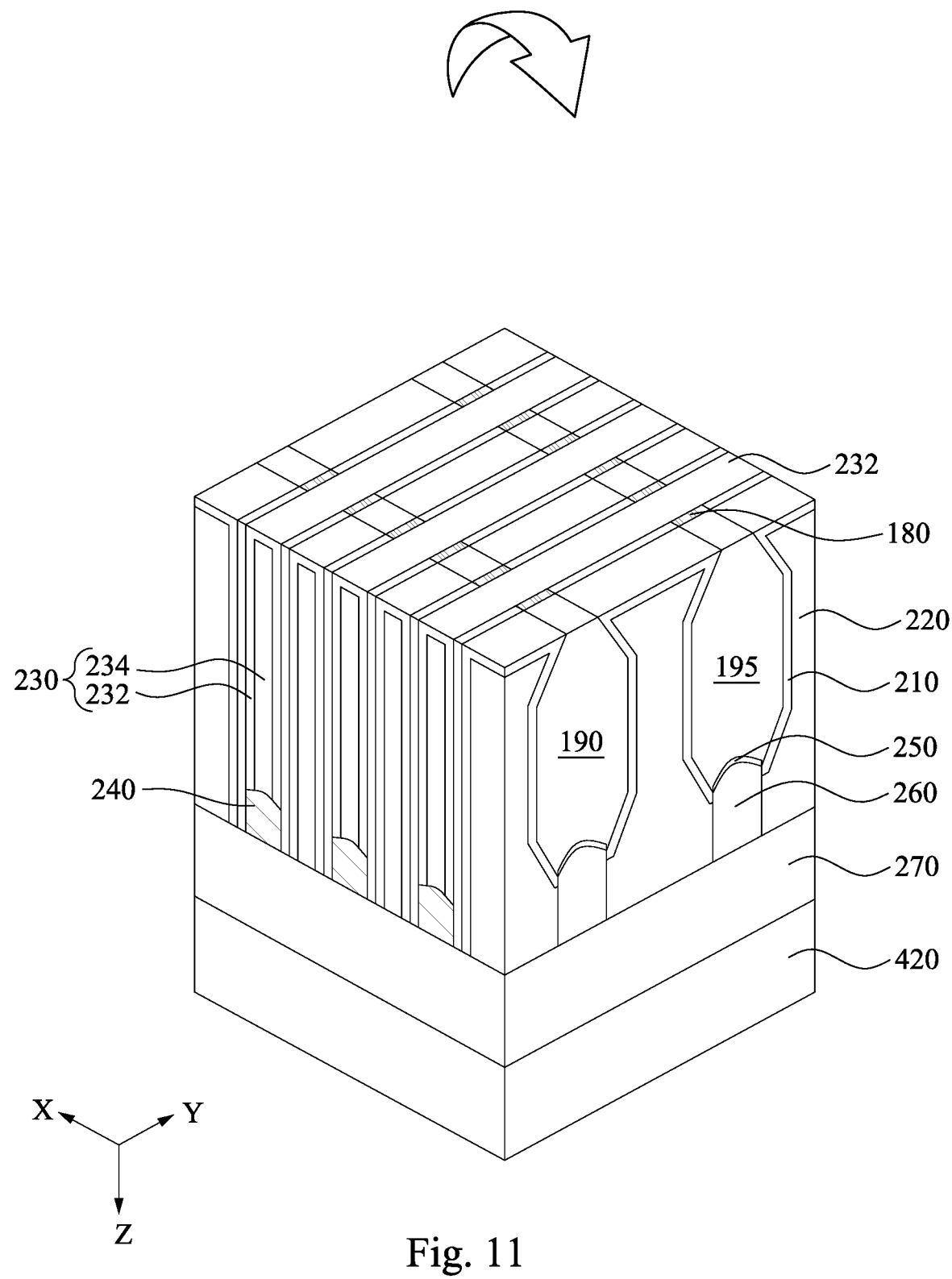

Reference is made to FIG. 11. The structure of FIG. 10 is "flipped" upside down, and the substrate 110 and the isolation structures 140 are removed. The substrate 110 and the isolation structures 140 may be removed in a plurality of process operations, for example, first removing the bulk substrate 110 followed by removal of the isolation structures 140. In some embodiments, the removal processes include removal of the substrate 110 and the isolation structures 140 using, for example, CMP, HNA, and/or TMAH etching, which stops at the first CESL 210. After the removal process, the S/D epitaxial structures 190, 195, the first CESL 210, the gate dielectric layers 232, the gate spacers 170, and the inner spacers 180 are exposed as shown in FIG. 11.

Figure 12A:
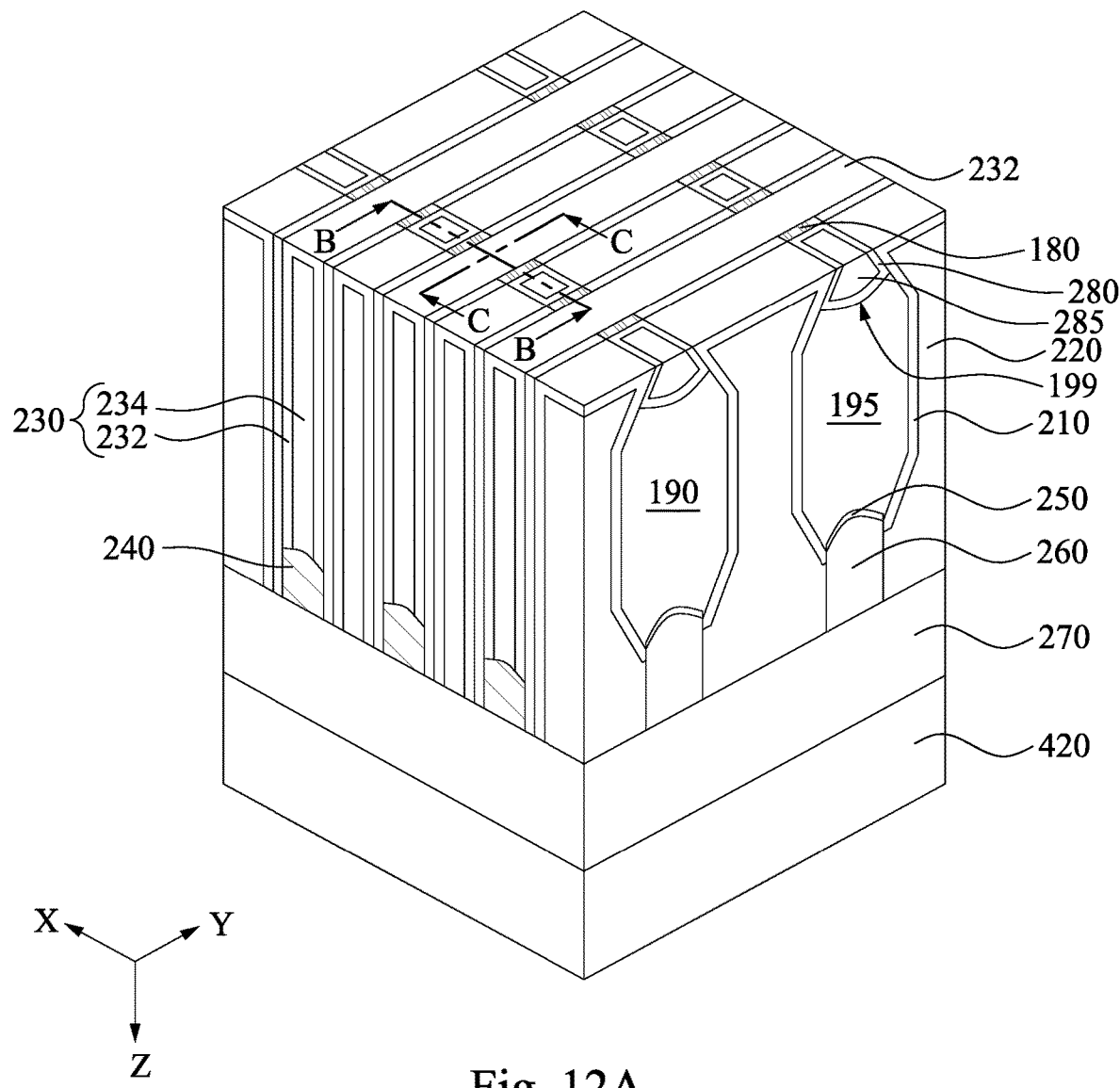
Figure 12B:
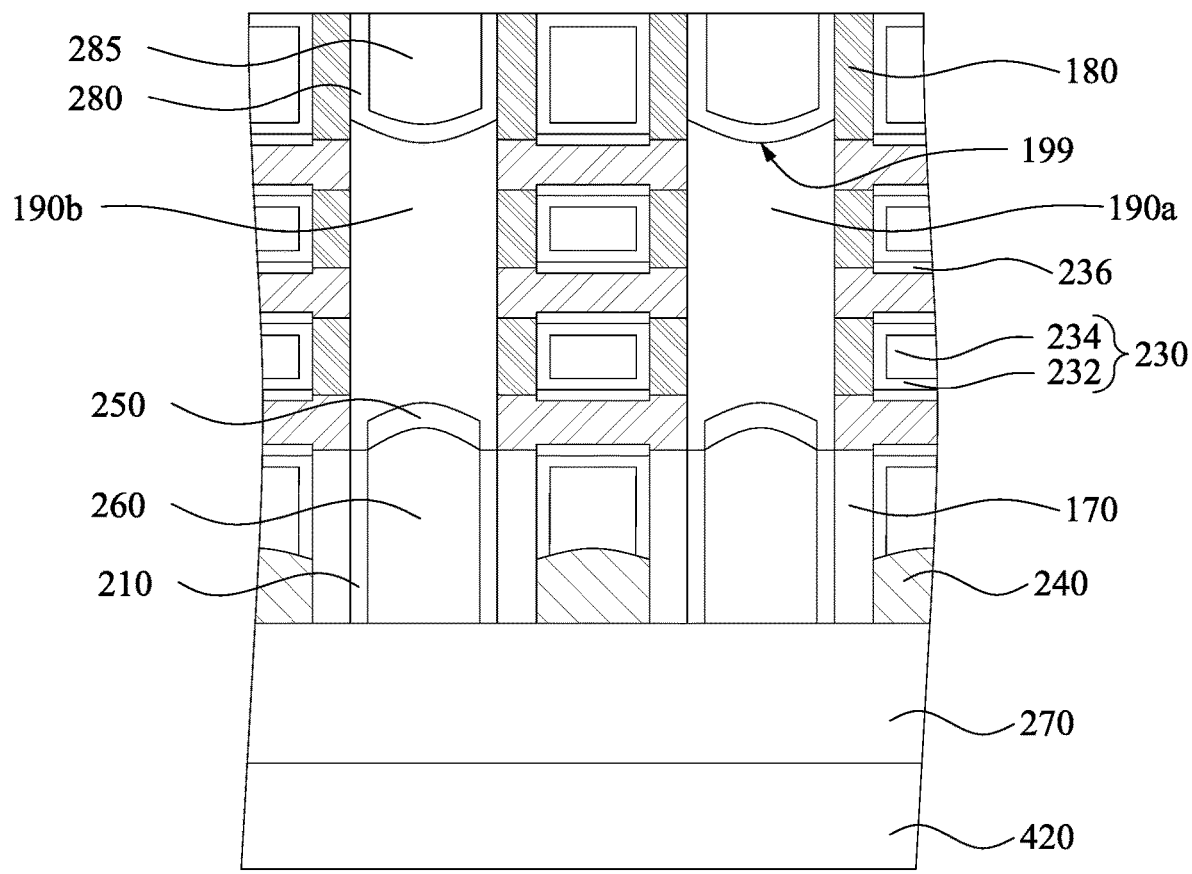
Figure 12C:
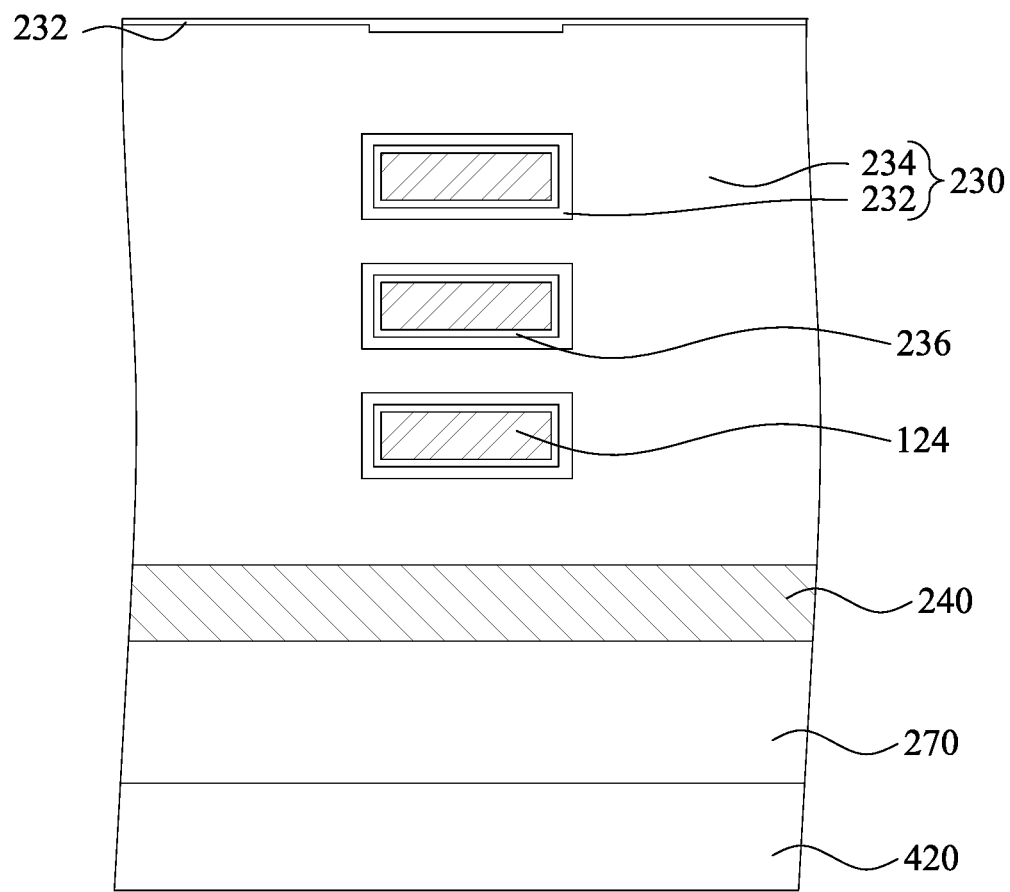

Reference is made to FIGS. 12A-12C, where FIG. 12B is a cross-sectional view taken along line B-B of FIG. 12A, and FIG. 12C is a cross-sectional view taken along line C-C of FIG. 12A. The epitaxial structures 190 and 195 are recessed from the backside thereof to form recesses 199 therein. The epitaxial structures 190 and 195 can be recessed or etched using an etchant that can selectively etch the epitaxial structures 190 and 195 at a faster etching rate than etching dielectric materials (e.g., the inner spacers 180, the CESL 210, and the gate dielectric layers 232).

Subsequently, a second CESL 280 is conformally formed in the recesses 199. In some embodiments, the second CESL 280 can be a stressed layer or layers. In some embodiments, the second CESL 280 has a tensile stress and is formed of $Si_3N_4$. In some other embodiments, the second CESL 280 includes materials such as oxynitrides. In yet some other embodiments, the second CESL 280 may have a composite structure including a plurality of layers, such as a silicon nitride layer overlying a silicon oxide layer. The second CESL 280 can be formed using plasma enhanced CVD (PECVD), however, other suitable methods, such as low pressure CVD (LPCVD), atomic layer deposition (ALD), and the like, can also be used.

A second ILD 285 is then formed on the second CESL 280. The second ILD may be formed by chemical vapor deposition (CVD), high-density plasma CVD, spin-on, sputtering, or other suitable methods. In some embodiments, the second ILD includes silicon oxide. In some other embodiments, the second ILD may include silicon oxy-nitride, silicon nitride, compounds including Si, O, C and/or H (e.g., silicon oxide, SiCOH and SiOC), a low-k material, or organic materials (e.g., polymers). After the second ILD is formed, a planarization operation, such as CMP, is performed, so that portions of the second CESL 280 and second ILD 285 outside the recesses 199 are removed and the dielectric materials (e.g., the inner spacers 180, the CESL 210, and the gate dielectric layers 232) are exposed.

Figure 13A:
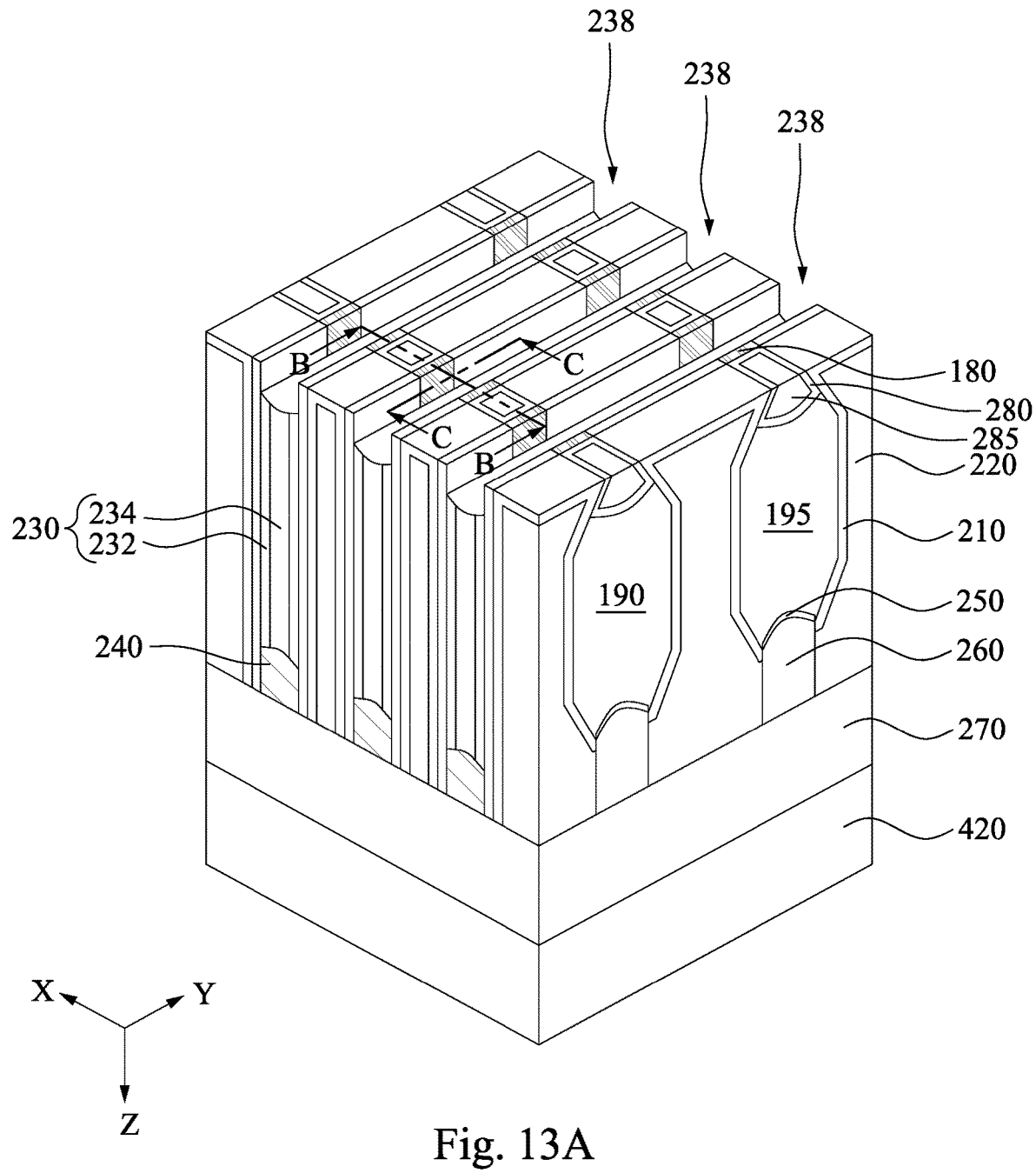
Figure 13B:
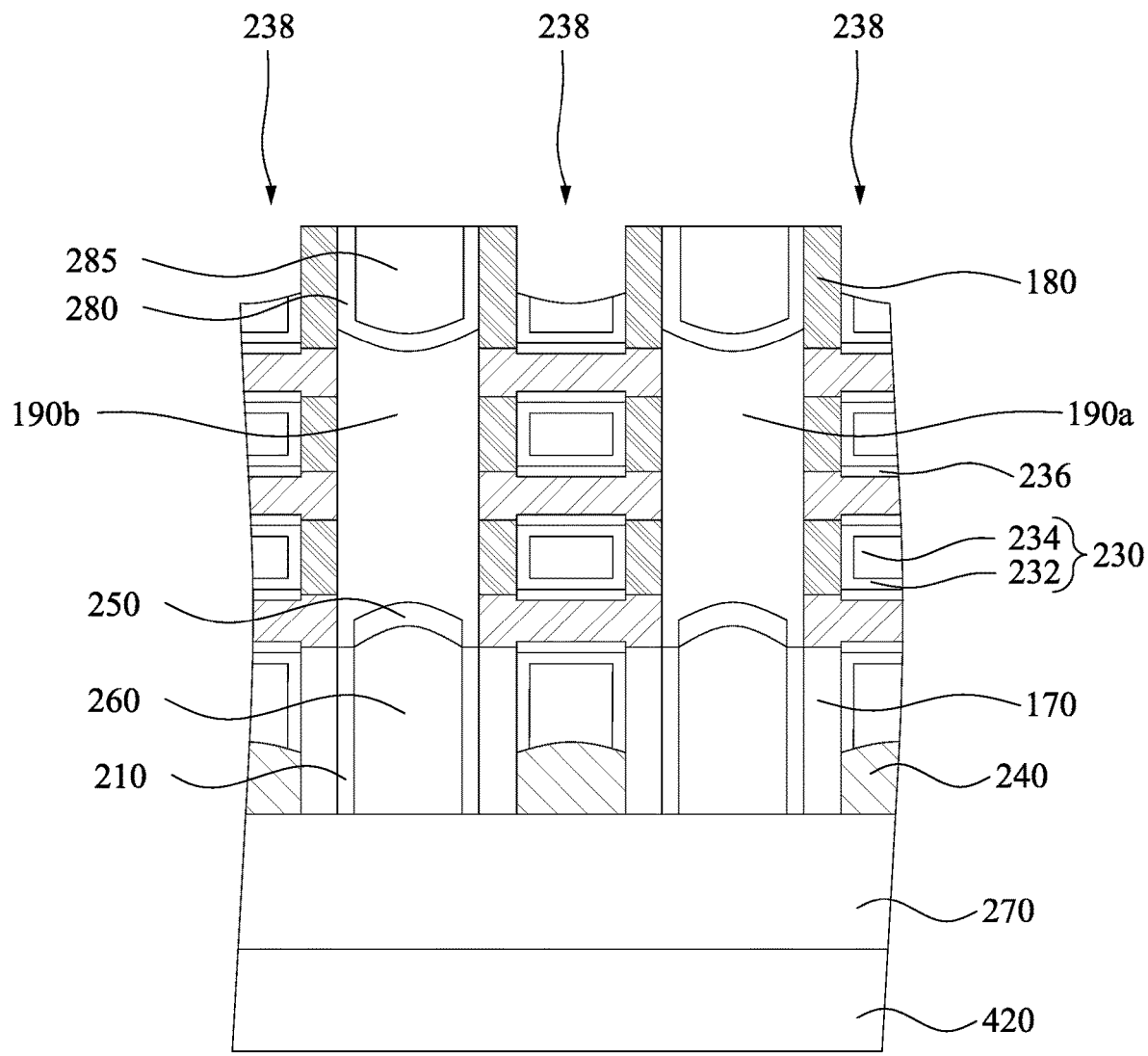
Figure 13C:
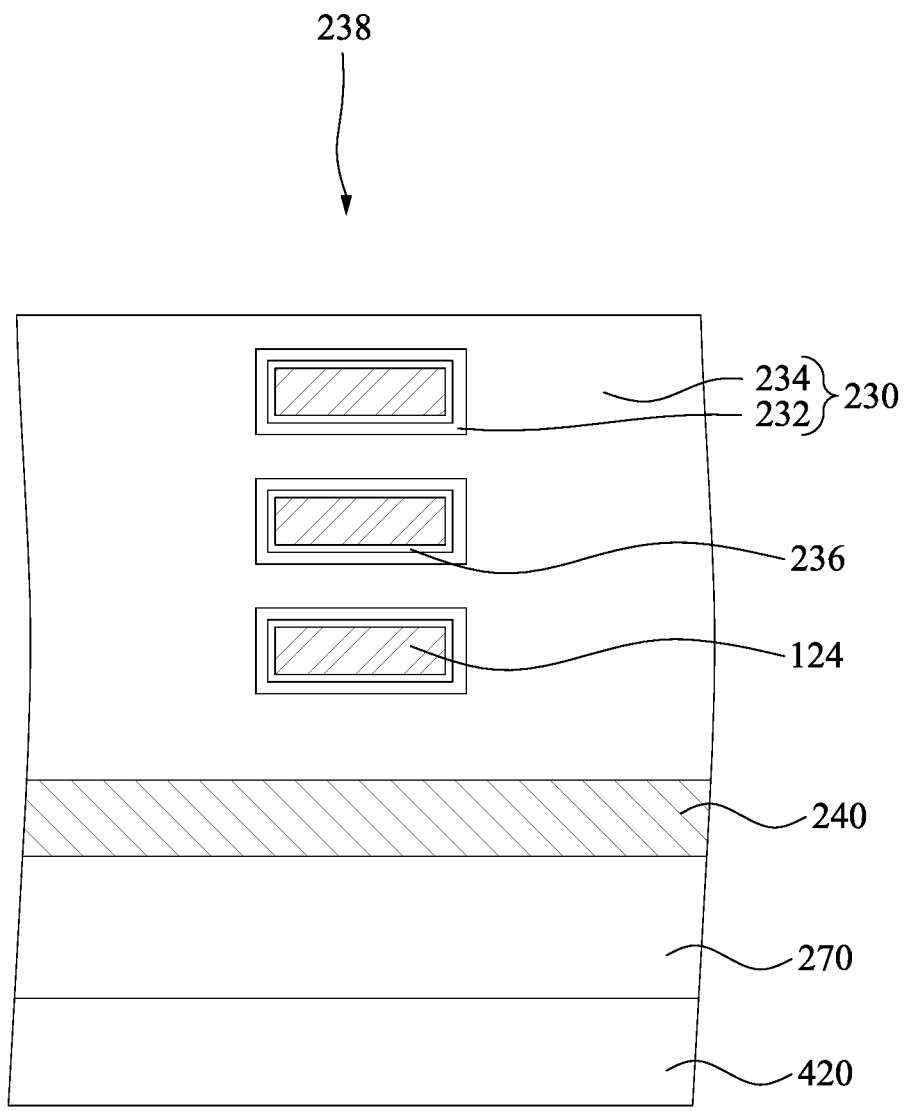

Reference is made to FIGS. 13A-13C, where FIG. 13B is a cross-sectional view taken along line B-B of FIG. 13A, and FIG. 13C is a cross-sectional view taken along line C-C of FIG. 13A. An etching process is performed to remove a portion of the gate structure 230 from the backside thereof to form gate trenches 238 with the inner spacers 180 and the gate spacers 170 as their sidewalls. In some embodiments, about 3 nm to about 15 nm from the bottom portion of the gate structure 230 is etched away to form the gate trenches 238 about 3 nm to about 15 nm deep. In alternative embodiments, more or less of the gate structure 230 may be etched away. The gate trenches 238, however, do not expose the second semiconductor layers 124 in some embodiments.

Figure 14A:
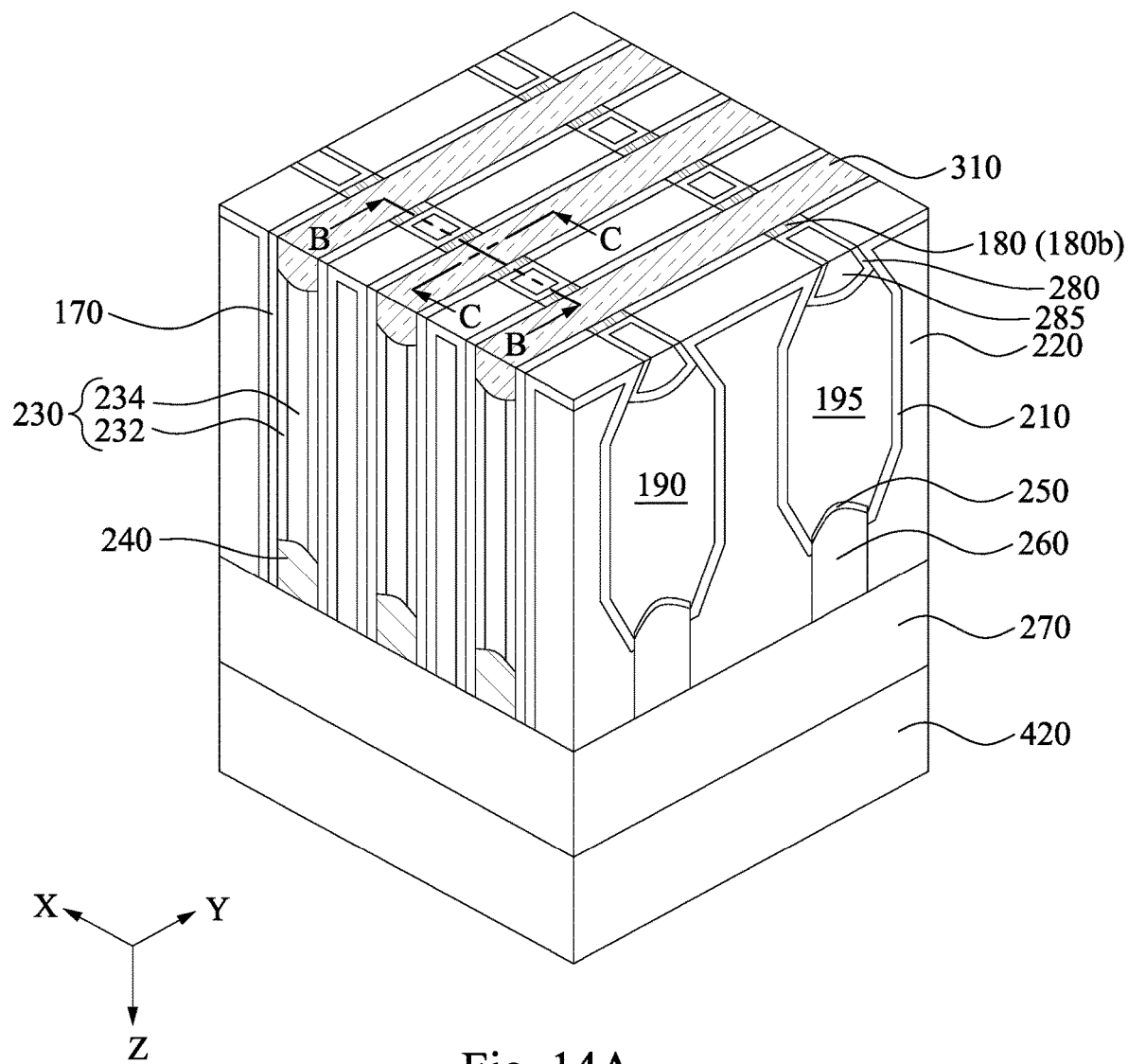
Figure 14B:
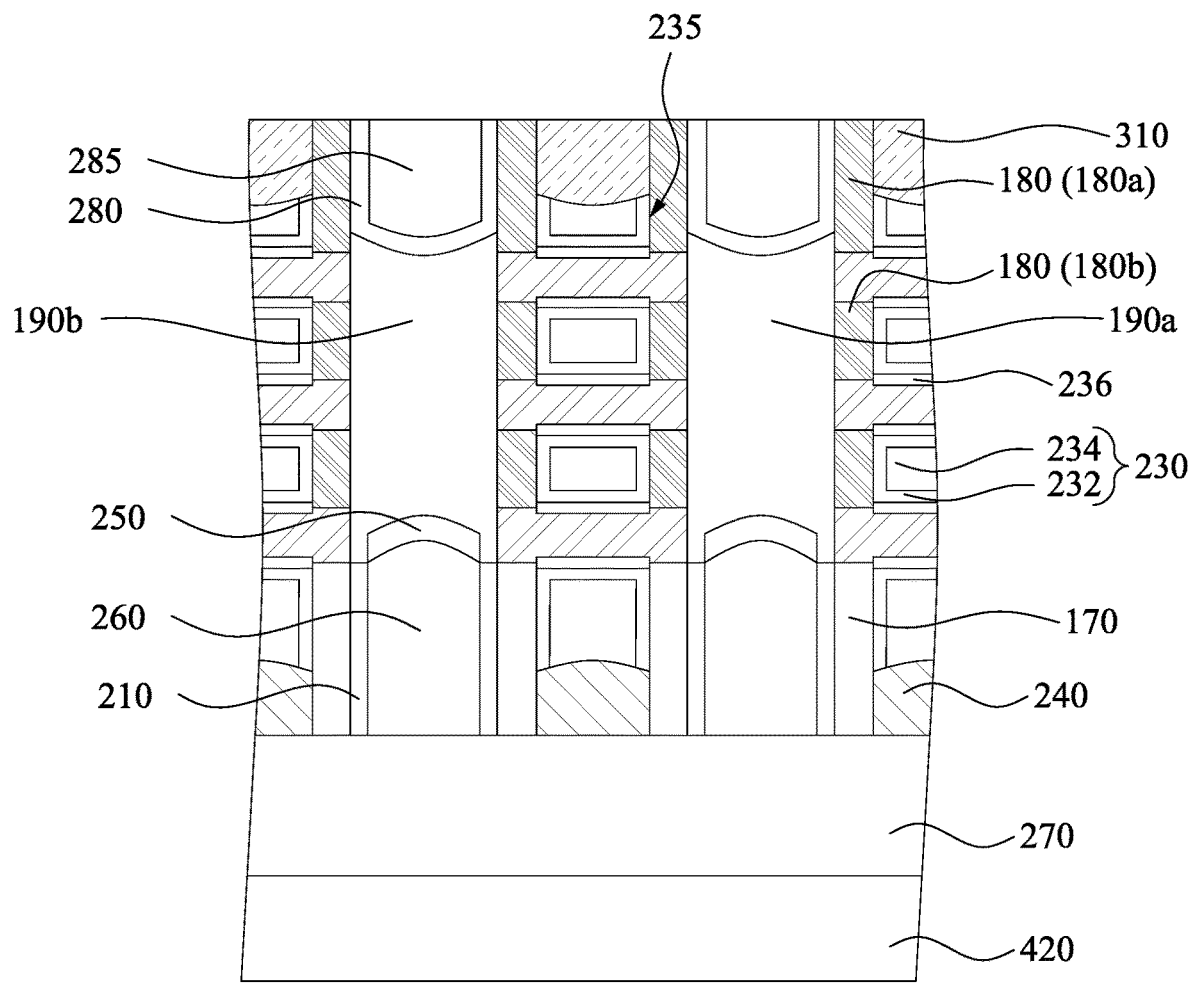
Figure 14C:
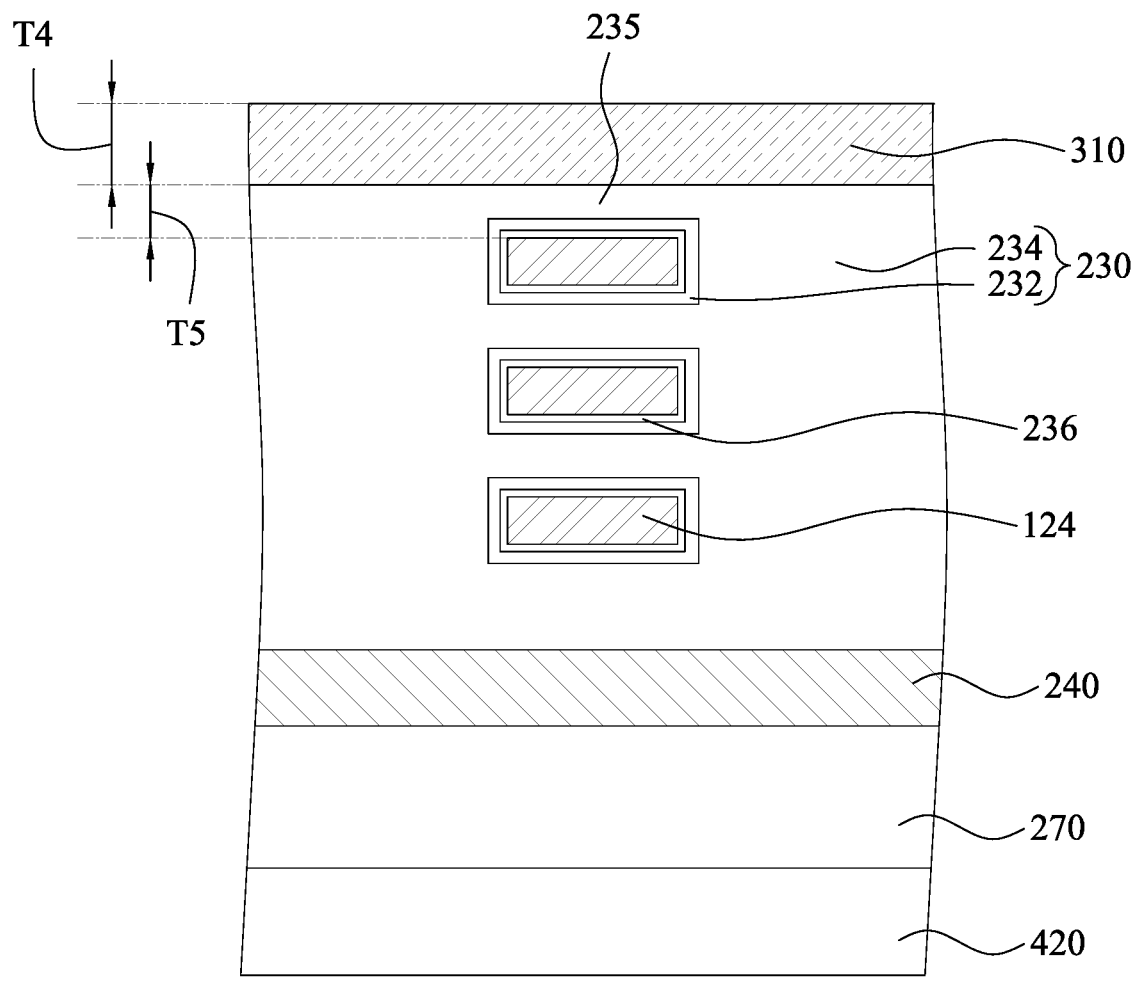

Reference is made to FIGS. 14A-14C, where FIG. 14B is a cross-sectional view taken along line B-B of FIG. 14A, and FIG. 14C is a cross-sectional view taken along line C-C of FIG. 14A. Backside dielectric caps 310 are formed in the respective gate trenches 238 (see FIGS. 13A-13C) using, for example, a deposition process to deposit a dielectric material over the structure in FIGS. 13A-13C, followed by a CMP process to remove excess dielectric material outside the gate trenches 238. In some embodiments, the backside dielectric caps 310 include $SiO_2$, SiN, SiCN, SiOCN, $Al_2O_3$, AlON, $ZrO_2$, $HfO_2$, combinations thereof, or the like. In some embodiments, the backside dielectric caps 310 and the front-side dielectric caps 240 have the same or different materials. In some embodiments, the backside dielectric caps 310 have convex top surfaces (i.e., the interface between the backside dielectric caps 310 and the gate structures 230). Further, the backside dielectric caps 310 have a thickness T4 in a range of about 3 nm to about 15 nm, leaving a portion 235 of the gate structure 230 between the backside dielectric caps 310 and the bottommost second semiconductor layer 124 having a thickness T5 in a range of about 3 nm to about 12 nm.

If the thickness T4 of the backside dielectric caps 310 is greater than about 15 nm and/or the thickness T5 of the portion 235 of the gate structure 230 is less than about 3 nm, a space between the backside dielectric caps 310 and the bottommost second semiconductor layer 124 may be small, such that the gate structure 230 may not surround the bottommost second semiconductor layer 124, thereby degrading the performance of the semiconductor device. If the thickness T4 of the backside dielectric caps 310 is less than about 3 nm or the thickness T5 of the portion 235 of the gate structure 230 is greater than about 12 nm, a current leakage problem may occur between the gate structure 230 and the following formed backside via 340 (see FIG. 17B).

Figure 15A:
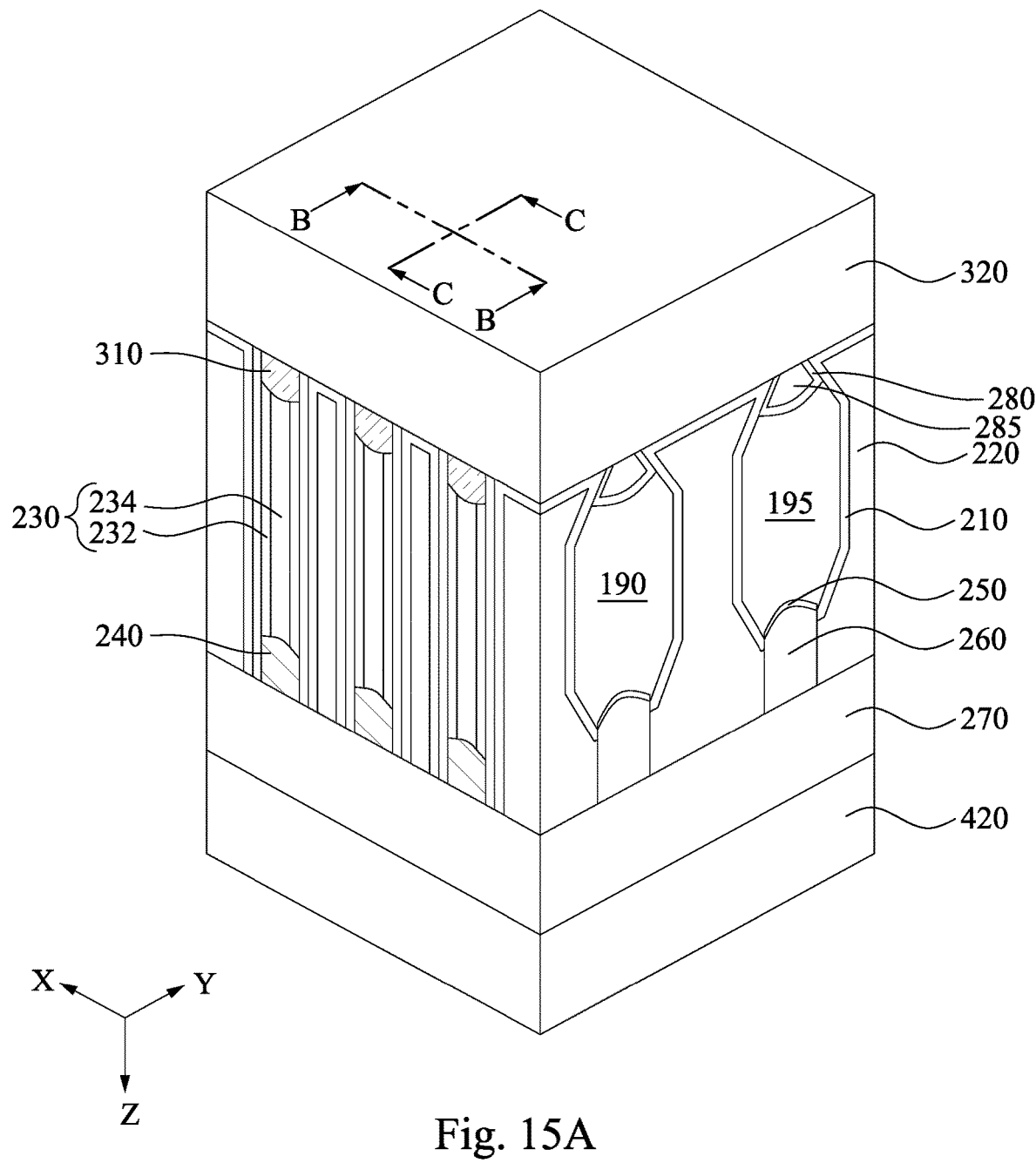
Figure 15B:
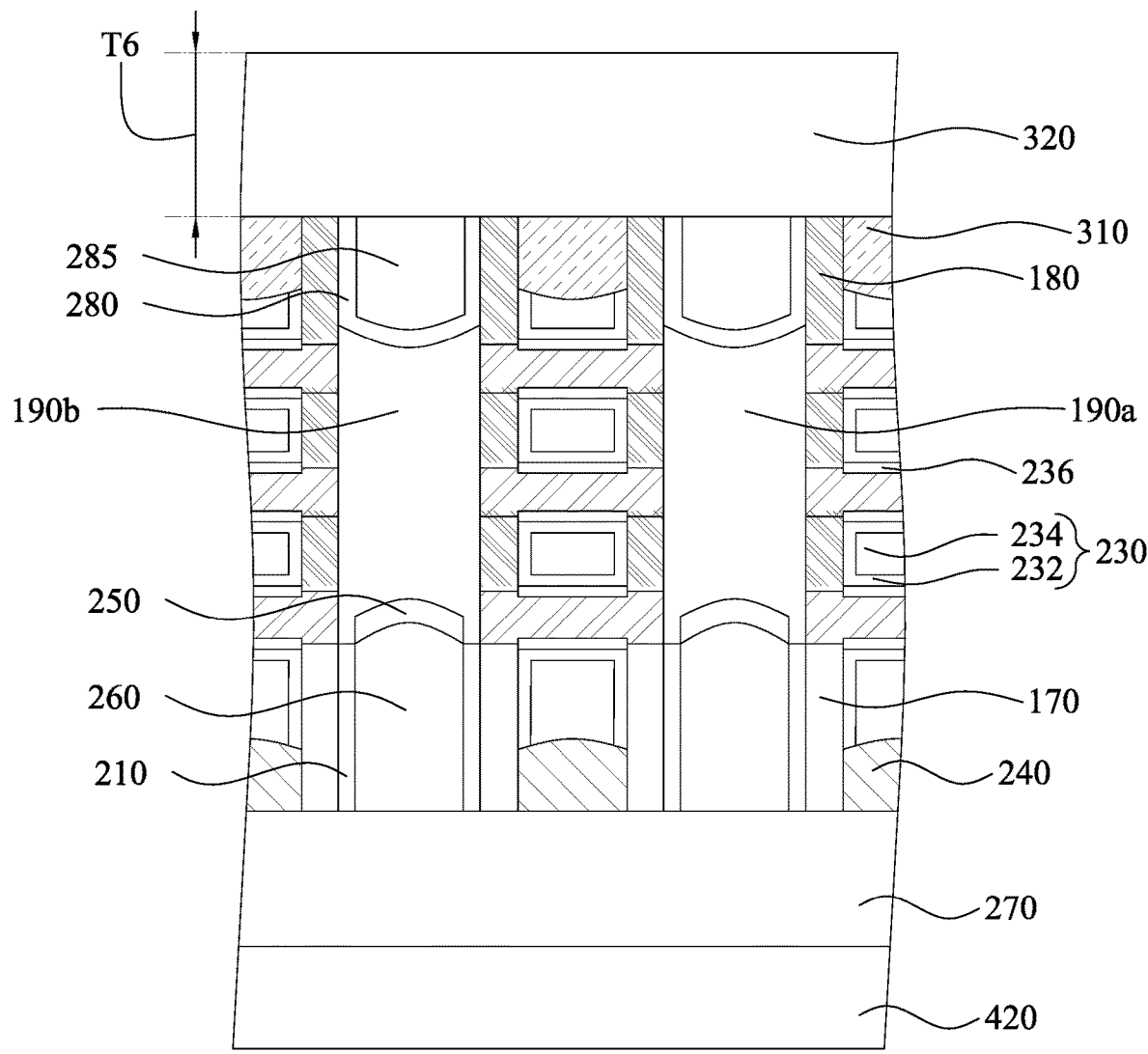
Figure 15C:
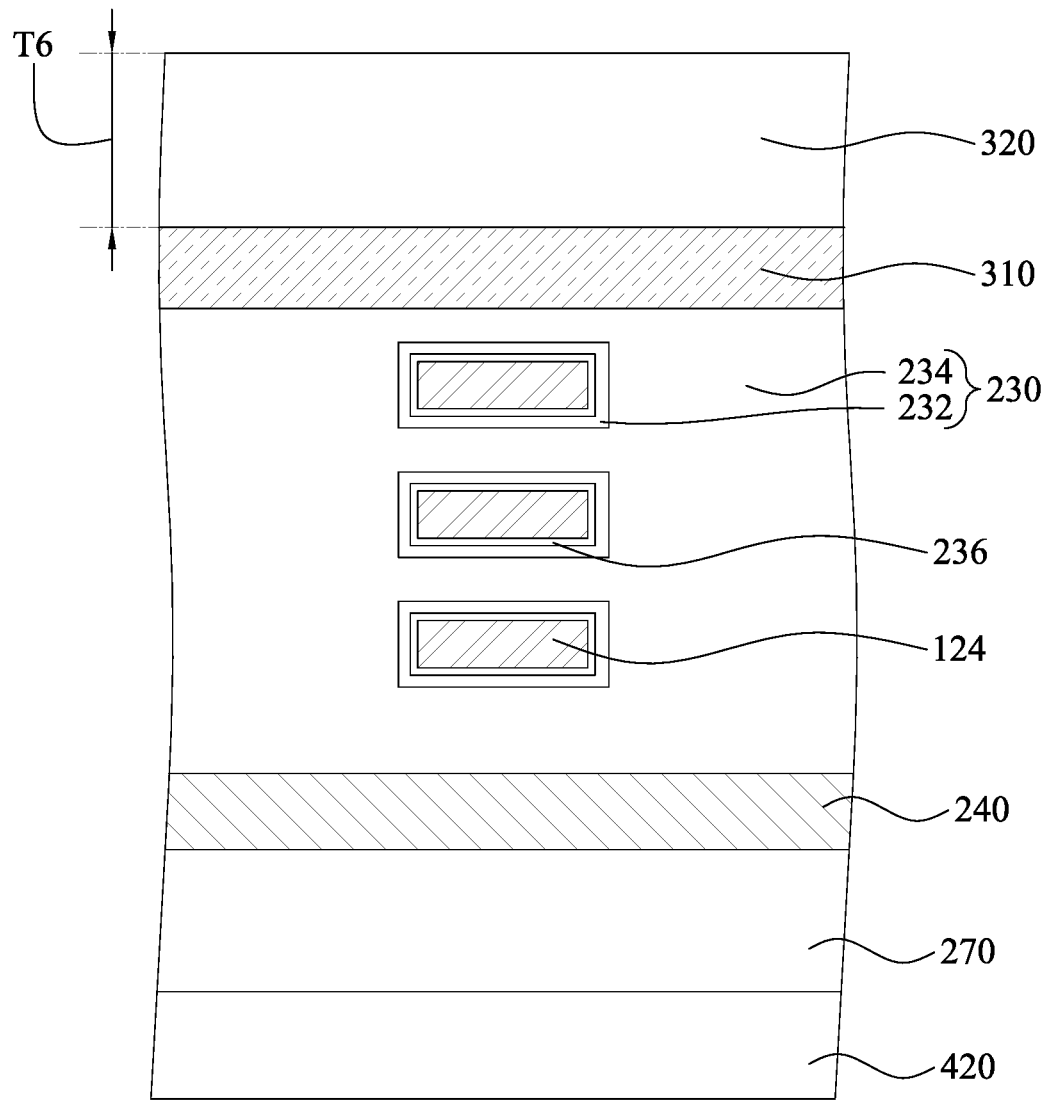

Reference is made to FIGS. 15A-15C, where FIG. 15B is a cross-sectional view taken along line B-B of FIG. 15A, and FIG. 15C is a cross-sectional view taken along line C-C of FIG. 15A. An isolation layer 320 is formed to cover the backside dielectric caps 310 as shown in FIGS. 15A-15C. In some embodiments, the isolation layer 320 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra-low-k materials (e.g., having a dielectric constant less than about 2.9), such as k=2.5-2.6, may also be used. These materials and processes are provided as examples and other materials and processes may be used. In some embodiments, the isolation layer 320 has a thickness T6 in a range of about 5 nm to about 30 nm.

Figure 16A:
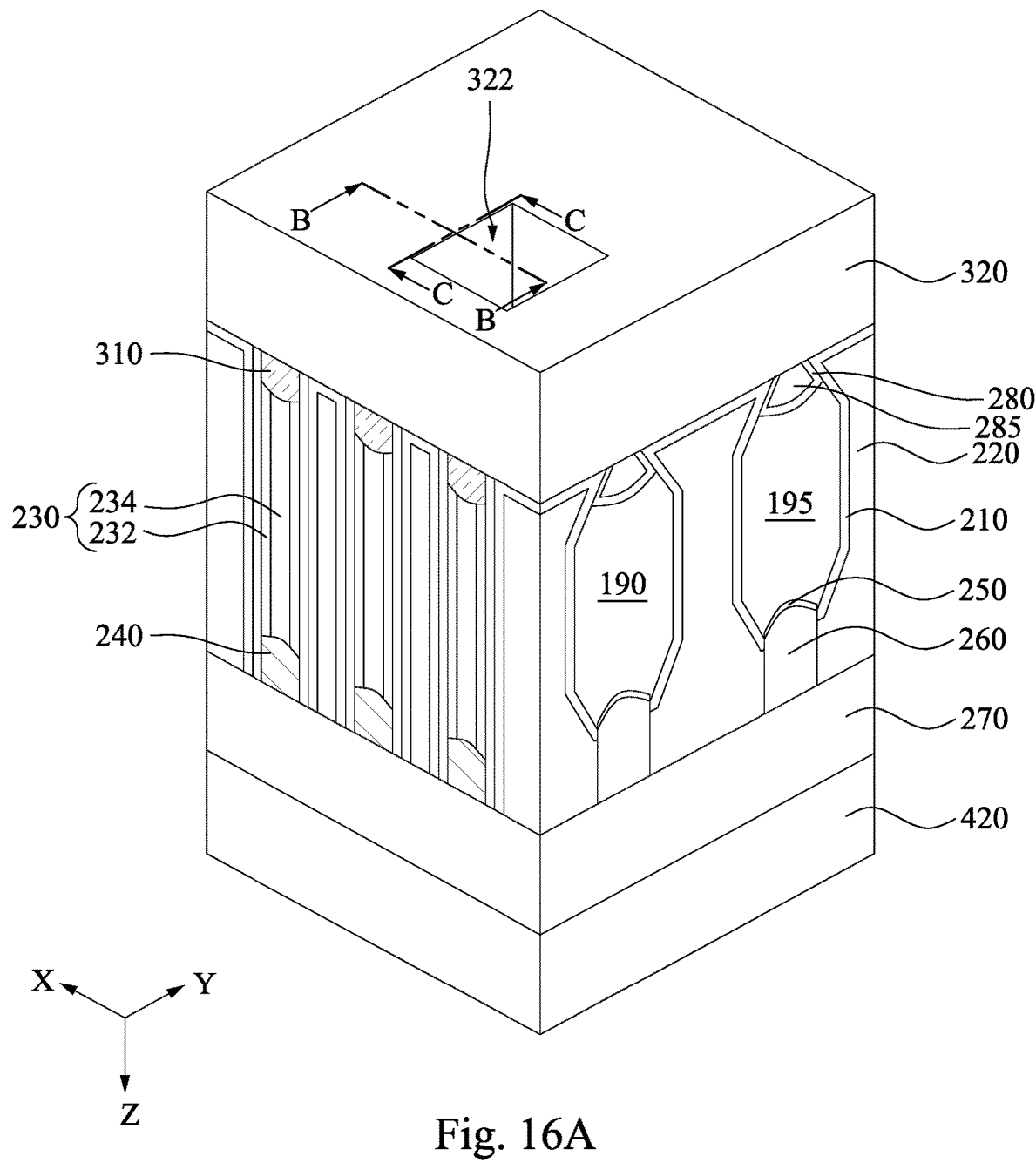
Figure 16B:
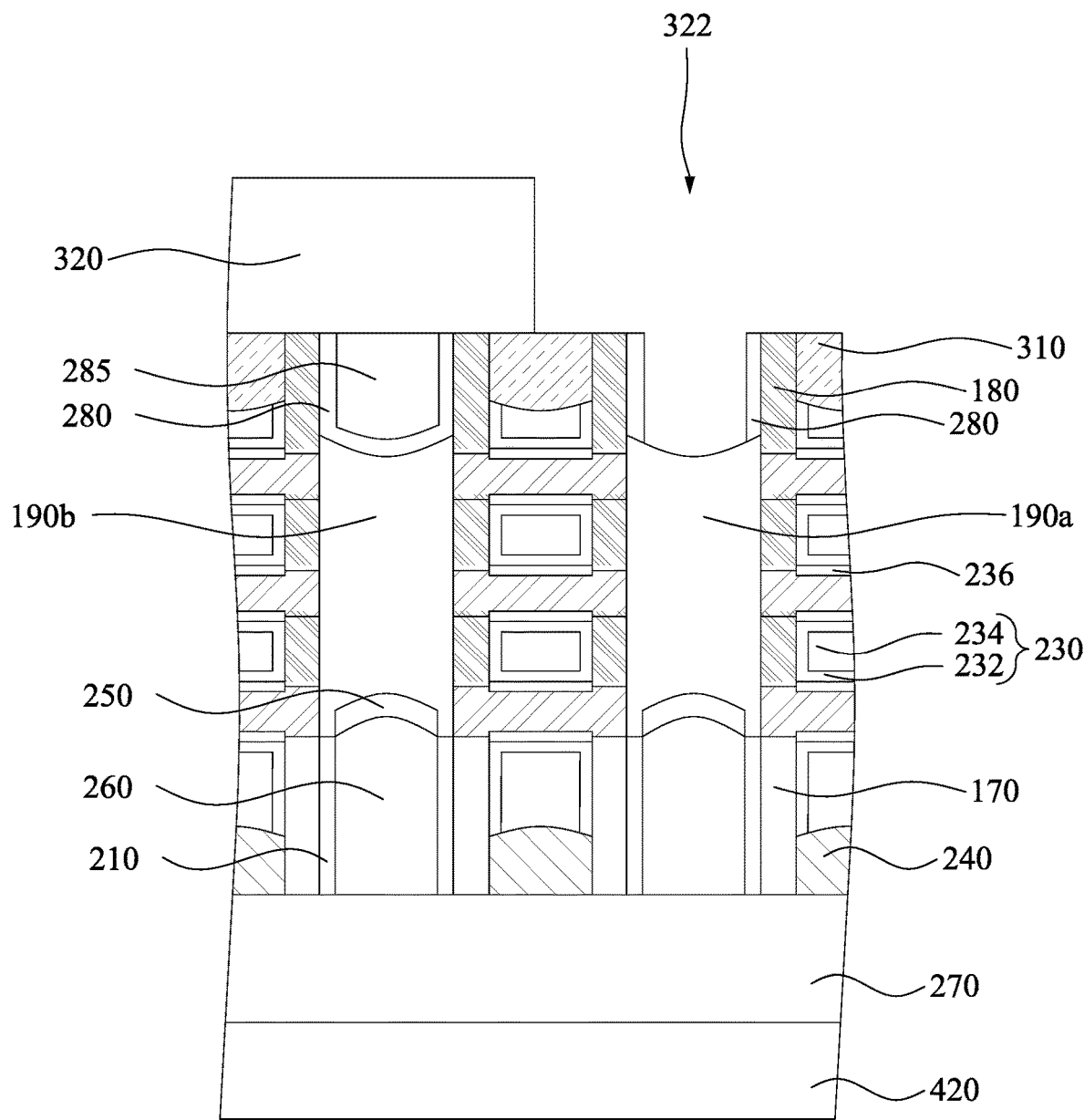
Figure 16C:
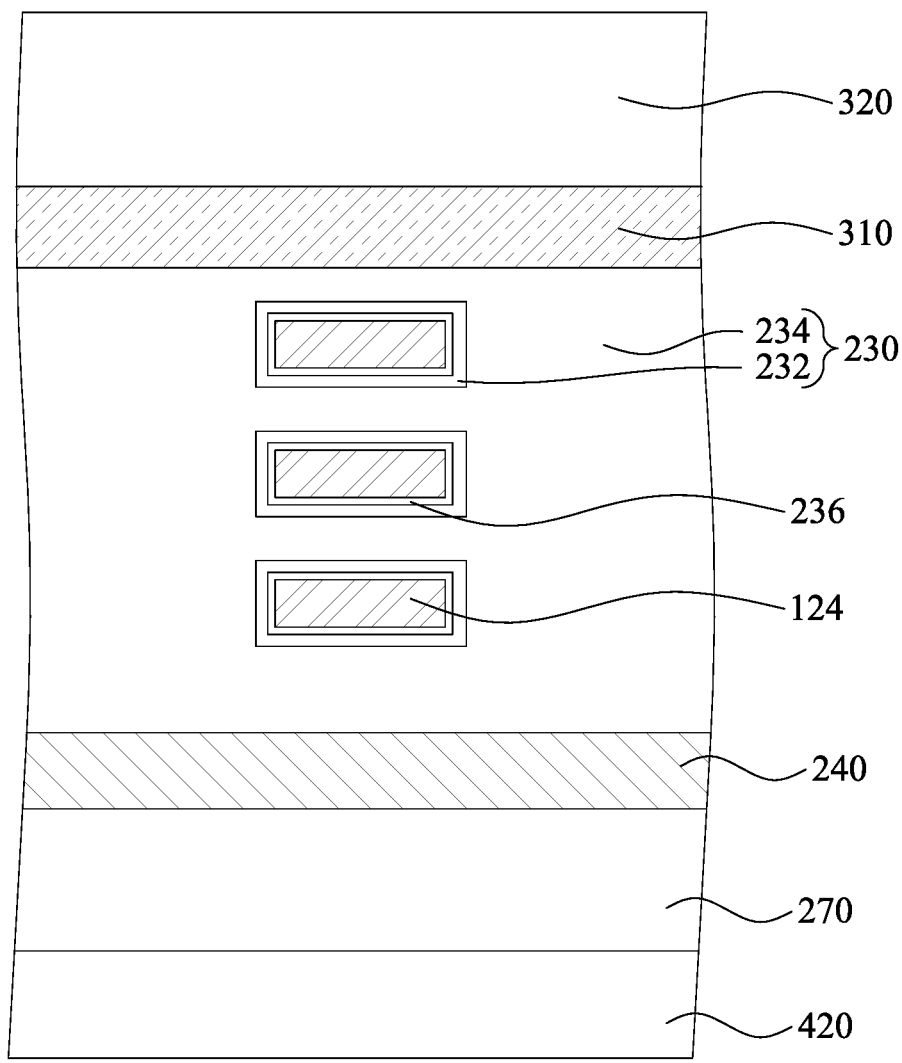

Reference is made to FIGS. 16A-16C, where FIG. 16B is a cross-sectional view taken along line B-B of FIG. 16A, and FIG. 16C is a cross-sectional view taken along line C-C of FIG. 16A. An opening 322 is formed in the isolation layer 320, and a portion of the second ILD 285 exposed by the opening 322 is also removed. Subsequently, a portion of the second CESL 280 is removed to expose the epitaxial structure 190a, which serves as a source of the semiconductor device. In the meantime, another epitaxial structure 190b serving as a drain of the semiconductor device is covered by the isolation layer 320, the second ILD 285, and the second CESL 280. In some embodiments, a photoresist layer is formed above the isolation layer 320, and the photoresist layer is patterned to expose a portion of the isolation layer 320 right above the epitaxial structure 190a, and the opening 322 is formed by using the patterned photoresist layer as a mask. After forming the opening 322, the patterned photoresist layer is removed by using ashing or etching processes.

It is noted that after the substrate 110 and the isolation structure 140 are removed as shown in FIG. 11, the wafer may suffer warpage or roughness issues inducing overlay control difficulty in a lithography process. For example, the opening 322 may expose portions of the backside dielectric caps 310. Without the backside dielectric caps 310, the etchant for forming the opening 322 may damage the gate structures 230. In FIGS. 16A-16C, the isolation layer 320 and the second ILD 285 are removed or etched using an etchant, e.g., $CF_4$, $SF_6$, $CH_2F_2$, $CHF_3$, $C_2F_6$, combinations thereof, or the like, that can selectively etch the isolation layer 320 and the second ILD 285 at a faster etching rate than etching the backside dielectric caps 310. Stated in another way, the backside dielectric caps 310 have a material different from that of the isolation layer 320 and the second ILD 285. As such, the backside dielectric caps 310 protect the gate structures 230 during etching the isolation layer 320 and the second ILD 285, and the overlay window for forming the opening 322 can be enlarged.

Figure 17A:
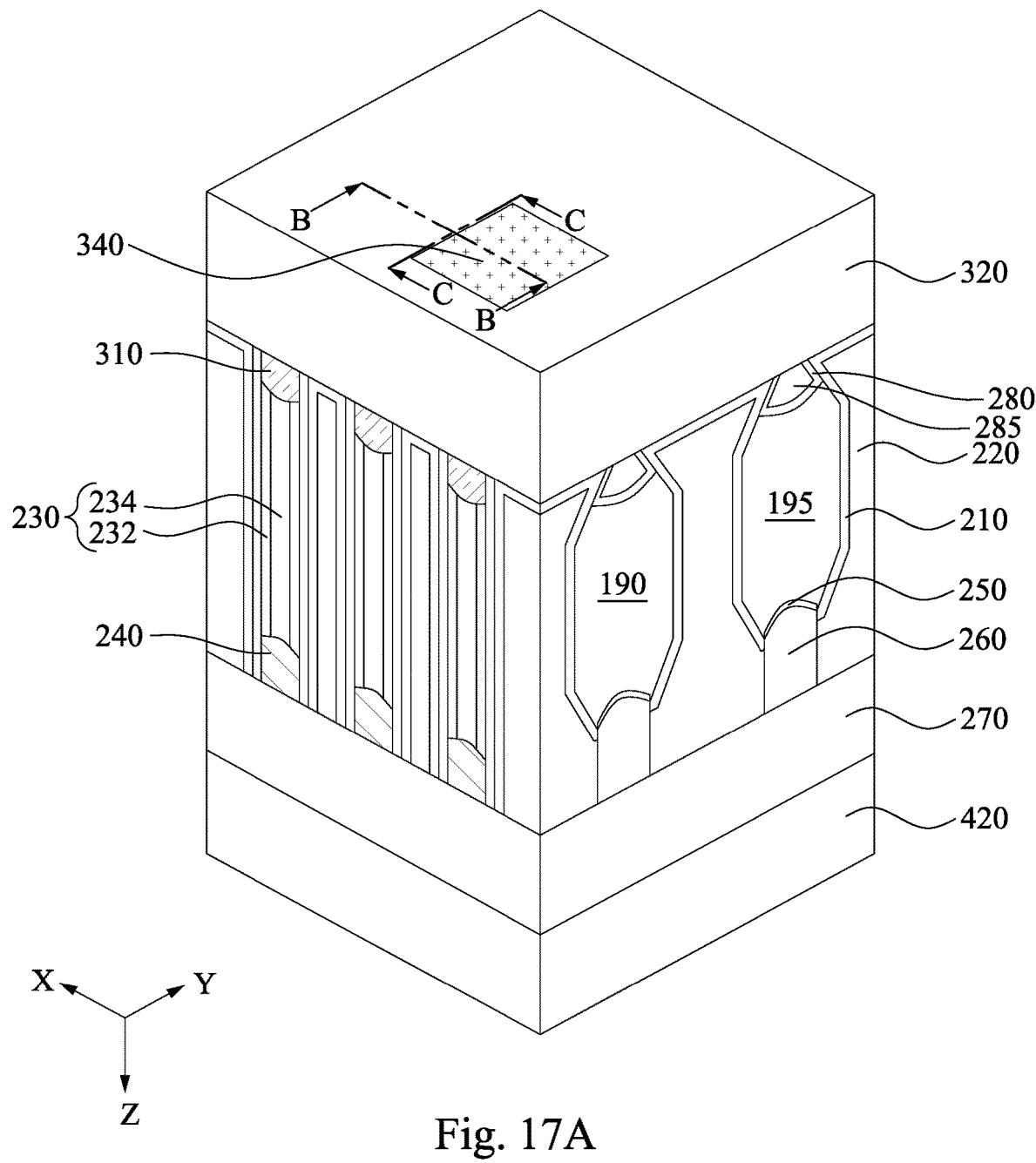
Figure 17B:
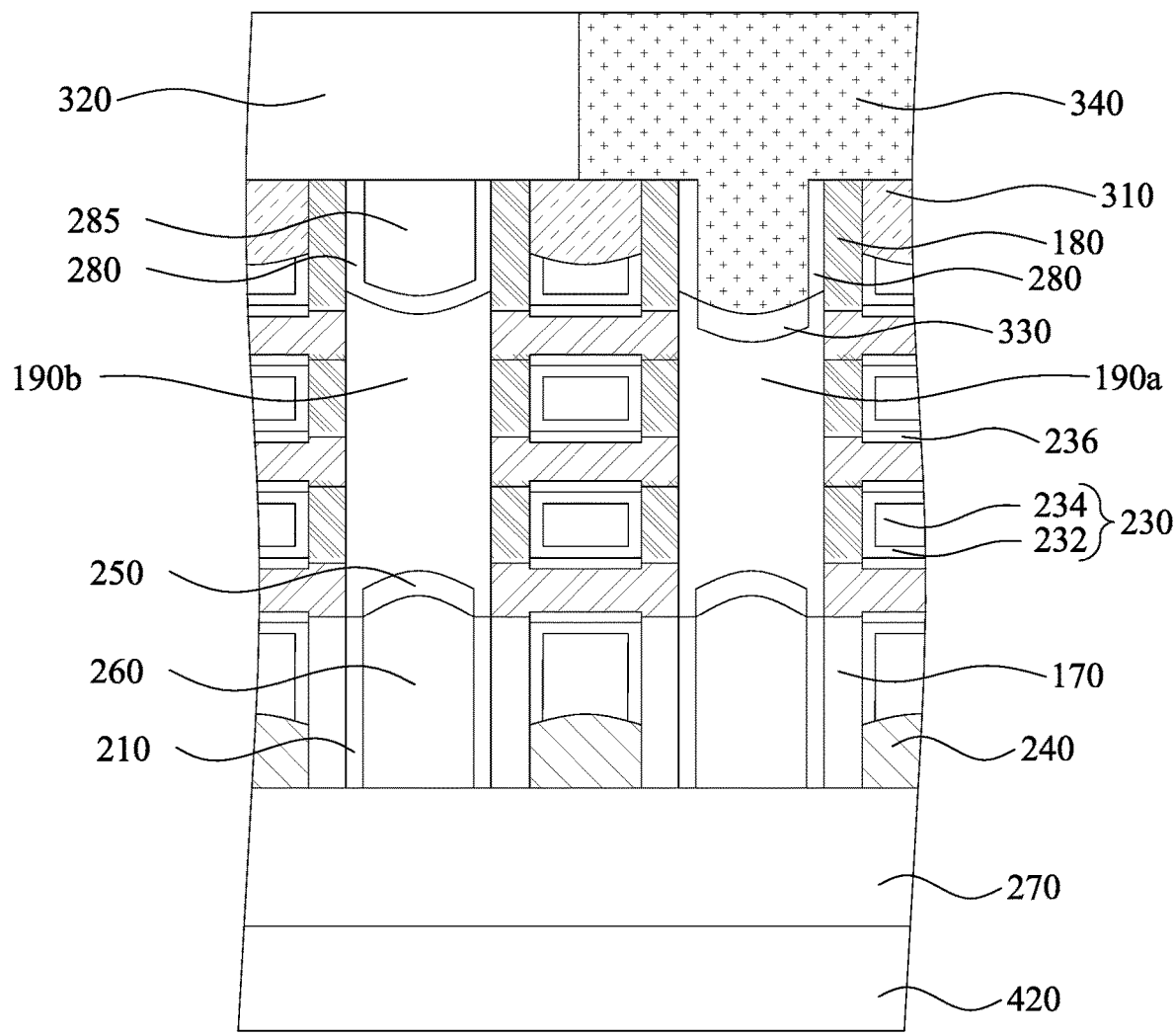
Figure 17C:
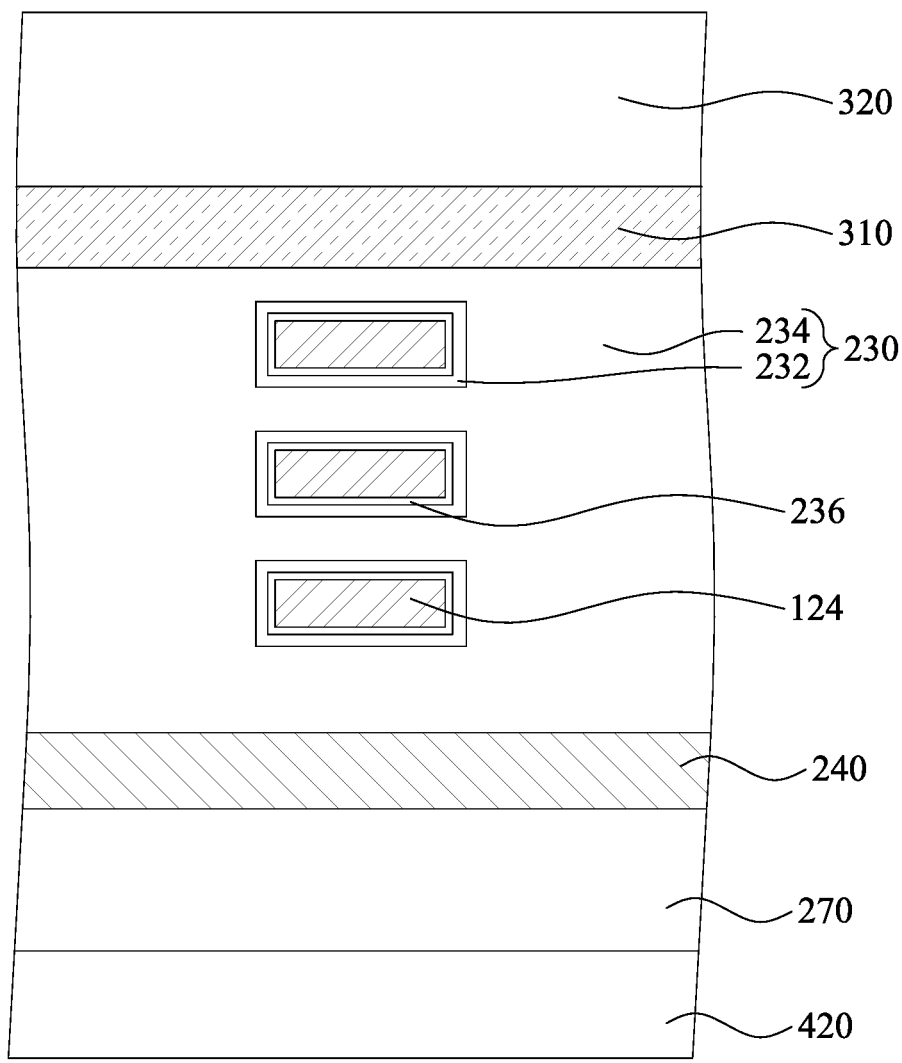

Reference is made to FIGS. 17A-17C, where FIG. 17B is a cross-sectional view taken along line B-B of FIG. 17A, and FIG. 17C is a cross-sectional view taken along line C-C of FIG. 17A. At least one backside metal alloy layer 330 is formed above the epitaxial structure 190a. The backside metal alloy layer 330, which may be silicide layers, are formed in the opening 322 (see FIGS. 16A-16B) and over the exposed epitaxial structure 190a by a self-aligned silicide (salicide) process. The backside metal alloy layer 330 and the front-side metal alloy layer 250 may have the same or similar materials. For example, the backside metal alloy layer 330 may include a material selected from titanium silicide, cobalt silicide, nickel silicide, platinum silicide, nickel platinum silicide, erbium silicide, palladium silicide, combinations thereof, or other suitable materials. In some embodiments, the backside metal alloy layer 330 may include germanium.

A backside via 340 is then formed in the opening 322 (see FIGS. 16A-16B) and above the backside metal alloy layer 330. As such, the backside via 340 is electrically connected to the epitaxial structure 190a. In some embodiments, the backside via 340 may be made of metal, such as W, Co, Ru, Al, Cu, or other suitable materials. After the deposition of the backside via 340, a planarization process, such as a chemical mechanical planarization (CMP) process, may be then performed. In some embodiments, a barrier layer may be formed in the opening 322 before the formation of the backside via 340. The barrier layer may be made of TiN, TaN, or combinations thereof.

Figure 18A:
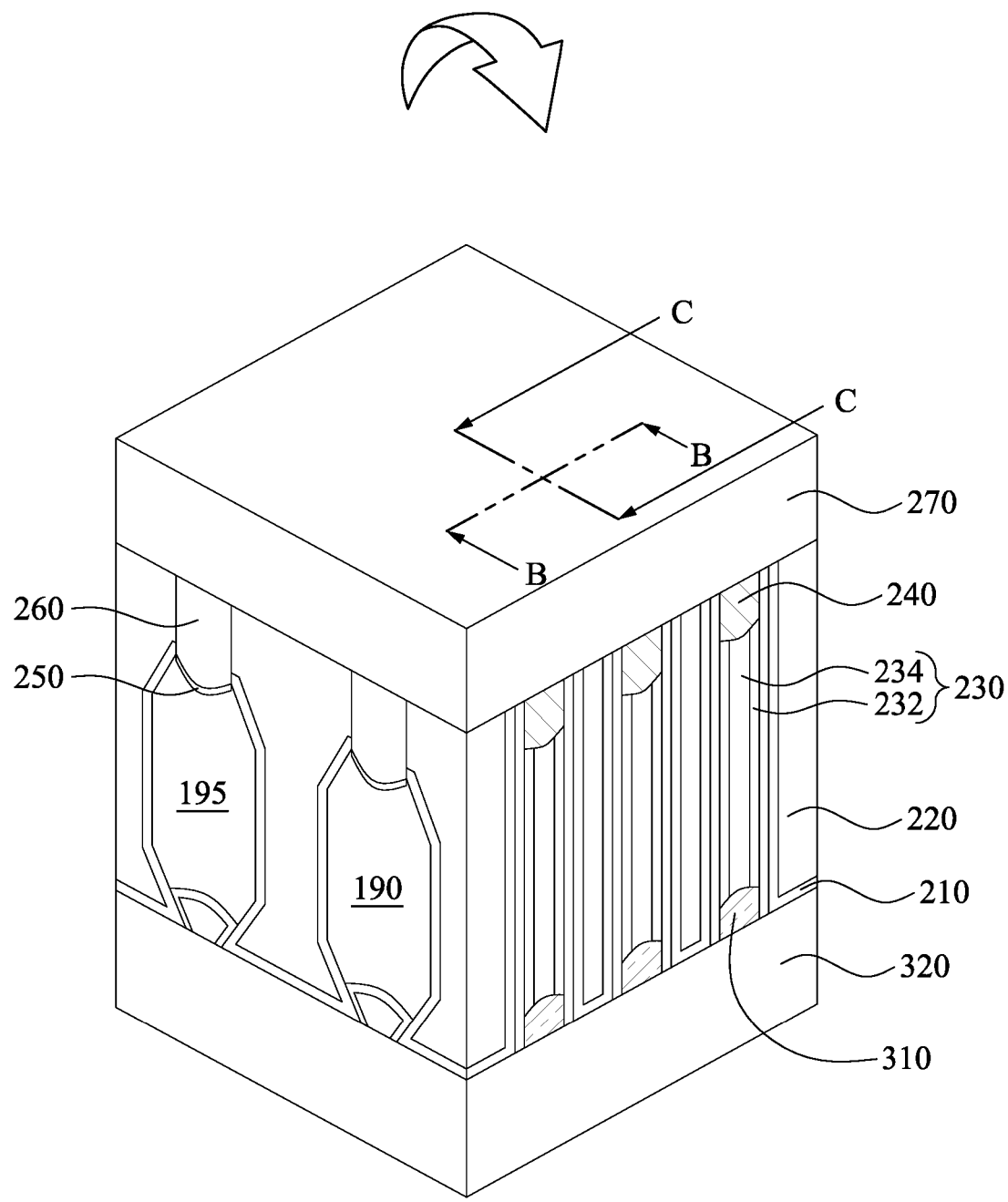
Figure 18B:
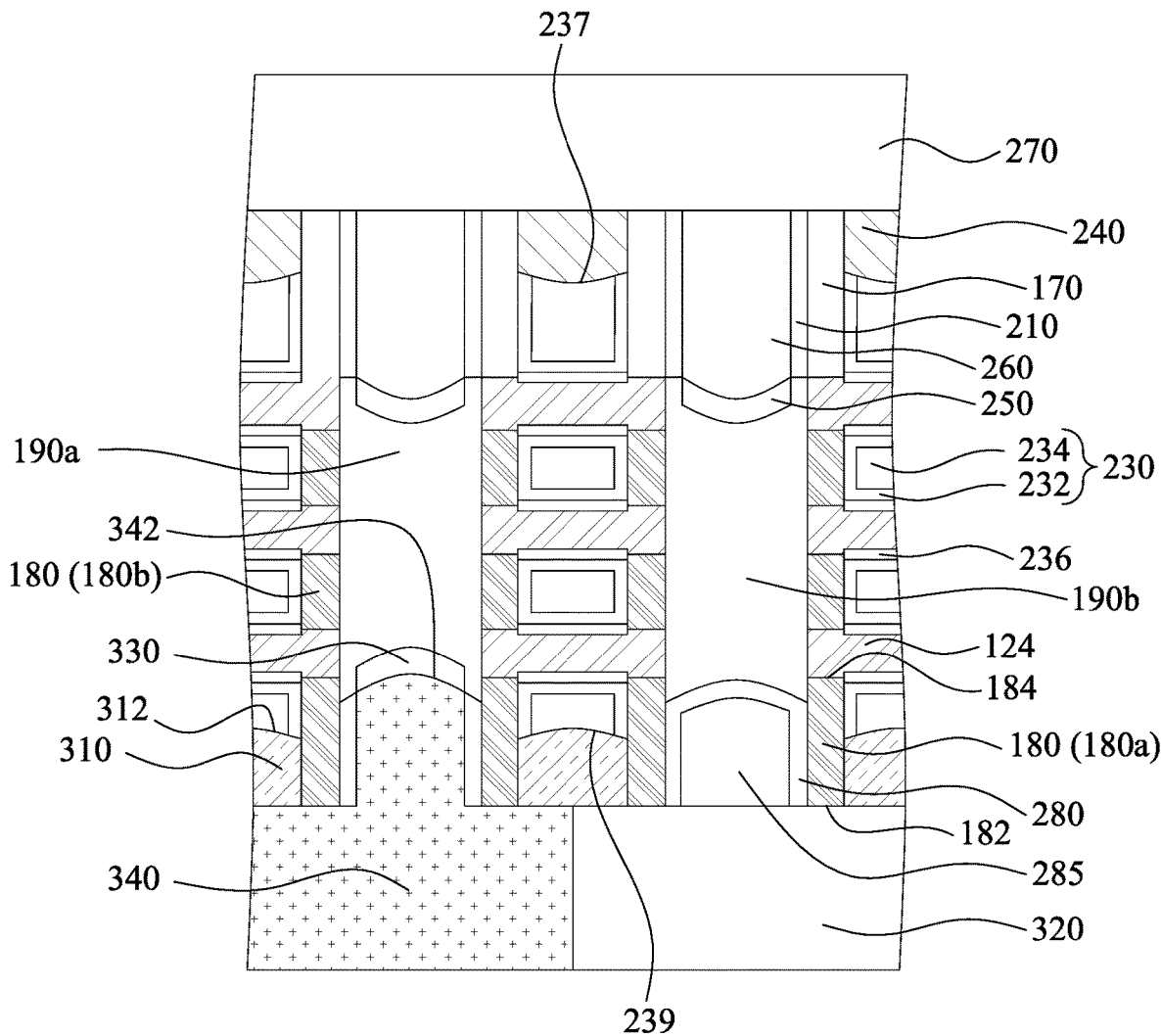
Figure 18C:
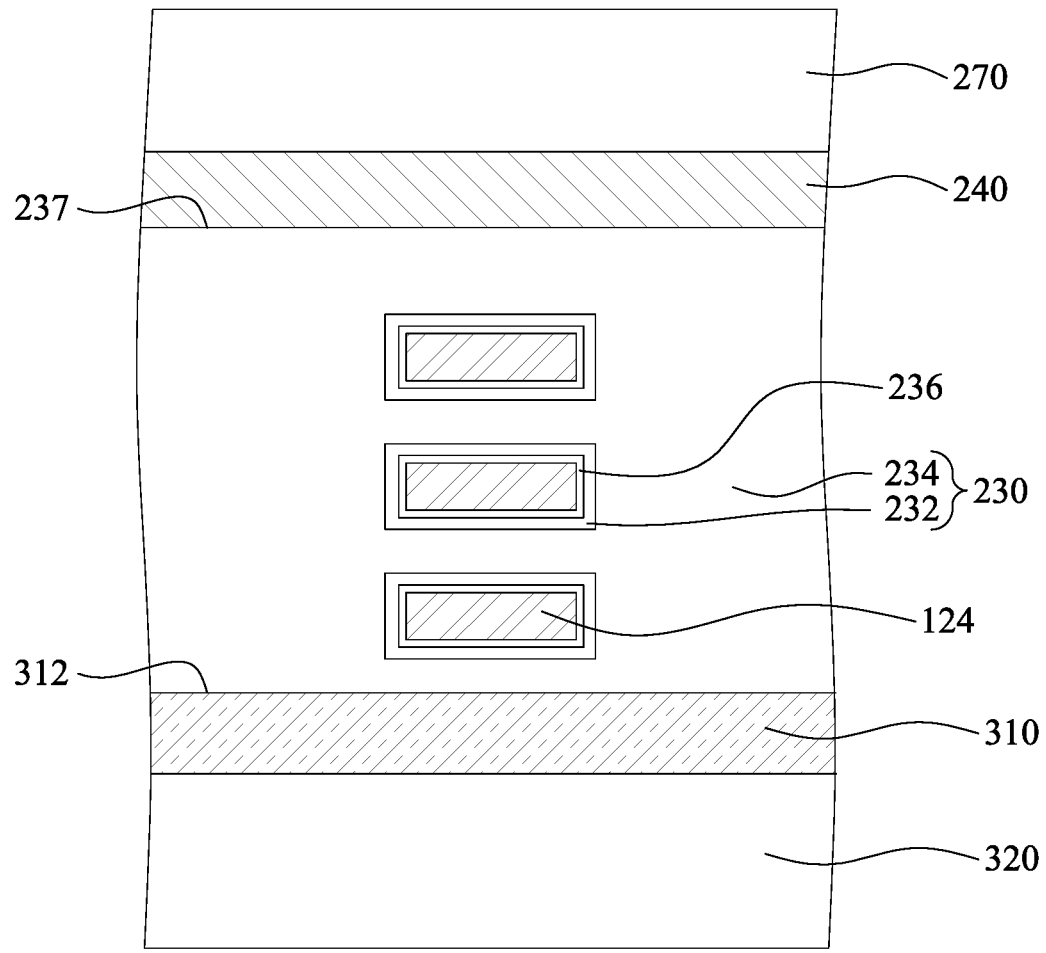

Reference is made to FIGS. 18A-18C, where FIG. 18B is a cross-sectional view taken along line B-B of FIG. 18A, and FIG. 18C is a cross-sectional view taken along line C-C of FIG. 18A. The carrier substrate 420 (see FIGS. 17A-17C) is removed from the MLI 270, and the structure is "flipped" upside down again. As such, a semiconductor device is formed.

In FIGS. 18A-18C, the semiconductor device includes the second semiconductor layers 124 as channels of the semiconductor device. The gate structures 230 surround or wrap around the second semiconductor layers 124. The semiconductor device further includes S/D epitaxial structures 190 and 195 as sources and/or drains of the semiconductor device. The S/D epitaxial structures 190 and 195 are electrically connected to the second semiconductor layers 124. The S/D epitaxial structures 190 and 195 can be connected to external circuits from a front side of the semiconductor device through the contacts 260. Some of the S/D epitaxial structures 190 and 195, e.g., the epitaxial structure 190a, can be further connected to external circuits from a backside of the semiconductor device through the backside via 340.

As shown in FIG. 18B, a portion of the backside via 340 is directly under the gate structures 230, such that a current leakage problem may occur between the backside via 340 and the corresponding gate structures 230. The semiconductor device thus further includes backside dielectric caps 310 under the gate structures 230. The backside dielectric cap 310 is between the gate structure 230 and the backside via 340, providing good isolation between the gate structure 230 and the backside via 340.

In some embodiments, the backside dielectric cap 310 is in direct contact with the gate structure 230 and the backside via 340, or the gate structure 230 and the backside via 340 are on opposite sides of the backside dielectric cap 310. In some embodiments, the backside dielectric cap 310 has a width substantially the same as that of the gate structure 230. In some embodiments, the backside dielectric cap 310 is spaced apart from the second semiconductor layers 124 (i.e., the channels). In some embodiments, a portion of the gate electrode 234 of the gate structure 230 is (sandwiched) between the backside dielectric cap 310 and the bottommost second semiconductor layer 124. In some embodiments, a top surface 342 of the backside via 340 is higher than a top surface 312 of the backside dielectric cap 310 (i.e., a bottom surface 239 of the gate structure 230). Moreover, both the top surface 342 and 312 are convex. That is, the bottom surface 239 of the gate structure 230 is concave. Further, the backside dielectric cap 310 is in direct contact with gate spacers 170 as shown in FIG. 14A. The gate spacers 170 are also in direct contact with the inner spacers 180a and 180b and the gate structures 230.

The semiconductor device further includes the inner spacers 180 between the epitaxial structures 190 (195) and the gate structures 230 to isolate the gate structures 230 and the epitaxial structures 190 (195). The bottommost inner spacer 180a is thicker (in the Z direction) than the other inner spacers 180b higher than the bottommost inner spacer 180a. The bottommost inner spacer 180a is in direct contact with the gate structure 230, the backside dielectric cap 310, and the backside via 340. Topmost surfaces 184 of the bottommost inner spacers 180a are lower than topmost surfaces 237 of the gate structures 230.

The semiconductor device further includes the isolation layer 320 under the gate structures 230 and the backside dielectric caps 310. The isolation layer 320 may be in direct contact with the backside dielectric caps 310, the bottommost inner spacers 180a, and the gate spacers 170, such that the isolation layer 320 is spaced apart from the gate structures 230. Bottom surfaces 182 of the bottommost inner spacers 180a and bottommost surfaces of the gate spacers 170 are both lower than the bottom surfaces 239 of the gate structures 230.

In some embodiments, the semiconductor device further includes front-side dielectric caps 240 above the gate structures 230. That is, the gate structures 230 is (sandwiched) between the front-side dielectric caps 240 and the backside dielectric cap 310. The front-side dielectric caps 240 are spaced apart from the bottommost inner spacers 180a but in direct contact with the gate spacers 170.

Figure 19A:
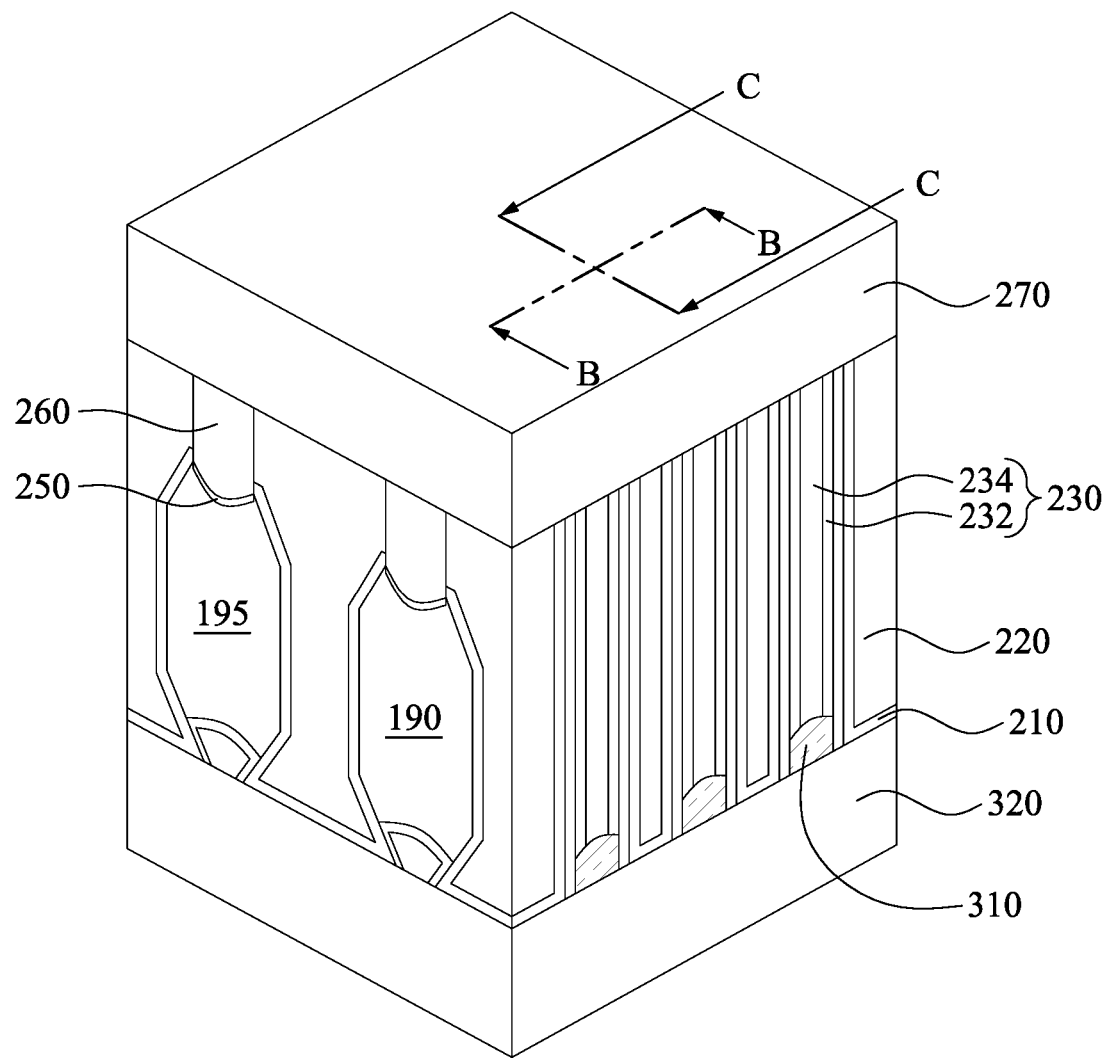
FIG. 19A is a perspective view of a semiconductor device in accordance with some embodiments of the present disclosure.
Figure 19B:
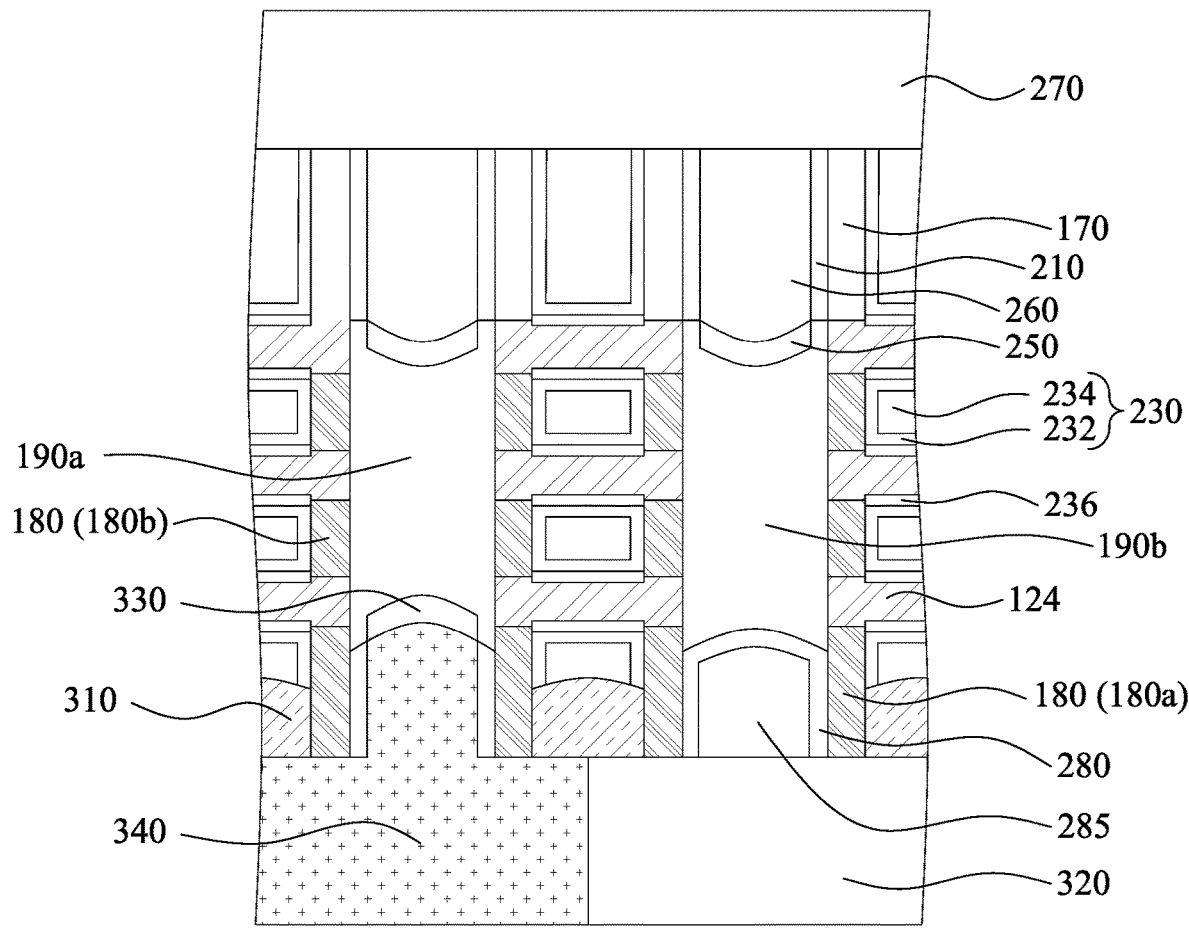
FIG. 19B is a cross-sectional view taken along line B-B of FIG. 19A.
Figure 19C:
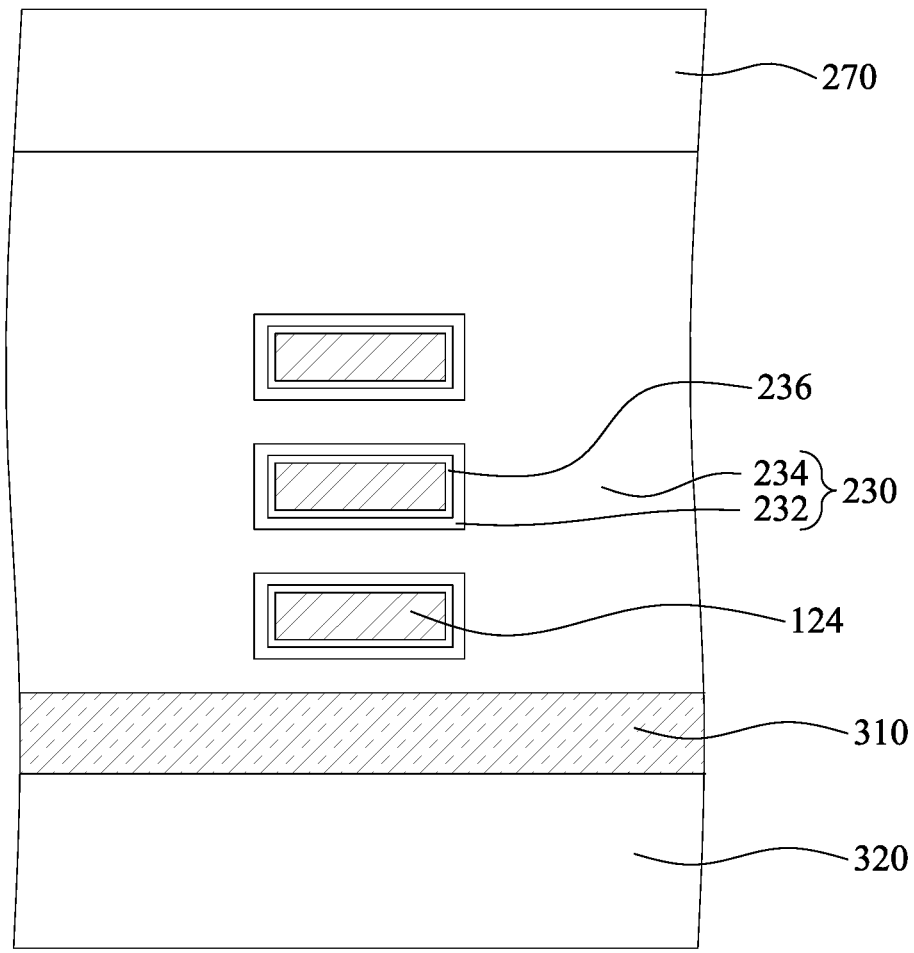
FIG. 19C is a cross-sectional view taken along line C-C of FIG. 19A.

FIG. 19A is a perspective view of a semiconductor device in accordance with some embodiments of the present disclosure, FIG. 19B is a cross-sectional view taken along line B-B of FIG. 19A, and FIG. 19C is a cross-sectional view taken along line C-C of FIG. 19A. The difference between the semiconductor devices in FIGS. 19A-19C and FIGS. 18A-18C pertains to the presence of the front-side dielectric caps 240. In FIGS. 19A-19C, the front-side dielectric caps 240 are omitted. That is, the operations shown in FIGS. 9A-9C are omitted. As such, a top surface of the gate structure 230 is substantially coplanar with a top surface of the gate spacers 170. Further, the gate structures 230 are in contact with the MLI 270. Other relevant structural details of the semiconductor device in FIGS. 19A-19C are all the same as or similar to the semiconductor device in FIGS. 18A-18C, and, therefore, a description in this regard will not be repeated hereinafter.

FIGS. 20-25C illustrate a method for manufacturing a semiconductor device at various stages in accordance with some embodiments of the present disclosure. In addition to the semiconductor device, FIGS. 20-25C depict X-axis, Y-axis, and Z-axis directions. In some embodiments, the semiconductor device shown in FIGS. 20-25C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 20:
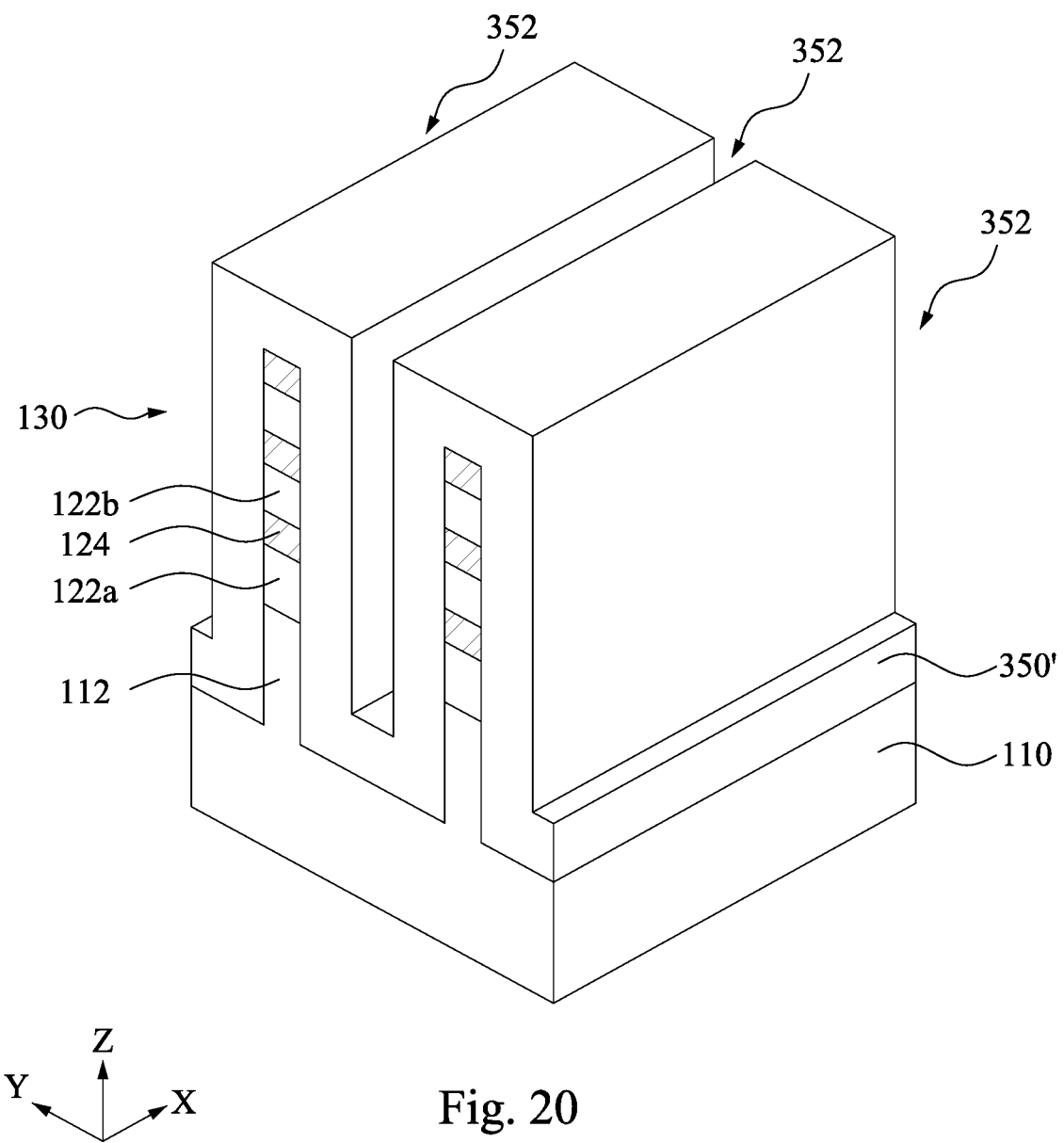
FIGS. 20-25C illustrate a method for manufacturing a semiconductor device at various stages in accordance with some embodiments of the present disclosure.

Reference is made to FIG. 20. A substrate 110 is provided. Materials, configurations, dimensions, processes and/or operations regarding the substrate 110 are similar to or the same as the substrate 110 of FIG. 1. Fin structures 130 are then formed above the substrate 110. Each of the fin structures 130 includes first semiconductor layers 122a, 122b and the second semiconductor layers 124. Materials, configurations, dimensions, processes and/or operations regarding the fin structures 130 are similar to or the same as the fin structures 130 of FIG. 2.

Spacing layer material 350' is deposited on the exposed sidewalls and top surfaces of the fin structures 130. In some embodiments, the spacing layer material 350' can be made of dielectric materials. In some embodiments, the spacing layer material 350' may be made of a dielectric material such as, for example, spin-on-glass, silicon nitride, silicon oxynitride, FSG, a low-k dielectric material, and/or other suitable insulating material. In some embodiments, the spacing layer material 350' is deposited by an ALD process. In some embodiments, the deposition of the spacing layer material 350' can be done by suitable processes such as, for example, plasma-enhanced ALD (PEALD), CVD, PVD, molecular beam epitaxy (MBE), high density plasma CVD (HDPCVD), metal organic (MOCVD), remote plasma CVD (RPCVD), PECVD, other suitable methods, and/or combinations thereof. The spacing layer material 350' can be deposited between the fin structures 130 to form openings 352, in accordance with some embodiments. By choosing suitable processing deposition parameters, the openings 352 may be configured to create spaces for the subsequent deposition of self-aligned isolation fins.

Figure 21:
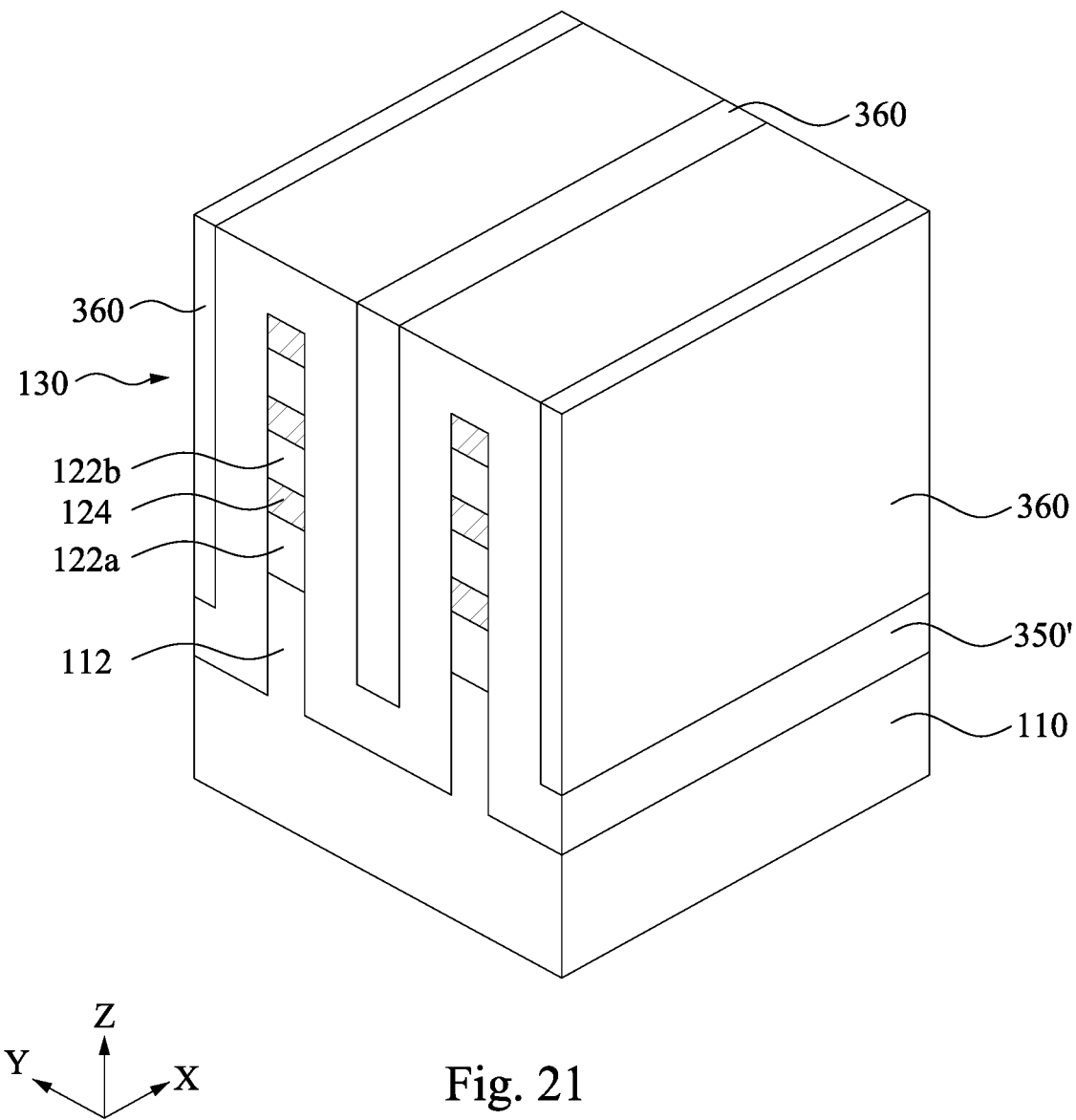

Reference is made to FIG. 21. Self-aligned isolation fins 360 are then formed in the openings 352 (see FIG. 20). In some embodiments, forming the self-aligned isolation fins 360 includes filling the openings 352 with a dielectric fin material. In some embodiments, filling of the openings 352 may be performed by an ALD process. In some embodiments, the openings 352 may be filled by suitable processes such as, for example, ALD, CVD, FCVD, PVD, MBE, HDPCVD, MOCVD, RPCVD, PECVD, other suitable methods, and/or combinations thereof. In some embodiments, the dielectric fin material may be deposited using an FCVD process followed by a subsequent ultra-violet (UV) curing and annealing process. In some embodiments, in-situ doping of carbon and/or nitrogen can be performed to cure or solidify the dielectric fin material during the FCVD process. In some embodiments, the dielectric fin material includes silicon oxynitride (SiON), silicon carbon nitride (SiCN), silicon oxygen carbon nitride (SiOCN), or metal oxides such as, for example, hafnium oxide ($HfO_2$), zirconium oxide ($ZrO_2$), aluminum oxide ($Al_2O_3$), other suitable metal oxides, and/or combinations thereof. In some embodiments, forming the self-aligned isolation fins 360 further includes performing a planarization step (e.g., a CMP step) to remove the excess dielectric materials on the upper surfaces of spacing layer material 350', so that the upper surfaces of the self-aligned isolation fins 360 and the upper surface of spacing layer material 350' are substantially coplanar. The deposition of dielectric fin material forms the self-aligned isolation fins 360 in the openings 352. The self-aligned isolation fins 360 are formed between the fin structures 130. As the openings 352 are defined and formed prior to the deposition of dielectric fin material, no alignment process is needed when the dielectric fin material fills in the exposed openings 352.

Figure 22:
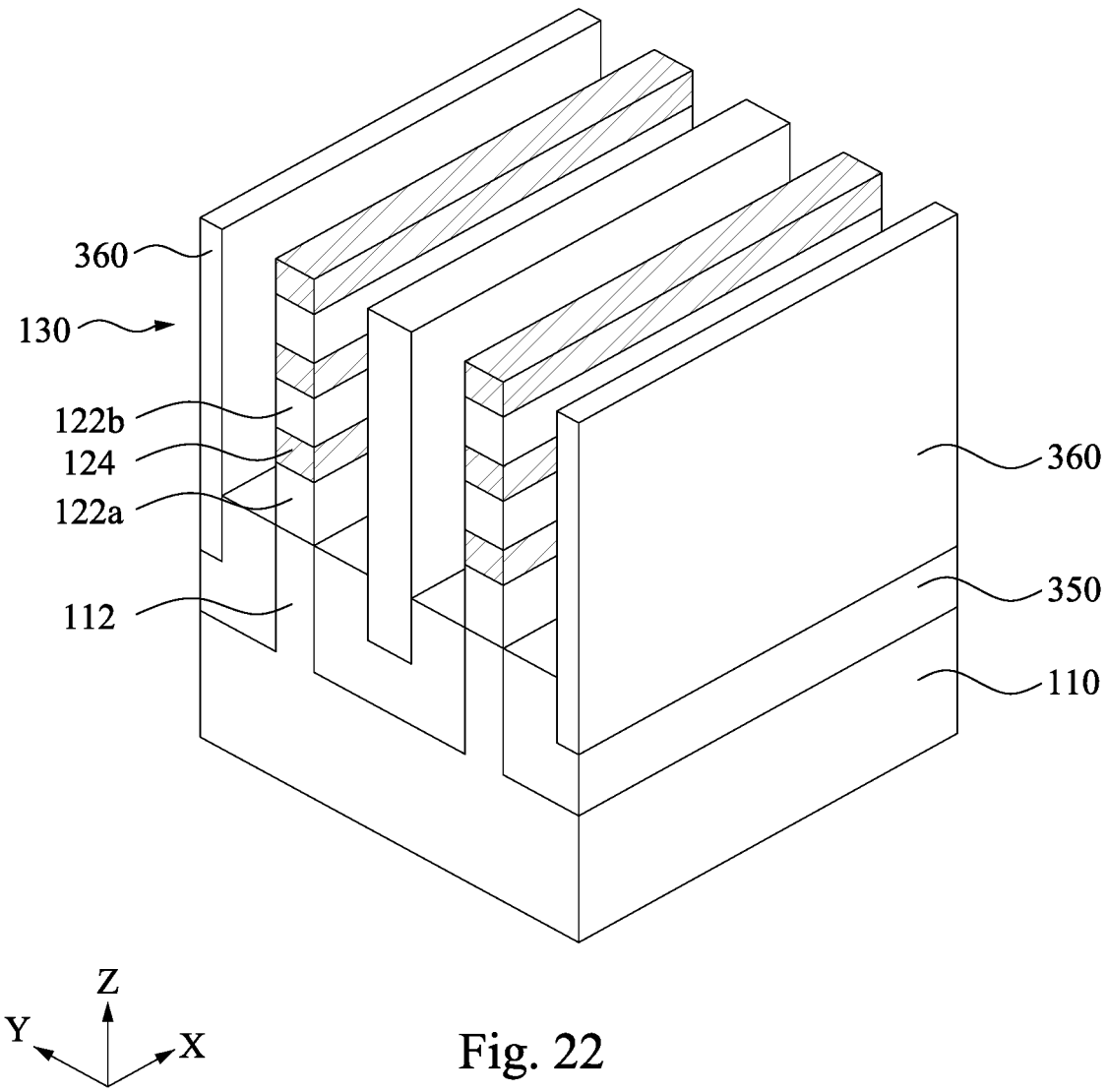

Reference is made to FIG. 22. A planarization process, e.g., a CMP process, is performed on the structure of FIG. 21 to expose the fin structures 130. The spacing layer material 350' (see FIG. 21) is then etched back such that portions of the fin structures 130 and the self-aligned isolation fins 360 protrude from the remaining portions of the spacing layer material 350'. The remaining portions of spacing layer material 350' forms spacing layer 350. The spacing layer 350 can be achieved by suitable methods such as, for example, an etch process that has suitable etch selectivity between materials of the spacing layer material 350', the fin structures 130, and the self-aligned isolation fin 360. For example, the etch process can have a higher etch rate of the spacing layer material 350' than the etch rate of the fin structures 130 and/or the self-aligned isolation fin 360. In some embodiments, etching rate difference be achieved by adjusting suitable parameters of the etch process such as, for example, etchant gas type, gas flow rate, etching temperature, plasma power, chamber pressure, other suitable parameters, and/or combinations thereof.

Figure 23A:
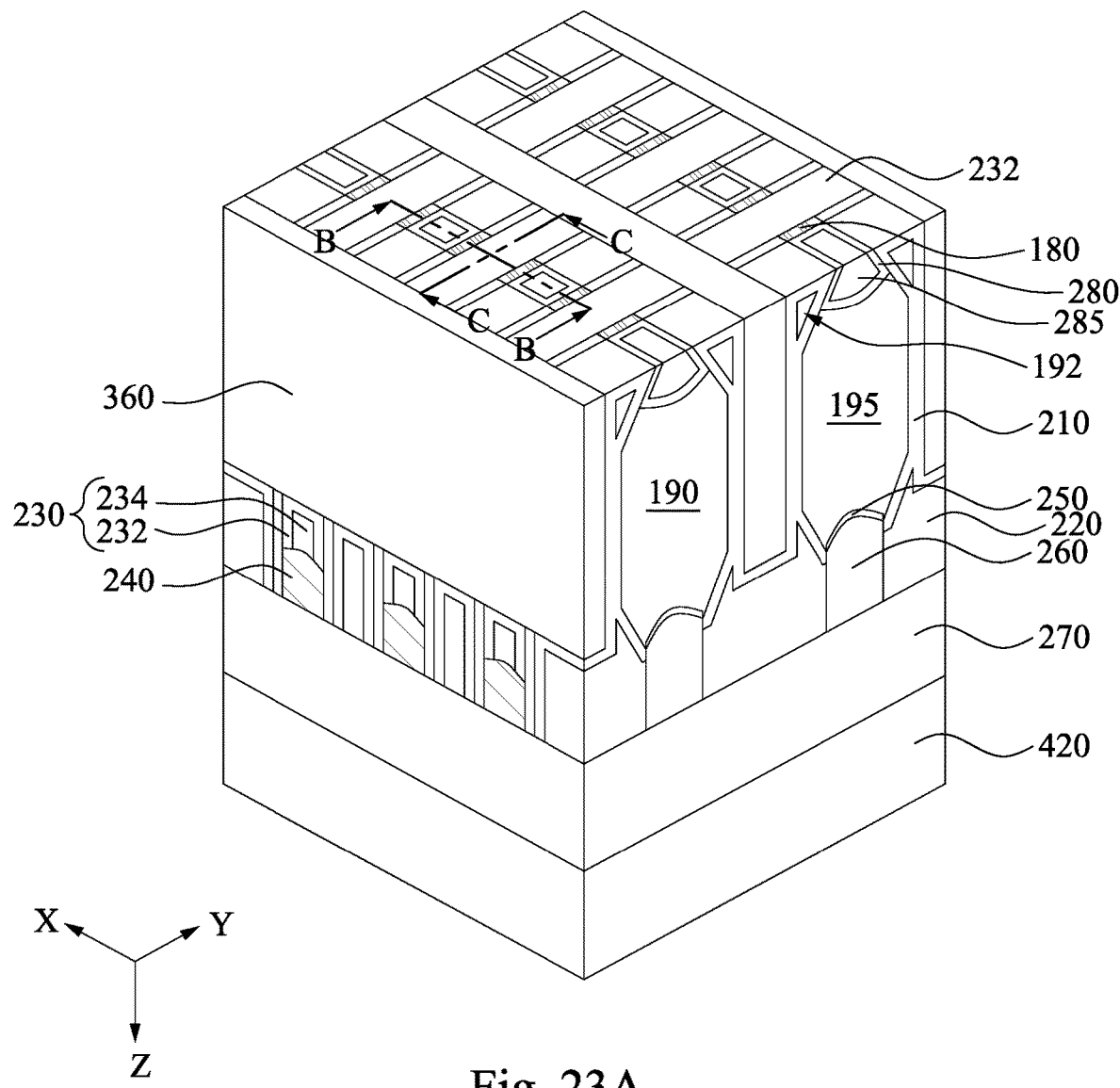
Figure 23B:
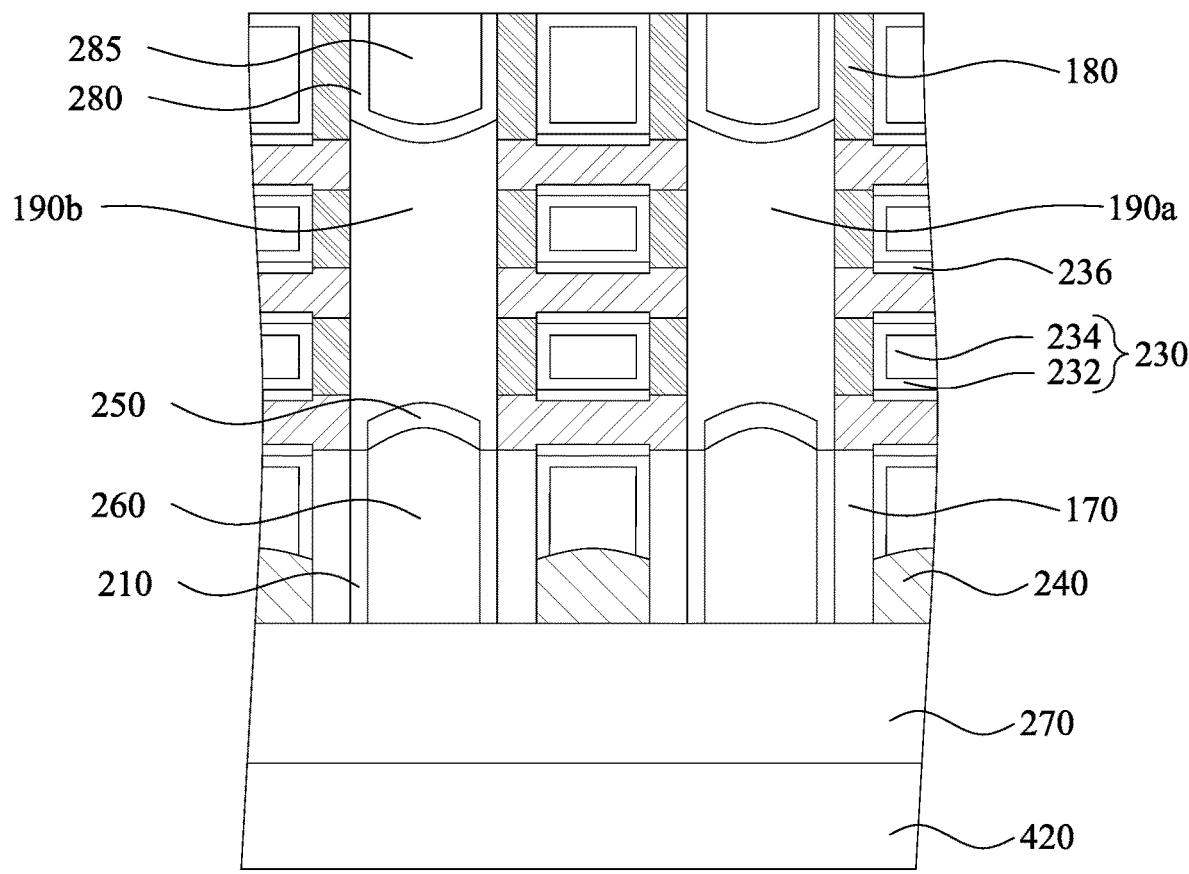
Figure 23C:
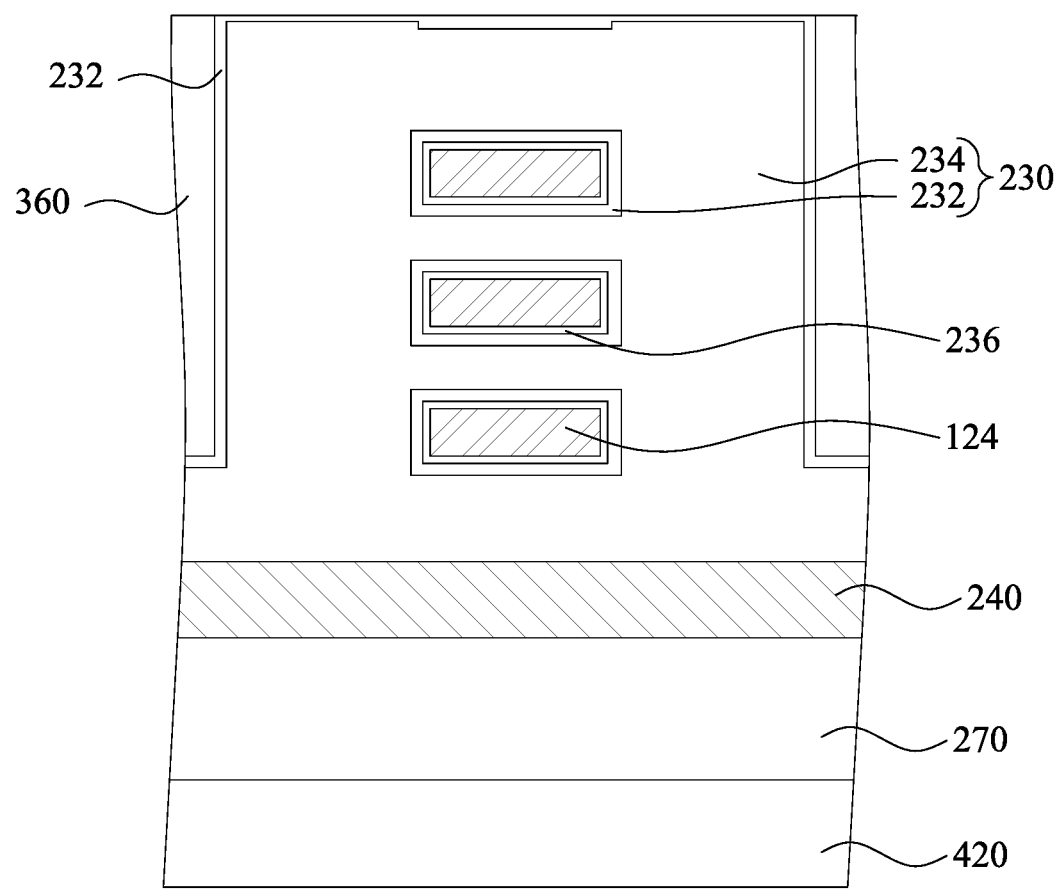

Reference is made to FIGS. 23A-23C, where FIG. 23B is a cross-sectional view taken along line B-B of FIG. 23A, and FIG. 23C is a cross-sectional view taken along line C-C of FIG. 23A. Subsequently, similar to FIGS. 4-12C, a sacrificial gate dielectric layer is conformally formed above the structure of FIG. 22. At least one dummy gate structure is then formed above the sacrificial gate dielectric layer. Gate spacers are then formed on opposite sidewalls of the dummy gate structure. The exposed portions of the fin structures 130 (see FIG. 22) are removed. The first semiconductor layers 122a and 122b (see FIG. 22) are horizontally recessed. Inner spacers 180 are respectively formed on sidewalls of the semiconductor layers 122a and 122b. Source/drain (S/D) epitaxial structures 190 and 195 are epitaxially grown from the base portions 112 of the substrate 110 (see FIG. 22). A first CESL 210 is conformally formed over the self-aligned isolation fin 360 and the S/D epitaxial structures 190 and 195. In some embodiments, air gaps 192 are defined by the first CESL 210 and formed under the S/D epitaxial structures 190 and 195. A first ILD 220 is then formed on the first CESL 210. The dummy gate layer, the sacrificial gate dielectric layer, and the first semiconductor layers 122a, 122b are then replaced with a gate structure 230 including a gate dielectric layer 232 and a gate electrode 234. In some embodiments, interfacial layers 236 are optionally formed to surround exposed surfaces of the second semiconductor layers 124 and exposed surfaces of the base portions of the substrate 110. The gate dielectric layer 232 not only surrounds the second semiconductor layers 124, but is also conformal to sidewalls and top surfaces of the self-aligned isolation fin 360, as shown in FIG. 23C. In some embodiments, the gate structures 230 are recessed, and front-side dielectric caps 240 are formed over respective gate structures 230. In some embodiments, front-side metal alloy layers 250 are respectively formed above the S/D epitaxial structures 190 and 195. Contacts 260 are then formed above the front-side metal alloy layers 250. An MLI 270 including metal layers and inter-metal dielectric (IMD) is formed over the substrate 110 to electrically connect various features or structures (e.g., the contacts 260 and/or the gate structures 230) of the semiconductor device. Subsequently, a carrier substrate 420 is formed above the MLI 270. After the formation of the carrier substrate 420, the whole structure is then "flipped" upside down, and the substrate 110 and the isolation structures 140 are removed, as shown in FIGS. 23A-23C.

Figure 24A:
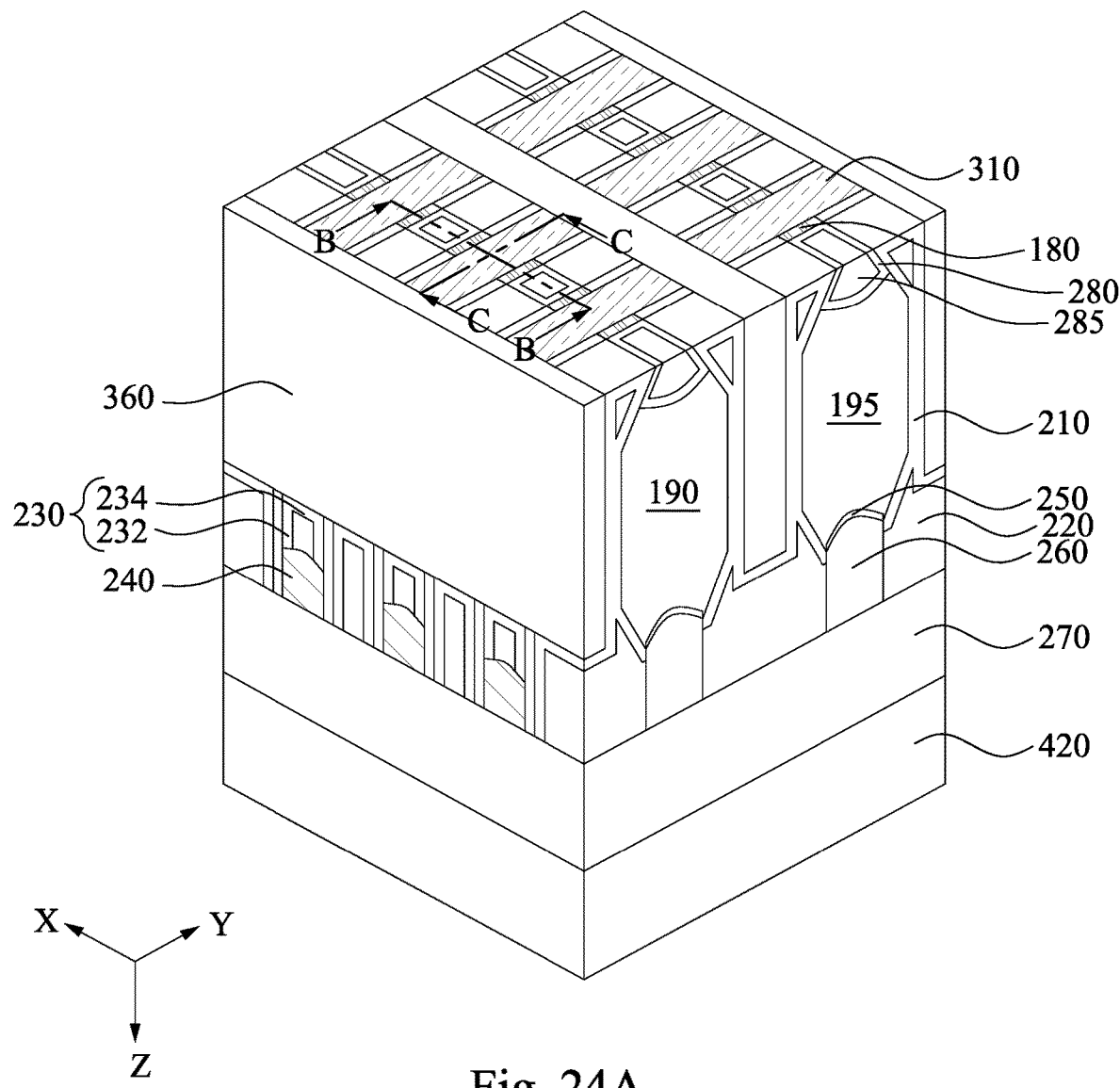
Figure 24B:
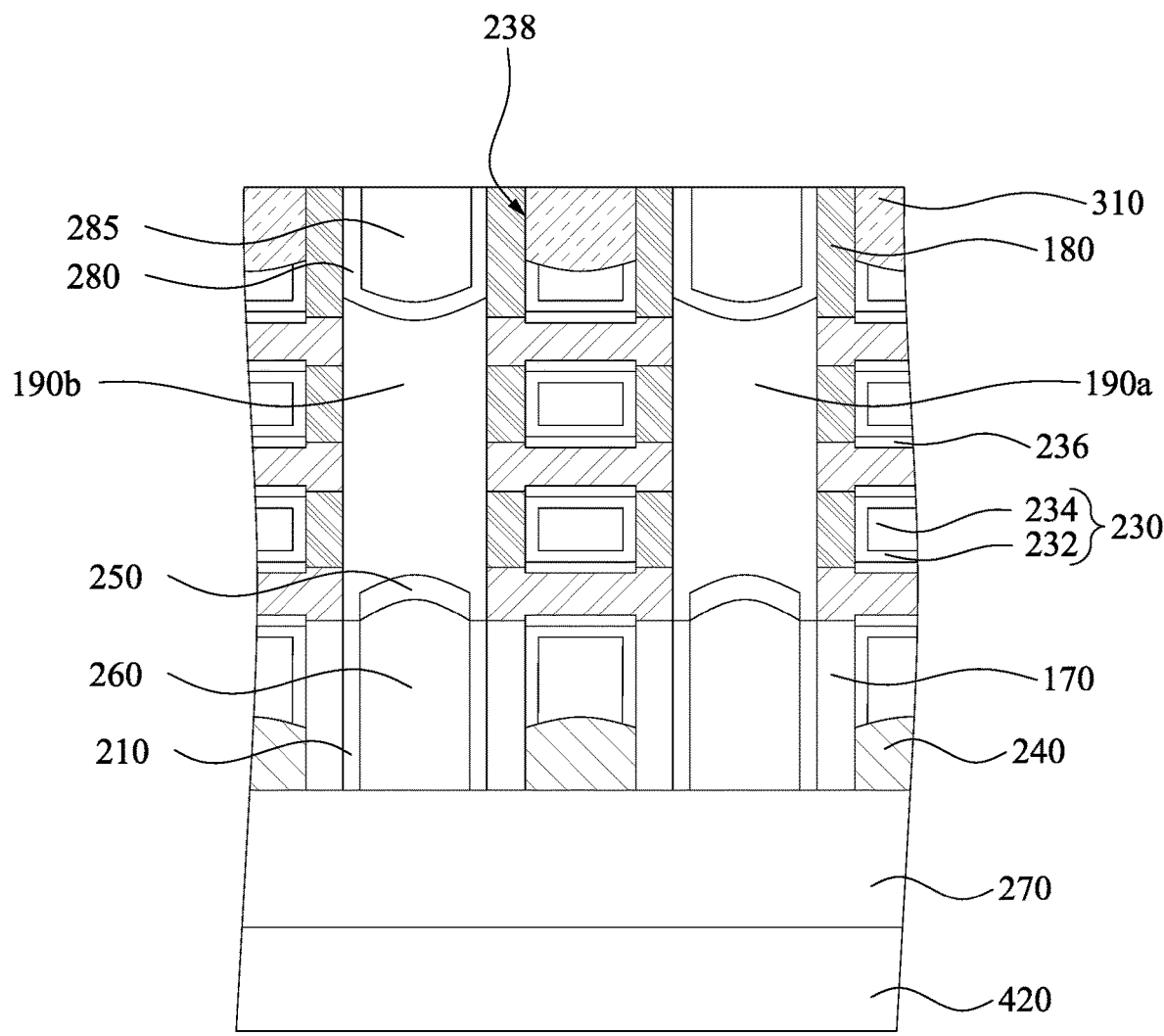
Figure 24C:
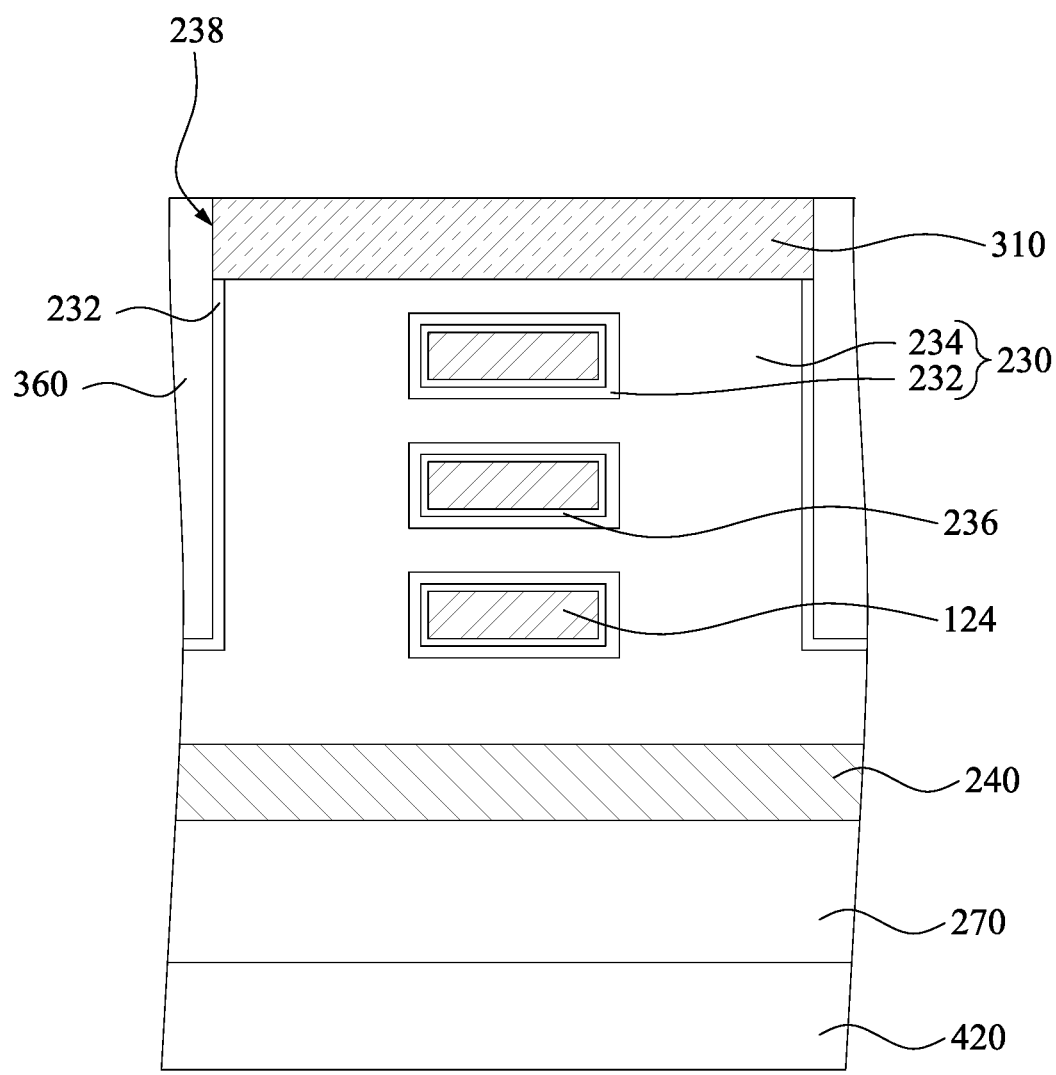

Reference is made to FIGS. 24A-24C, where FIG. 24B is a cross-sectional view taken along line B-B of FIG. 24A, and FIG. 24C is a cross-sectional view taken along line C-C of FIG. 24A. Similar to FIGS. 12A-12C, the epitaxial structures 190 and 195 are recessed, and a second CESL 280 and a second ILD 285 are sequentially formed on the recessed epitaxial structures 190 and 195. Subsequently, an etching process is performed to remove a portion of the gate structure 230 from the backside thereof to form gate trenches 238 with the inner spacers 180, the gate spacers 170, and the self-aligned isolation fins 360 as their sidewalls. Next, backside dielectric caps 310 are formed in the respective gate trenches 238. As such, the backside dielectric caps 310 are in contact with the self-aligned isolation fins 360 as shown in FIGS. 24A and 24C.

Figure 25A:
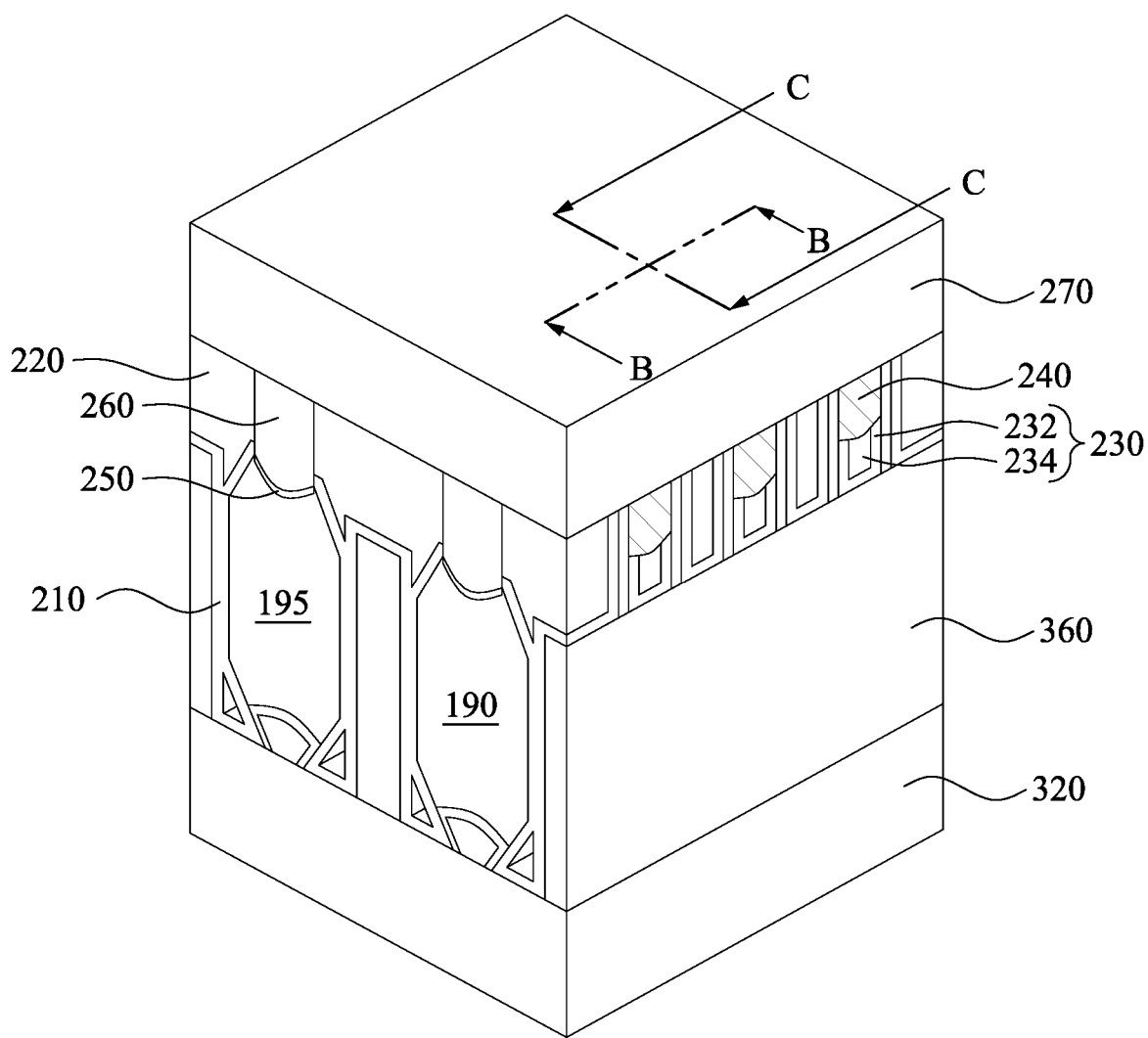
Figure 25A:
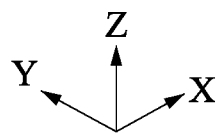
Figure 25B:
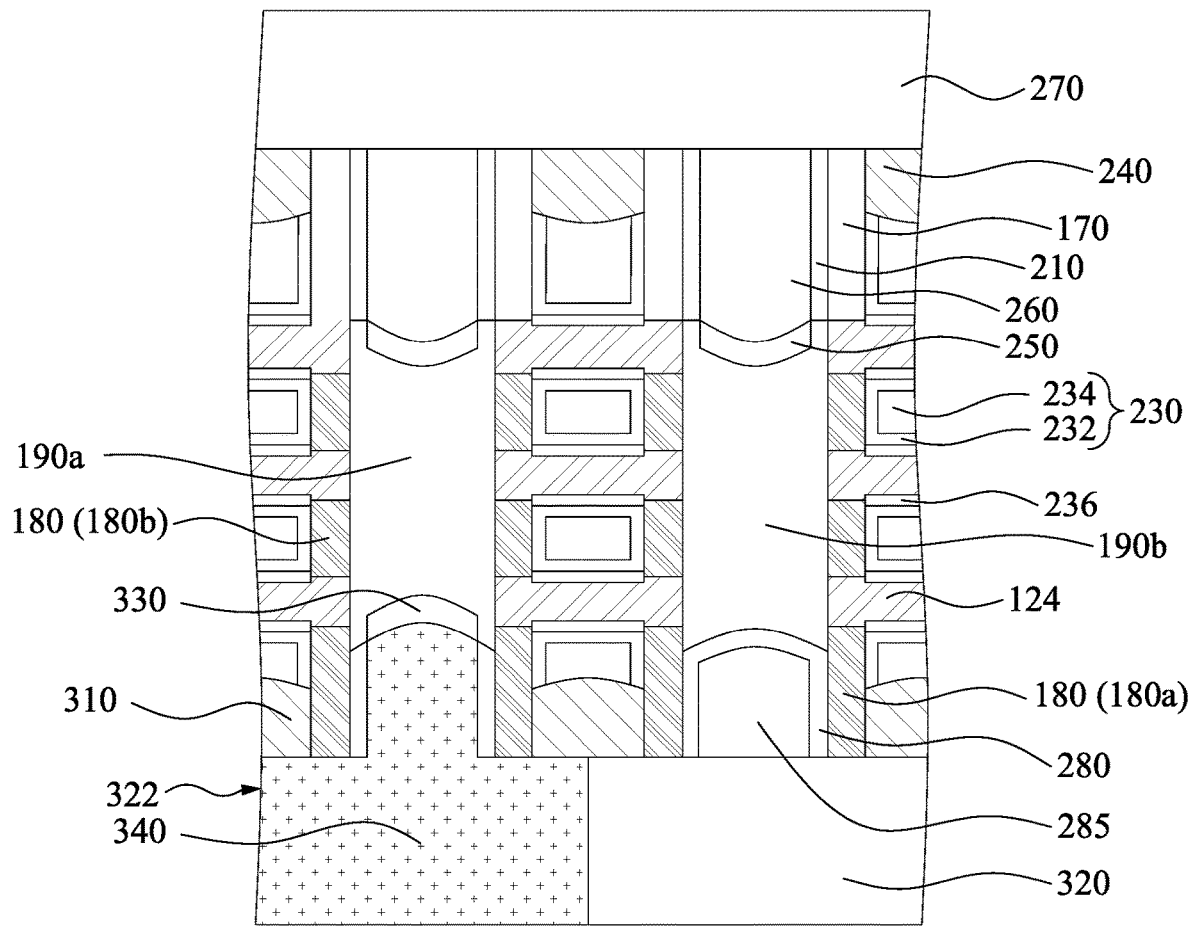
Figure 25C:
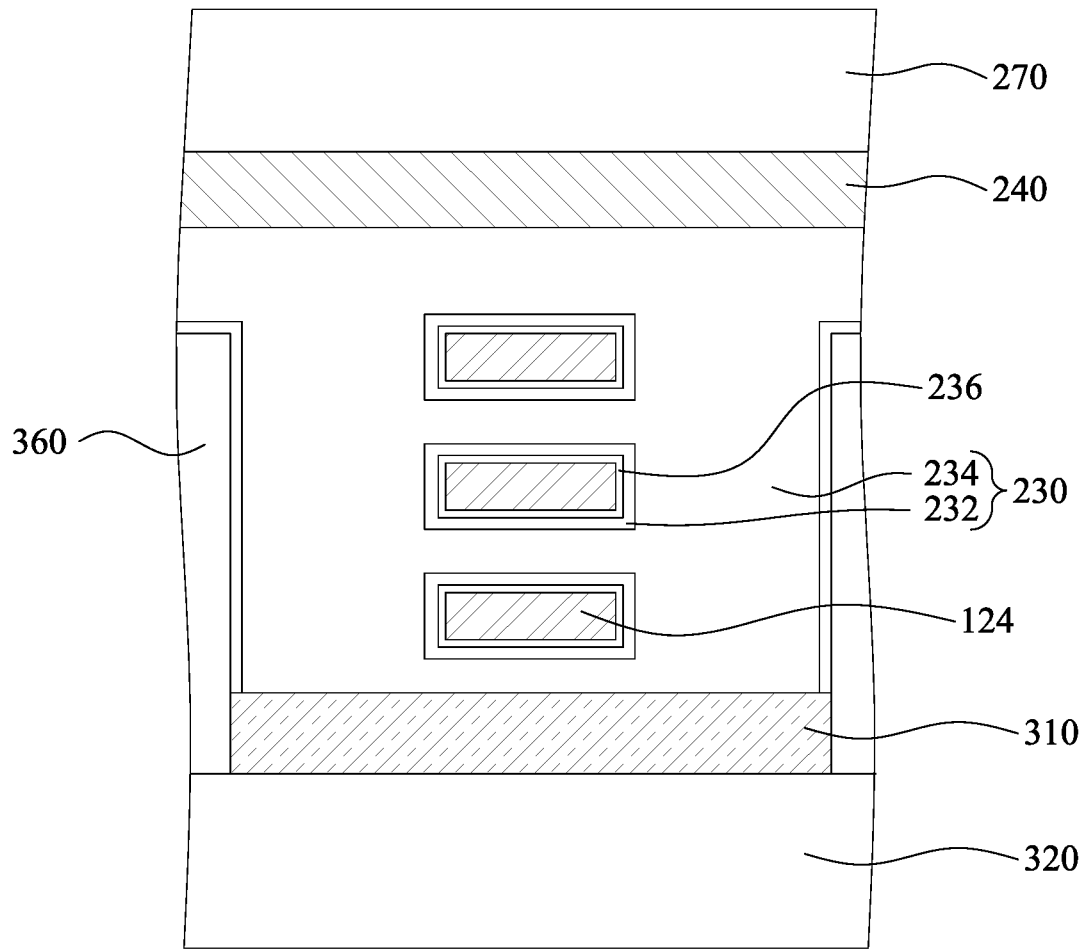

Reference is made to FIGS. 25A-25C, where FIG. 25B is a cross-sectional view taken along line B-B of FIG. 25A, and FIG. 25C is a cross-sectional view taken along line C-C of FIG. 25A. Subsequently, similar to FIGS. 15A-18C, an isolation layer 320 is formed to cover the backside dielectric caps 310. An opening 322 is formed in the isolation layer 320, and a portion of the second ILD 285 exposed by the opening 322 is also removed. At least one backside metal alloy layer 330 is formed above the epitaxial structure 190a. A backside via 340 is then formed in the opening 322 and above the backside metal alloy layer 330. The carrier substrate 420 (see FIGS. 24A-24C) is removed from the MLI 270, and the structure is "flipped" upside down again. As such, a semiconductor device is formed.

Figure 26:
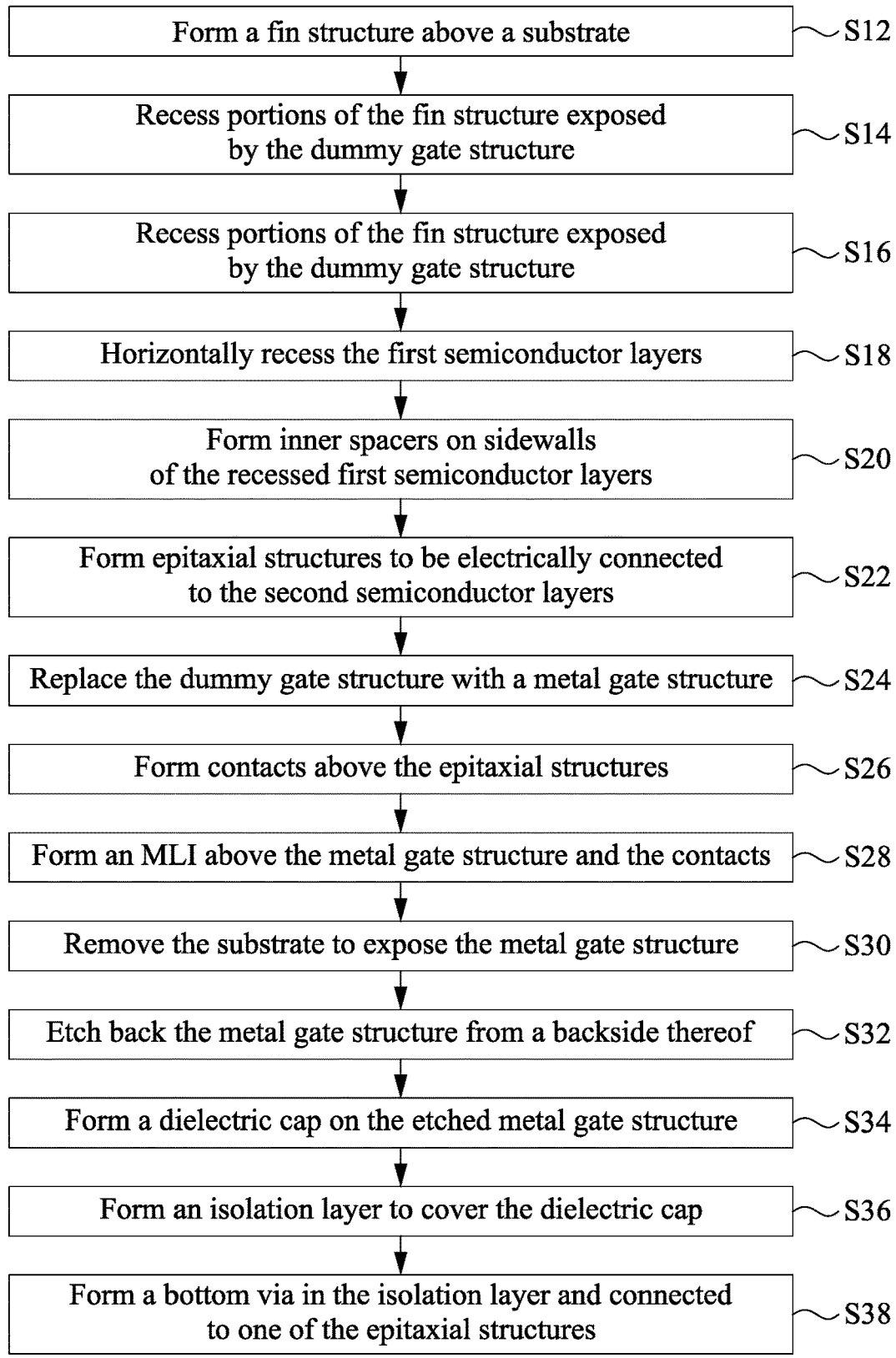
FIG. 26 is a flow chart of a method M for forming a semiconductor device in accordance with some embodiments of the present disclosure.

FIG. 26 is a flow chart of a method M for forming a semiconductor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a fin structure is formed above a substrate. In some embodiments, the fin structure includes first and second semiconductor layers alternately stacked as shown in FIG. 2, and the bottommost first semiconductor layer is thicker than other first semiconductor layers. FIGS. 1-2 illustrate perspective views of some embodiments corresponding to act in block S12. At block S14, at least one dummy gate structure is formed above the fin structure. FIG. 4 illustrates a perspective view of some embodiments corresponding to act in block S14. At block S16, portions of the fin structure exposed by the dummy gate structure is recessed. FIG. 5 illustrates a perspective view of some embodiments corresponding to act in block S16. At block S18, the first semiconductor layers are horizontally recessed. FIG. 5 illustrates a perspective view of some embodiments corresponding to act in block S18. At block S20, inner spacers are formed on sidewalls of the recessed first semiconductor layers. FIG. 6 illustrates a perspective view of some embodiments corresponding to act in block S20. At block S22, epitaxial structures are formed to be electrically connected to the second semiconductor layers. FIG. 7 illustrates a perspective view of some embodiments corresponding to act in block S22. At block S24, the dummy gate structure is replaced with a metal gate structure. FIGS. 8A-8C illustrate a perspective view and cross-sectional views of some embodiments corresponding to act in block S24. At block S26, contacts are formed above the epitaxial structures. FIGS. 9A-9C illustrate a perspective view and cross-sectional views of some embodiments corresponding to act in block S26. At block S28, an MLI is formed above the metal gate structure and the contacts. FIG. 10 illustrates a perspective view of some embodiments corresponding to act in block S28. At block S30, the substrate is thinning or removed to expose the metal gate structure. FIG. 11 illustrates a perspective view of some embodiments corresponding to act in block S30. At block S32, the metal gate structure is etched back from a backside thereof. FIGS. 13A-13C illustrate a perspective view and cross-sectional views of some embodiments corresponding to act in block S32. At block S34, a dielectric cap is formed on the etched metal gate structure. FIGS. 14A-14C illustrate a perspective view and cross-sectional views of some embodiments corresponding to act in block S34. At block S36, an isolation layer is formed to cover the dielectric cap. FIGS. 15A-15C illustrate a perspective view and cross-sectional views of some embodiments corresponding to act in block S36. At block S38, a backside via is formed in the isolation layer and connected to one of the epitaxial structures. FIGS. 16A-17C illustrate a perspective view and cross-sectional views of some embodiments corresponding to act in block S38.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the backside dielectric cap formed under the gate structure to protect the gate structure during backside source/drain etching. Another advantage is that the backside dielectric caps also provide good isolation between the backside via and the gate structure. With such configuration, the overlay window for the backside via can be enlarged.

According to some embodiments, a semiconductor device includes a semiconductor layer, a gate structure, a source/drain epitaxial structure, a backside dielectric cap, and an inner spacer. The gate structure wraps around the semiconductor layer. The source/drain epitaxial structure is adjacent the gate structure and electrically connected to the semiconductor layer. The backside dielectric cap is under and in direct contact with the gate structure. The inner spacer is in direct contact with the gate structure and the backside dielectric cap.

According to some embodiments, a semiconductor device includes a channel, a gate structure, inner spacers, and a source/drain epitaxial structure. The gate structure surrounds the channel, wherein the gate structure has a concave bottom surface. The inner spacers are on opposite sides of the gate structure. Bottom surfaces of the inner spacers are lower than the concave bottom surface of the gate structure. The source/drain epitaxial structure is electrically connected to the channel.

According to some embodiments, a semiconductor device includes fin structure disposed over a substrate and comprising a stack of semiconductor layers one over another, a metal gate structure disposed over the fin structure and extending downwardly to separate the stack of semiconductor layers, and a source/drain epitaxial structure disposed on a side of the metal gate structure. The semiconductor device further includes a backside dielectric cap disposed in a gate trench contacting the metal gate structure from a back-side and a backside via disposed under the source/drain epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor layer;
   a gate structure wrapping around the semiconductor layer;
   a source/drain epitaxial structure adjacent the gate structure and electrically connected to the semiconductor layer;
   a backside dielectric cap disposed under and in direct contact with the gate structure; and
   an inner spacer in direct contact with the gate structure and the backside dielectric cap; and
   a gate spacer in direct contact with the gate structure, the inner spacer, and the backside dielectric cap.

2. The semiconductor device of claim 1, further comprising a front-side dielectric cap above and in contact with the gate structure.

3. The semiconductor device of claim 1, wherein the backside dielectric cap does not exceed a top surface of the inner spacer.

4. The semiconductor device of claim 1, wherein the gate structure comprises:
   a gate electrode; and a gate dielectric layer between the gate electrode and the semiconductor layer, wherein the backside dielectric cap is in direct contact with the gate electrode and the gate dielectric layer.

5. The semiconductor device of claim 1, further comprising a backside via under and electrically connected to the source/drain epitaxial structure.

6. The semiconductor device of claim 5, wherein the backside via is in direct contact with the backside dielectric cap.

7. The semiconductor device of claim 5, wherein a top surface of the backside via is higher than a top surface of the backside dielectric cap.

8. The semiconductor device of claim 1, further comprising an isolation layer under the gate structure and the backside dielectric cap.

9. The semiconductor device of claim 8, wherein the isolation layer is in direct contact with the backside dielectric cap.

10. The semiconductor device of claim 8, wherein the isolation layer is spaced apart from the gate structure.

11. A semiconductor device, comprising:
a channel;
a gate structure surrounding the channel, wherein the gate structure has a concave bottom surface;
inner spacers on opposite sides of the gate structure, wherein bottom surfaces of the inner spacers are lower than the concave bottom surface of the gate structure; and
a source/drain epitaxial structure electrically connected to the channel.

12. The semiconductor device of claim 11, further comprising a backside via under the source/drain epitaxial structure and in direct contact with one of the inner spacers and spaced apart from the gate structure.

13. The semiconductor device of claim 12, wherein a top surface of the backside via is higher than the concave bottom surface of the gate structure.

14. The semiconductor device of claim 11, wherein topmost surfaces of the inner spacers are lower than a topmost surface of the gate structure.

15. A semiconductor device, comprising:
a fin structure disposed over a substrate and comprising a stack of semiconductor layers one over another;
a metal gate structure disposed over the fin structure and extending downwardly to separate the stack of semiconductor layers;
a source/drain epitaxial structure on a side of the metal gate structure;
a backside dielectric cap disposed in a gate trench contacting the metal gate structure from a back-side;
a backside via disposed under the source/drain epitaxial structure;
an isolation layer covering the backside dielectric cap; and
wherein the backside via is disposed within the isolation layer and contacts the source/drain epitaxial structure.

16. The semiconductor device of claim 15, wherein a top convex surface of the backside via is above a recessed surface of the metal gate structure.

17. The semiconductor device of claim 15, further comprising a front-side dielectric cap disposed above a recessed surface of the metal gate structure.

18. The semiconductor device of claim 15, further comprising an interlayer dielectric disposed under a recessed surface of the source/drain epitaxial structure.

19. The semiconductor device of claim 15, wherein the backside dielectric cap comprises $SiO_2$, SiN, SiCN, SiOCN, $Al_2O_3$, AlON, $ZrO_2$, $HfO_2$, or combinations thereof.

20. The semiconductor device of claim 15, further comprising an isolation fin adjacent the fin structure.

* * * * *